(12) United States Patent
Usami et al.

(10) Patent No.: US 8,722,532 B2
(45) Date of Patent: May 13, 2014

(54) SEMICONDUCTOR DEVICE AND A METHOD FOR MANUFACTURING A SEMICONDUCTOR DEVICE

(75) Inventors: Tatsuya Usami, Kanagawa (JP); Hiroshi Kitajima, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/567,546

(22) Filed: Aug. 6, 2012

(65) Prior Publication Data
US 2013/0069238 A1    Mar. 21, 2013

(30) Foreign Application Priority Data

Sep. 15, 2011    (JP) .................................. 2011-201525

(51) Int. Cl.
*H01L 21/4763*    (2006.01)

(52) U.S. Cl.
USPC .... 438/628; 438/622; 438/734; 257/E21.214; 257/E21.232; 257/E21.233

(58) Field of Classification Search
None
See application file for complete search history.

(56) References Cited

U.S. PATENT DOCUMENTS

| | | | | |
|---|---|---|---|---|
| 5,512,514 | A | * | 4/1996 | Lee ................................ 438/626 |
| 6,133,635 | A | * | 10/2000 | Bothra et al. .................. 257/758 |
| 2002/0155693 | A1 | * | 10/2002 | Hong et al. .................... 438/618 |
| 2007/0052101 | A1 | * | 3/2007 | Usami ........................... 257/758 |

FOREIGN PATENT DOCUMENTS

JP    11-121612    4/1999

OTHER PUBLICATIONS

Cabral Jr et al., "Metallization Opportunities and Challenges for Future Back-End-of-the-Line Technology", Proceedings of AMC 2010.

* cited by examiner

*Primary Examiner* — Julio J Maldonado
*Assistant Examiner* — Joseph Galvin, III
(74) *Attorney, Agent, or Firm* — Young & Thompson

(57) ABSTRACT

A first wiring is disposed over a semiconductor substrate. A first via is disposed over the first wiring. Further, the bottom surface of the first via is in contact with the first wiring. A first insulation layer is disposed over the semiconductor substrate, and is in contact with at least the top surface of the first wiring and the side surface of the first via. At least a part of each side surface of the first wiring and the first via cuts off each metal crystal grain.

14 Claims, 46 Drawing Sheets

SEMICONDUCTOR DEVICE AND A METHOD FOR MANUFACTURING A SEMICONDUCTOR DEVICE

CROSS-REFERENCE TO RELATED APPLICATIONS

The disclosure of Japanese Patent Application No. 2011-201525 filed on Sep. 15, 2011 including the specification, drawings and abstract is incorporated herein by reference in its entirety.

BACKGROUND

The present invention relates to a semiconductor device and a method for manufacturing a semiconductor device.

In recent years, various structures of semiconductor devices have been proposed with a trend for miniaturization of wirings in semiconductor devices.

Patent Document 1 (Japanese Unexamined Patent Publication No. 11-121612) describes the following method for manufacturing a semiconductor device. First, a trench is formed in an interlayer insulation film over a semiconductor substrate. Then, a metal is filled in the inside of the trench. Then, a part of the metal is etched in a prescribed amount. As a result, a lower-layer wiring and a columnar coupling part are formed of the same metal as an integral structure at the same time. This can provide a high-reliability wiring structure.

PATENT DOCUMENT

Patent Document 1

Japanese Unexamined Patent Publication No. 11-121612

NON-PATENT DOCUMENT

Non-Patent Document 1

C. Cabral. Jr. et. al., Proceedings of AMC 2010 "Metallization Opportunities and Challenges for Future Back-End-of-the-Lime Technology"

SUMMARY

With the technology described in the Patent Document 1, a trench is formed in an interlayer insulation layer, and then, a metal is embedded in the trench. Accordingly, as the width of the trench decreases, the resistances of the formed wiring and columnar coupling part (via) tend to increase. For this reason, the present inventors considered that the reduction of the resistances of these requires renewal of the structures of wirings and vias.

In accordance with one aspect of the present invention, there is provided a semiconductor device, which includes: a semiconductor substrate, a first wiring disposed over the semiconductor substrate, a first via disposed over the first wiring, and in contact with the first wiring at the bottom surface thereof, and a first insulation layer disposed over the semiconductor substrate, and in contact with at least the top surface of the first wiring, and the side surface of the first via. At least a part of each side surface of the first wiring and the first via cuts off each metal crystal grain.

In accordance with another aspect of the present invention, there is provided a semiconductor device, which includes: a semiconductor substrate, a first wiring disposed over the semiconductor substrate, a first via disposed over the first wiring, and in contact with the first wiring at the bottom surface thereof, and a first insulation layer disposed over the semiconductor substrate, and in contact with at least the top surface of the first wiring, and the side surface of the first via. The content of fluorine in the first wiring and the first via is less than $1\times10^{19}$ atoms/cc.

In accordance with a still other aspect of the present invention, there is provided a method for manufacturing a semiconductor device. The method includes: a metal pattern formation step of forming a metal pattern having a pattern along a first wiring over a semiconductor substrate; a first via pattern formation step of partially etching the metal pattern, and thereby forming the first wiring, and a first via in contact with the first wiring at the bottom surface thereof; and a first insulation layer formation step of forming a first insulation layer in contact with at least the top surface of the first wiring and the side surface of the first via over the semiconductor substrate.

In accordance with the present invention, the first wiring and the first via are formed of a metal with large crystal grains regardless of the widths of the first wiring and the first via. As a result, even when the first wiring and the first via are miniaturized, it is possible to obtain low-resistance first wiring and first via. Therefore, it is possible to provide a semiconductor device having a low-resistance fine-pitch wiring structure.

In accordance with the present invention, it is possible to provide a semiconductor device having a low-resistance fine-pitch wiring structure.

DETAILED DESCRIPTION

Figure 1:
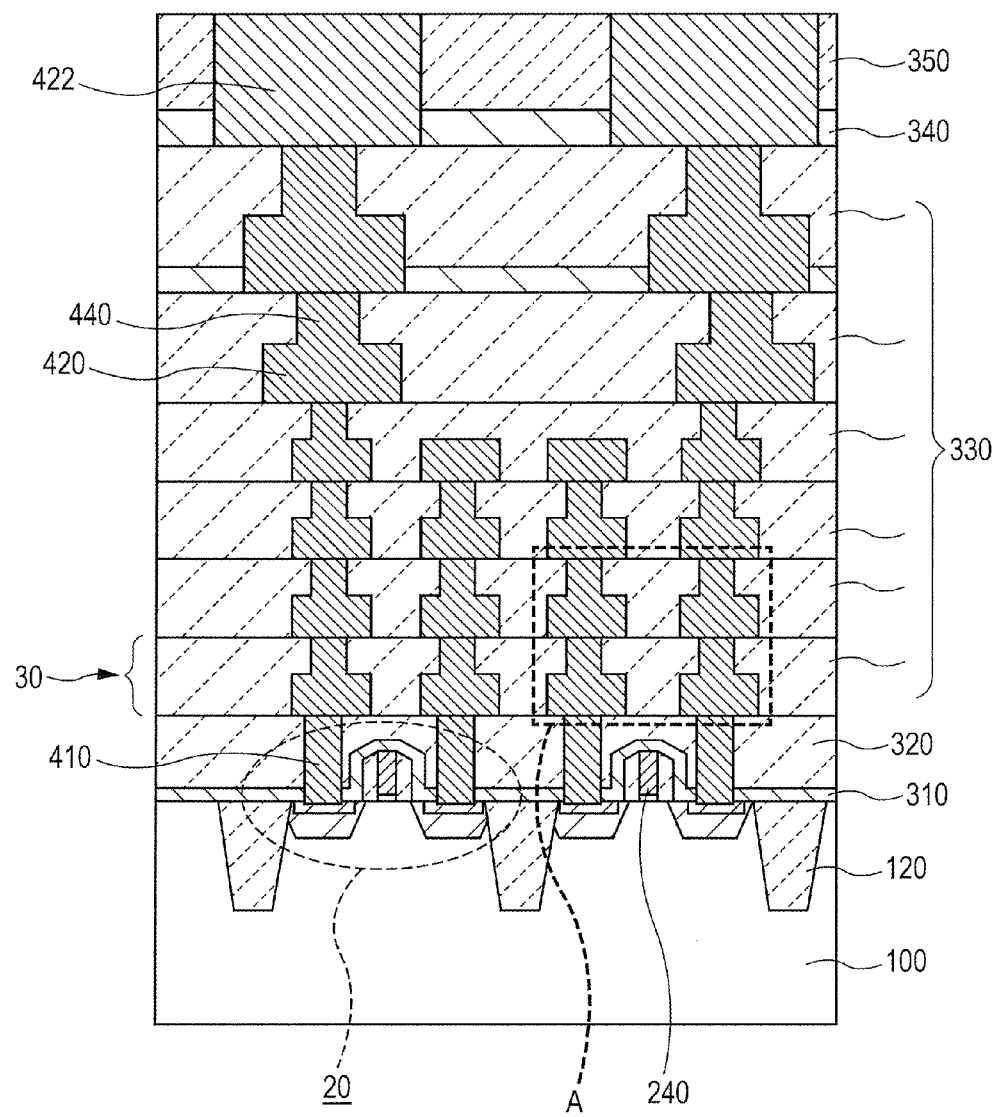
FIG. 1 is a cross-sectional view showing a configuration of a semiconductor device in accordance with a first embodiment.

Below, embodiments of the present invention will be described by reference to the accompanying drawings. Incidentally, in all the drawings, the same constitutional elements are given the same reference numerals and signs, and a description thereof will be appropriately omitted.

First Embodiment

Referring to FIGS. 1 to 3A and 3B, a semiconductor device 10 in accordance with a first embodiment will be described. The semiconductor device 10 has the following configuration. A first wiring 420 is disposed over a semiconductor substrate 100. A first via 440 is disposed over the first wiring 420. Further, the bottom surface of the first via 440 is in contact with the first wiring 420. A first insulation layer 330 is disposed over the semiconductor substrate 100, and is in contact with at least the top surface of the first wiring 420 and the side surface of the first via 440. At least a part of each side surface of the first wiring 420 and the first via 440 cuts off the crystal grains of each metal. Below, the details will be described.

First, the overall structure of the semiconductor device 10 will be described by reference to FIG. 1. FIG. 1 is a cross-sectional view showing a configuration of the semiconductor device 10 in accordance with the first embodiment.

In the semiconductor substrate 100, there is disposed an element isolation region 120 having a plurality of openings. In each opening of the element isolation region 120, there is disposed a semiconductor element 20. The semiconductor element 20 will be described in details later.

Over the semiconductor substrate 100 including the semiconductor element 20 disposed therein, there is disposed a lower-layer insulation layer 320. In the lower-layer insulation layer 320, a contact plug 410 is disposed, and coupled with a gate electrode 240 or the like of the semiconductor element 20.

Over the lower-layer insulation layer 320, there are disposed a plurality of first wirings 420. Each first wiring 420 is coupled via the contact plug 410 to the gate electrode 240 or the like. Further, over each first wiring 420, there is disposed a first via 440. The bottom surface of the first via 440 is in contact with the top surface of the first wiring 420.

Over the lower-layer insulation layer 320, there is disposed a first insulation layer 330. The first insulation layer 330 is in contact with at least the top surface of the first wiring 420 and the side surface of the first via 440. Herein, the first insulation layer 330 is formed of a Low-k film having a low dielectric constant. The dielectric constant of the first insulation layer 330 is, for example, 3.2 or less. This can reduce the capacitance of the semiconductor device 10. Specifically, the first insulation layer 330 is a film of, for example, $SiO_2$, SiN, SiON, SiOC, SiOCH, SiCOH, or SiOF. Further, the first insulation layer 330 may be, for example, a HSQ (Hydrogen Silsequioxane) film, a MSQ (Methyl Silsequioxane) film, or a film of other organic polymers. Alternatively, the first insulation layer 330 may be a porous film thereof.

The first wirings 420, the first vias 440 and the first insulation layer 330 form one first wiring layer 30. Further, at least two or more first wiring layers 30 are stacked. The first via 440 of the first wiring layer 30 situated on the lower side is coupled with the first wiring 420 of the first wiring layer 30 situated on the upper side. In this manner, a multilayer wiring structure is formed.

Further, the semiconductor device 10 has at least one or more logic circuits. The logic circuit is formed of a plurality of the semiconductor elements 20 and the like. A plurality of the first wiring layers 30 are local wiring layers forming the logic circuit.

Between the two first wiring layers 30, there may be disposed an etching stopper layer 340 (second etching stopper layer) made of an insulation film having a higher density than that of the first insulation layer 330. The etching stopper layer 340 is formed of a material having a slower etching rate under the conditions for etching the first insulation layer 330. This can suppress the deterioration of the first insulation layer 330 situated at a lower layer by etching in a metal pattern formation step or a first via pattern formation step described later. Herein, the etching stopper layer 340 is disposed between the first wiring layers 30 situated at the upper layers. This can suppress the deterioration of the inside of the semiconductor device 10 by moisture permeation from the outside of the semiconductor device 10. Specifically, the etching stopper layer 340 is, for example, a layer of SiCN, SiC, SiON, SiCO, SiCON or SiN.

At the uppermost layer of the multilayer wiring structure, there is disposed a global wiring layer for coupling a plurality of local wiring layers. In the global wiring layer, there is disposed an upper-layer wiring 422 thicker than the first wiring 420 of the local wiring layers. Further, in the global wiring layer, there is disposed an upper-layer insulation layer 350 formed of a different material from that of the first insulation layer 330 via the etching stopper layer 340. Specifically, the upper-layer insulation layer 350 is, for example, a layer of SiOF or $SiO_2$. Incidentally, over the global wiring layer of the uppermost layer, there may be disposed a bump electrode (not shown).

Figure 2:
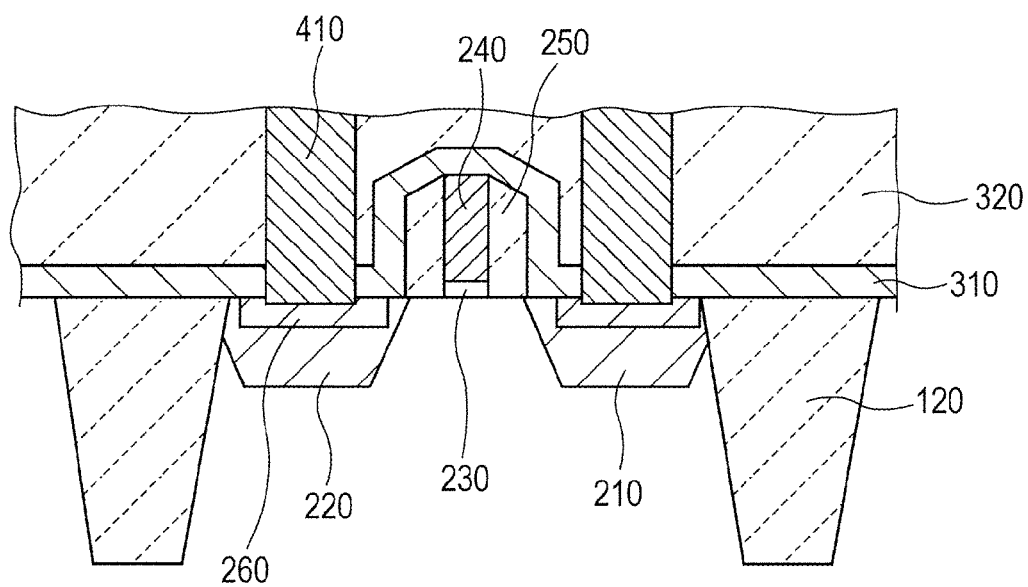
FIG. 2 is a cross-sectional view showing a configuration of a semiconductor element in accordance with the first embodiment.

Then, the configuration of the semiconductor element 20 will be described by reference to FIG. 2. FIG. 2 is a cross-sectional view showing the configuration of the semiconductor element 20 in accordance with the first embodiment. The semiconductor element 20 is, for example, a FET (Field Effect Transistor) forming a logic circuit.

In the semiconductor substrate 100, there are disposed the element isolation regions 120. Between the element isolation regions 120, there are formed impurity-implanted source region 210 and drain region 220. Over a channel region (reference sign not shown) sandwiched between the source region 210 and the drain region 220, there is disposed a gate insulation layer 230. Over the gate insulation layer 230, there is disposed the gate electrode 240. At the sidewalls of the gate insulation layer 230 and the gate electrode 240, there is disposed a sidewall insulation film 250. Over the source region 210, the drain region 220, the gate electrode 240, and the sidewall insulation film 250, there is disposed a liner insulation layer 310. The contact plug 410 is coupled with the source region 210 or the drain region 220 at an opening disposed in the liner insulation layer 310. At a portion at which the contact plug 410 is in contact with the source region 210 or the drain region 220, there may be disposed a silicide layer 260. Alternatively, at the bottom part and the side surface of the contact plug 410, there may be disposed a barrier metal layer (not shown).

Over the liner insulation layer 310, there is disposed the lower-layer insulation layer 320. As described above, over the lower-layer insulation layer 320, there are disposed a plurality of the first wirings 420. The first wiring 420 is coupled with the source region 210 or the drain region 220 of the semiconductor element 20 via the contact plug 410.

Figure 3A:
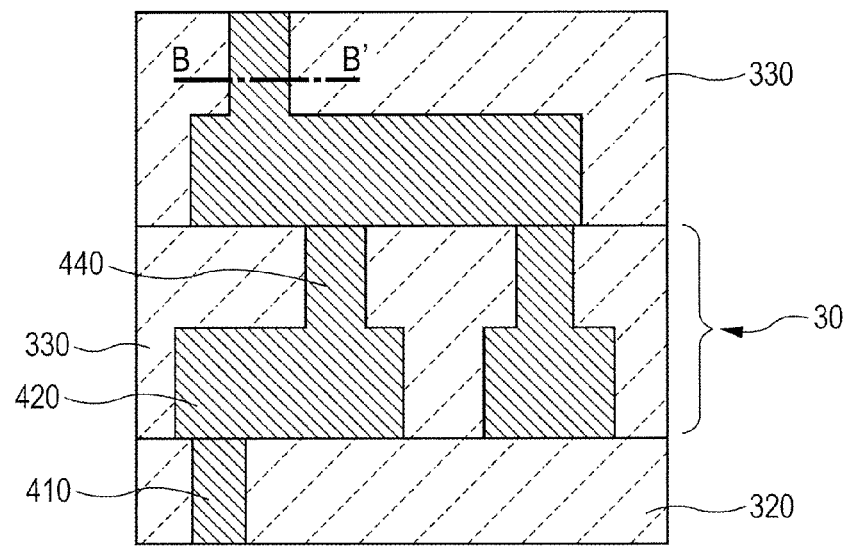
FIG. 3A is an enlarged view of a portion corresponding to the A part of FIG. 1.

Then, the first wiring layer 30 in the semiconductor device 10 will be described by reference to FIGS. 3A and 3B. FIG. 3A is an enlarged view of a portion corresponding to the A part of FIG. 1. In FIG. 3A, as distinct from the configuration shown in FIG. 1, the upper-layer first wiring 420 is coupled with two first vias 440.

As in FIG. 3A, in the first wiring layer 30, there are disposed the first wirings 420 and the first vias 440. Each first via 440 is disposed over the first wiring 420. The bottom surface of the first via 440 is in contact with the top surface of the first wiring 420. The first via 440 situated on the lower side is coupled to the first wiring 420 situated on the upper side.

The term "the bottom surface of the first via 440" herein used denotes one end of the first via 440 in contact with the first wiring 420. In other words, the term "the bottom surface of the first via 440" denotes the cut end face of the first via 440 on the first wiring 420 side when cutting is performed along a plane including the top surface of the first wiring 420 not in contact with the first via 440. In the present embodiment, a definite boundary is not required to be formed at the "bottom surface of the first via 440".

In the first embodiment, in the same first wiring layer 30, the first wiring 420 and the first via 440 disposed over the first wiring 420 are integrally formed of the same metal. In other words, the first wiring 420 and the first via 440 do not have an interface formed therebetween by etching or the like. For this reason, crystal grains 402 at a portion at which the first wiring 420 and the first via 440 are in contact with each other are continuous. Further, at this portion, large crystal grains are formed. This can reduce the contact resistance between the first wiring 420 and the first via 440.

Incidentally, the cross section at a portion of the first via 440 in contact with the first wiring 420 may expand in diameter toward the first wiring 420 side. However, the cross section does not expand in diameter at a portion at which the side surface of the first wiring 420 forms the same surface as the side surface of the first via 440 (referred to as a first side surface 401).

Further, the angle formed between the top surface of the first wiring 420 not in contact with the first via 440 and the side surface first via 440 is 80 degrees or more and 100 degrees or less. More preferably the angle is 90 degrees or more and 95 degrees or less. This can reduce the resistance of the portion of the first via 440 in contact with the first wiring 420.

Further, in the same first wiring layer 30, the first insulation layers 330 in contact with at least the top surface of the first wiring 420 and the side surface of the first via 440 are integrally formed of the same material. Namely, at the boundary portion between each first wiring 420 and each first via 440 of the first insulation layers 330, an interface is not formed in cross-sectional view. Incidentally, an interface may be formed between the vertically adjacent first wiring layers 30.

Figure 3B:
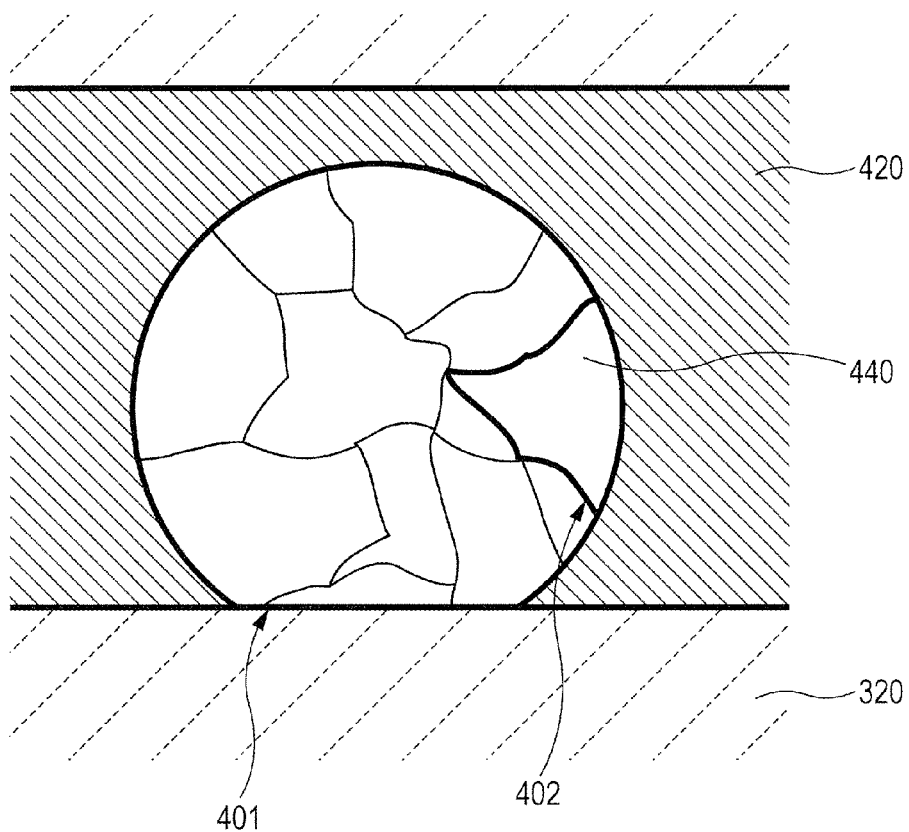
FIG. 3B is a view of the cross section along line B-B' of FIG. 3A as seen from the top side.

Herein, FIG. 3B is a view of the cross section along line B-B' of FIG. 3A as seen from the top side thereof. Incidentally, the first insulation layer 330 over the first wiring 420 is omitted. The circled portion at the center of FIG. 3B shows the cross section of the first via 440. Whereas, the solid lines inside the cross section of the first via 440 indicate the grain boundaries of crystal grains 402. A thick slid line of these indicates one crystal grain 402.

As in FIG. 3B, at least one side surface of the first wiring 420 forms the same surface (referred to as a first side surface 401) as the side surface of the first via 440. The manufacturing method will be described in details later. Further, at least apart of each side surface of the first wiring 420 and the first via 440 cuts off the crystal grains 402 of each metal. The term "each metal" herein used denotes the metal included in (or forming) each of the first wiring 420 and the first via 440. Preferably, the entire circumference of each side surface of the first wiring 420 and the first via 440 cuts off the crystal grains 402 of the metal. The wording "cuts off the crystal grains 402 of the metal" herein used denotes the following: first, large crystal grains 402 are formed by sputtering or the like, and then are processed by etching or the like; as a result, the crystal grains 402 are cut off. The wording "at least apart cuts off the crystal grains 402 of the metal" means that there may be the following case: the etched cross section overlaps with the crystal grain boundaries, so that the crystal grains 402 not cut off are in contact with the side surface. In other words, at each side surface of the first wiring 420 and the first via 440, there are formed the cut surfaces of at least one or more metal crystal grains 402. Preferably, at all the side surfaces of the first wiring 420 and the first via 440, there are formed the cut surfaces of at least one or more metal crystal grains 402. With such a structure, the first wiring 420 and the first via 440 can be formed of a metal having large crystal grains 402 regardless of the widths of the first wiring 420 and the first via 440. Namely, even when the first wiring 420 and the first via 440 are miniaturized, it is possible to obtain the first wiring 420 and the first via 440 having a low resistance.

Herein, Non-Patent Document (C. Cabral. Jr. et. al., Proceedings of AMC 2010 "Metallization Opportunities and Challenges for Future Back-End-of-the-Lime Technology") describes the following: as the width of a Cu wiring by a damascene method is reduced, the effects of electron surface scattering and grain scattering other than the bulk resistance tend to cause a rapid increase in resistance of fine-pitch wiring.

FIG. 1 of the Non-Patent Document describes the following: when the width of Cu wiring is smaller than the mean free path of electrons in Cu, the resistivity of the wiring is also higher. Further, the resistivity in Cu wiring having a smaller width than the mean free path of electrons in Cu is regarded as being higher than the bulk resistivity of W, Mo Ru, or the like.

Therefore, with the structure as in FIG. 3B, it is possible to provide a semiconductor device including large crystal grains 402, and having a resistivity close to the bulk resistivity.

Further, each width of the first wiring 420 and the first via 440 is, for example, smaller than the mean free path of electrons in Cu. Specifically, each width of the first wiring 420 and the first via 440 is, for example, 39 nm or less. By applying the structure of the first embodiment in such a fine-pitch wiring or via, it is possible to obtain a fine-pitch wiring structure with a lower resistance than that of a Cu wiring by a damascene method.

Further, the mean free path of electrons in the metal used for the first wiring 420 and the first via 440 is smaller than that of Cu. As a result, the resulting fine-pitch wiring structure can have a smaller resistance than that of Cu. In other words, the resistance of the metal formed of large crystal grains as the first wiring 420 and the first via 440 is lower than the resistance when the first wiring 420 and the first via 440 are provisionally filled with Cu by a plating method.

Specifically, the metal includes, for example, any of W, Mo, or Ru. For the materials thereof, the mean free path of electrons in the metal is smaller than that of Cu. Further, the bulk resistance of the metal is slightly higher than that of bulk Cu, but is lower than that of Cu formed in a fine width by a plating method. Therefore, the metal satisfies the foregoing characteristics, and thereby can have a lower wiring resistance than that of Cu as a fine-pitch wiring structure.

Further, as described later, the first wiring 420 and the first via 440 are formed by, for example, sputtering. In other words, the first wiring 420 and the first via 440 are not formed using a raw material containing fluorine by CVD (Chemical Vapor Deposition). For this reason, the content of fluorine in the first wiring 420 and the first via 440 can be set at less than $1 \times 10^{19}$ atoms/cc. As a result, the first wiring 420 and the first via 440 can be formed of a metal with large crystal grains. Further, in the first wiring 420 and the first via 440, the content of impurities can be reduced, which can achieve a lower resistance.

Whereas, at the side surfaces of the first wiring 420 and the first via 440, a barrier metal layer is not formed. Herein, when the first wiring 420 and the first via 440 are formed of Cu, there may occur migration that Cu is diffused into the first insulation layer 330. On the other hand, with the structure of the first embodiment, as the material for the first wiring 420 and the first via 440, there can be used other materials than Cu. This eliminates the necessity of disposing a high-resistance barrier metal layer at the side surface. Further, when a material such as W is embedded in a via hole by CVD, the fluorine included in the material may damage the first insulation layer 330. On the other hand, with the structure of the first embodiment, previously, the first wiring 420 and the first via 440 are formed by sputtering. As with the foregoing, this eliminates the necessity of forming a barrier metal layer at the side surfaces of the first wiring 420 and the first via 440. Therefore, within the limited widths of the first wiring 420 and the first via 440, a region of a low-resistance metal can be widely formed in plan view.

Then, referring to FIGS. 4A and 4B to 8A and 8B, a method for manufacturing the semiconductor device 10 in accordance with the first embodiment will be described. FIGS. 4A and 4B to 8A and 8B are each a cross-sectional view for illustrating a method for manufacturing the semiconductor device 10 in accordance with the first embodiment. Incidentally, FIGS. 4A and 4B to 8A and 8B each show only a portion corresponding to the A part in FIG. 1. The method for manufacturing the semiconductor device 10 in accordance with the first embodiment shown in FIG. 1 includes the following steps. First, over the semiconductor substrate 100, there is formed a metal pattern having a pattern along the first wiring 420 (metal pattern formation step). Then, the metal pattern is partially etched, thereby to form the first wiring 420 and the first via 440 (first via pattern formation step). Then, over the semiconductor substrate 100, there is formed the first insulation layer 330 in contact with at least the top surface of the first wiring 420 and the side surface of the first via 440. Below, the details will be described.

First, as described in FIG. 2, in the semiconductor substrate 100, there is formed the element isolation region 120 having openings. Then, impurities are introduced into portions not including the element isolation region 120 formed therein by ion implantation, thereby to form the source region 210 and the drain region 220. Then, the gate insulation layer 230 and the gate electrode 240 are sequentially stacked. Then, the gate insulation layer 230 and the gate electrode 240 are patterned over a channel region sandwiched between the source region 210 and the drain region 220. Then, at the sidewalls of the gate insulation layer 230 and the gate electrode 240, there is formed a sidewall insulation film 250. Then, over the source region 210 and the drain region 220, there is formed a metal such as Co by sputtering. Then, by performing annealing at high temperatures, a silicide layer 260 is formed over the source region 210 and the drain region 220. Then, over the source region 210, the drain region 220, the gate electrode 240, and the sidewall insulation film 250, there is formed the liner insulation layer 310. Then, over the liner insulation layer 310, the lower-layer insulation layer 320 is formed by CVD. Then, portions of the lower-layer insulation layer 320 and the liner insulation layer 310 over the gate electrode 240, the source region 210, and the drain region 220 are etched, thereby to form contact holes (not shown). Then, over the contact holes and the lower-layer insulation layer 320, a barrier metal layer (not shown) is formed. Then, by CVD, W is embedded in the contact holes. Then, by CMP (Chemical Mechanical Polishing), the top surface of the lower-layer insulation layer 320 is planarized. As a result, in the lower-layer insulation layer 320, there is formed the contact plug 410. By the steps up to this point, the semiconductor element 20 is formed.

Figure 4A:
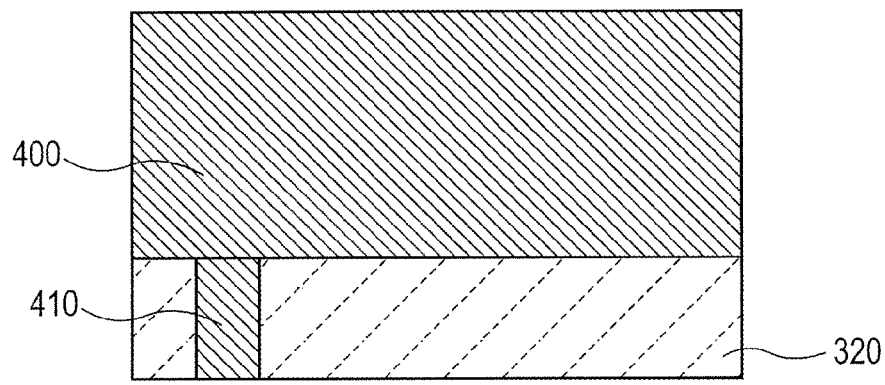
FIGS. 4A and 4B are each a cross-sectional view for illustrating a method for manufacturing the semiconductor device in accordance with the first embodiment.

As in FIG. 4A, over the planarized lower-layer insulation layer 320, a metal layer 400 is formed by sputtering. As a result, it is possible to form the metal layer 400 having large crystal grains. Further, the metal layer 400 can be formed at a low cost. Herein, for example, the metal layer 400 formed of W (tungsten) is deposited by sputtering.

Figure 4B:
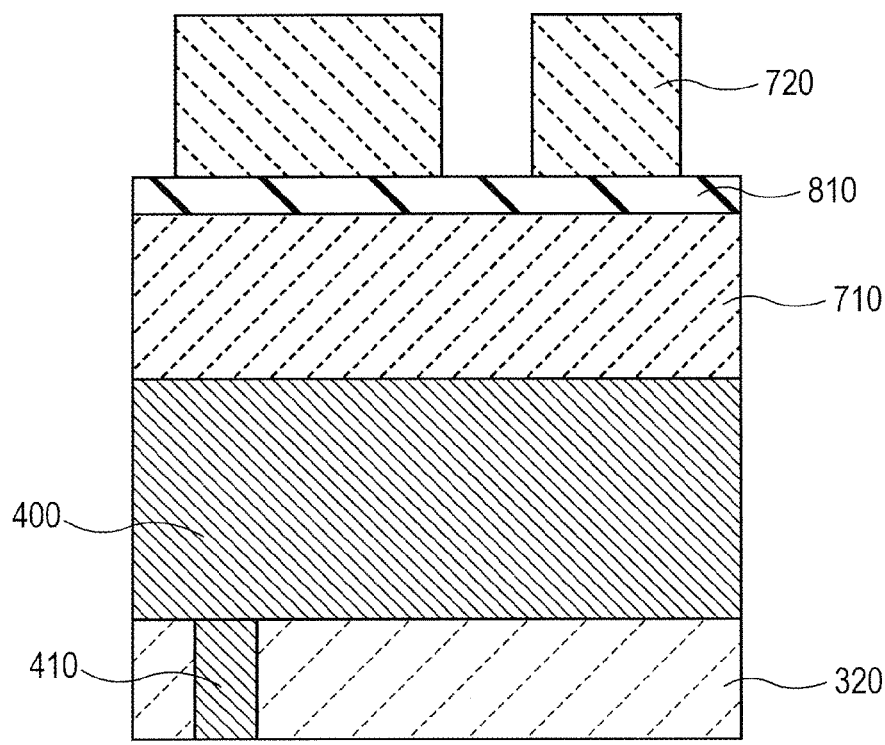

Then, as in FIG. 4B, over the metal layer 400, there are sequentially deposited a first photoresist layer 710, an antireflection layer 810, and a second photoresist layer 720. Insertion of the antireflection layer 810 can enhance the resolution of patterning. Specifically, the antireflection layer 810 is, for example, an amorphous Si, Si-rich SiON or SiOC, or Si-containing coating type antireflection layer, or an organic system coating type antireflection layer.

Then, by exposure or development, the second photoresist layer 720 is patterned into the shape of the first wiring 420 in plan view. A multilayer mask is formed in this manner.

Figure 5A:
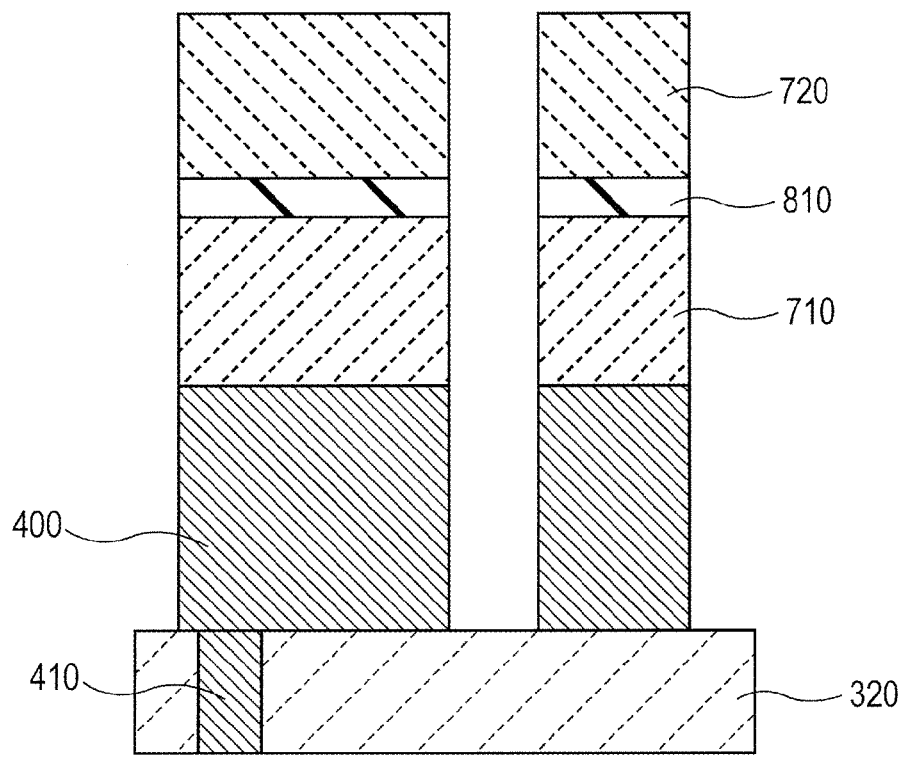
FIGS. 5A and 5B are each a cross-sectional view for illustrating a method for manufacturing the semiconductor device in accordance with the first embodiment.

Then, as in FIG. 5A, by RIE (Reactive Ion Etching), with the second photoresist layer 720 as a mask, the metal layer 400 is patterned together with the antireflection layer 810 and the first photoresist layer 710. As a result, there is formed a metal pattern having a pattern along the first wiring 420 (up to this point, metal pattern formation step).

Figure 5B:
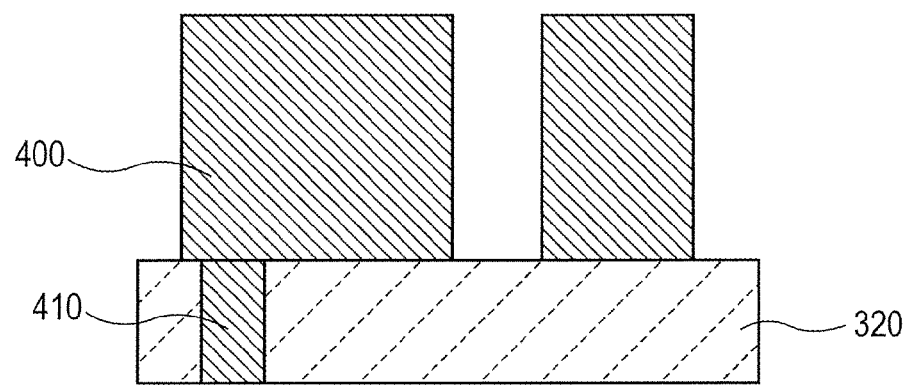

Then as in FIG. 5B, the first photoresist layer 710, the antireflection layer 810, and the second photoresist layer 720 are removed by plasma ashing or the like.

Figure 6A:
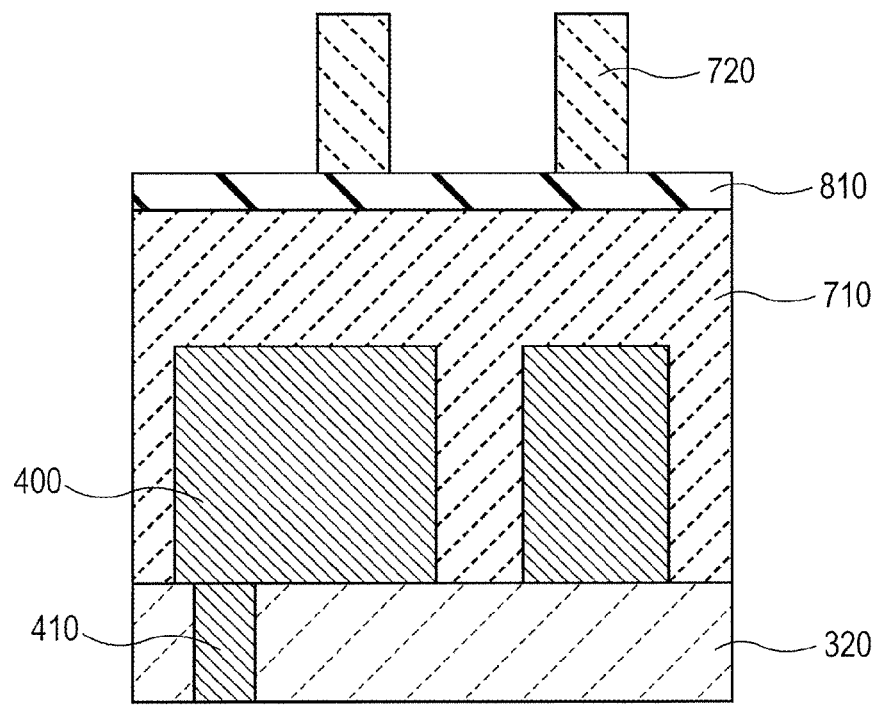
FIGS. 6A and 6B are each a cross-sectional view for illustrating a method for manufacturing the semiconductor device in accordance with the first embodiment.

Then, as in FIG. 6A, over the metal layer 400 having the shape of the first wiring 420 in plan view (metal pattern), there are formed the first photoresist layer 710, the antireflection layer 810, and the second photoresist layer 720. Then, by exposure and development, the second photoresist layer 720 is patterned into the shape of the first via 440 in plan view.

Figure 6B:
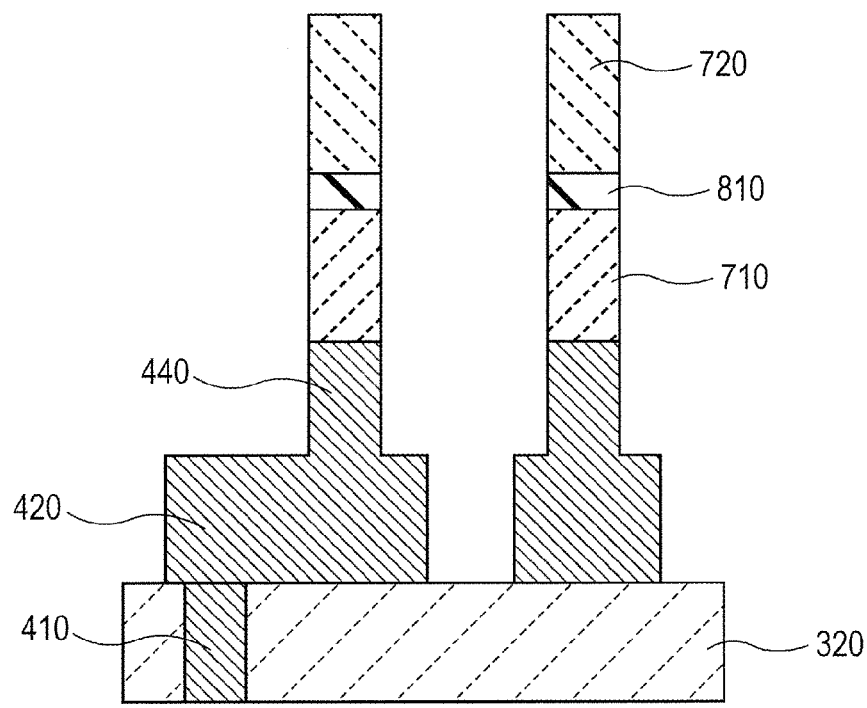

Then, as in FIG. 6B, by RIE, with the second photoresist layer 720 as a mask, the metal pattern is partially etched together with the antireflection layer 810 and the first photoresist layer 710. This results in the formation of the first wiring 420, and the first via 440 in contact with the first wiring 420 at one end thereof (up to this point, first via pattern formation step).

Figure 7A:
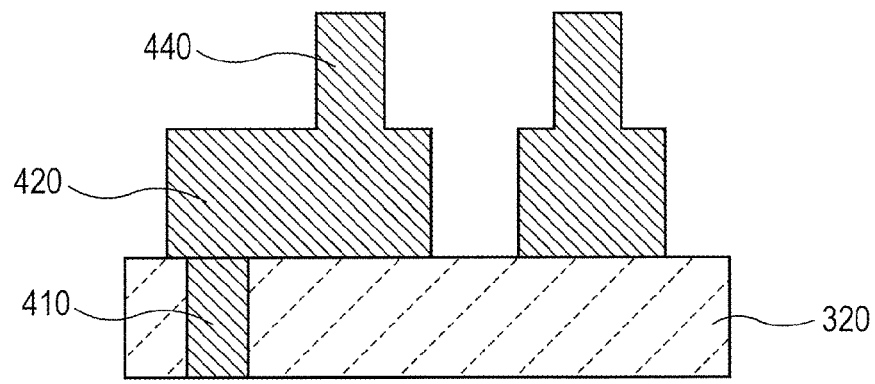
FIGS. 7A and 7B are each a cross-sectional view for illustrating a method for manufacturing the semiconductor device in accordance with the first embodiment.

Then, as in FIG. 7A, the first photoresist layer 710, the antireflection layer 810, and the second photoresist layer 720 are removed by plasma ashing or the like.

The metal layer 400 is formed entirely over the semiconductor substrate 100 in this manner, and then, is patterned into the shapes of the first wiring 420 and the first via 440. As a result, it is possible to refine the shape while keeping the crystal grains of the metal layer 400 large.

Figure 7B:
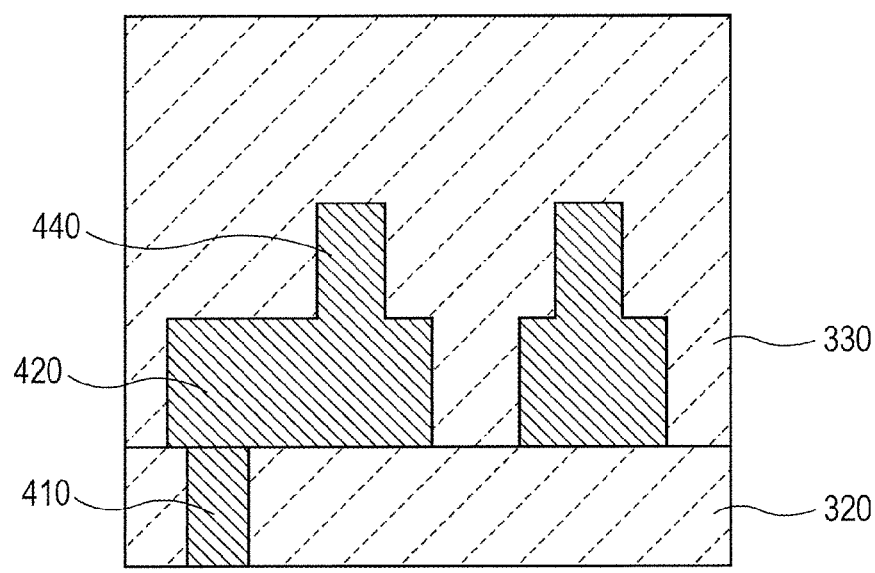

Then, as in FIG. 7B, the first insulation layer 330 is formed in such a manner as to cover the patterned first wiring 420 and first via 440 (first insulation layer formation step). Herein, for example, the first insulation layer 330 is formed by a coating method. Specifically, for example, as the first insulation layer 330, a porous silica (k=2.3) is formed by coating and burning. By forming the first insulation layer 330 with a coating method in this manner, covering can be achieved according to the various shapes of the first wirings 420 and the like. Further, the method does not include an etching step of forming via holes and the like in the first insulation layer 330. This can suppress the deterioration of the first insulation layer 330 used with the coating method. Further, various coating materials can be selected regardless of the etching resistance. Incidentally, the first insulation layer 330 may be formed by CVD.

Further, the first insulation layer 330 is formed in such a manner as to be in contact with at least the top surface of the first wiring 420 and the side surface of the first via 440. The wording "in such a manner as to be in contact with at least the top surface of the first wiring 420 and the like" herein used means that an air gap (void) may be formed between the adjacent two first wirings 420. This embodiment will be described in a sixth embodiment.

Figure 8A:
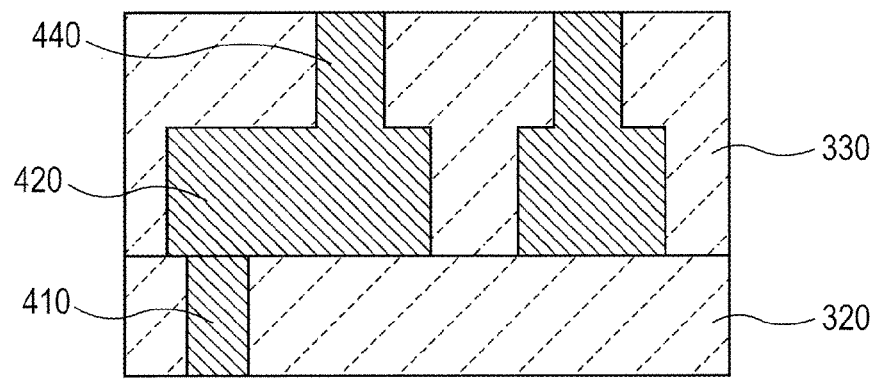
FIGS. 8A and 8B are each a cross-sectional view for illustrating a method for manufacturing the semiconductor device in accordance with the first embodiment.

Then, as in FIG. 8A, the top surface of the first insulation layer 330 is planarized by CMP. As a result, the top surface of the first via 440 is exposed from the first insulation layer 330. Alternatively, CMP is carried out partway, and etching back is performed by dry etching.

As described up to this point, the metal pattern formation step, the first via pattern formation step, and the first insulation layer formation step are sequentially performed. This results in the formation of one first wiring layer 30 including the first wirings 420, the first vias 440, and the first insulation layer 330.

Figure 8B:
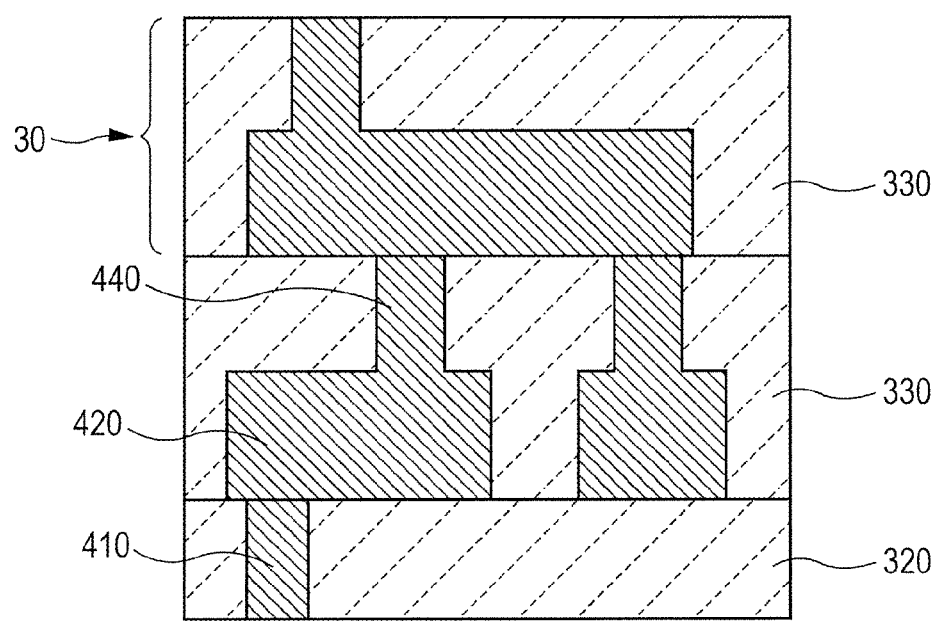

Then, as in FIG. 8B, over the planarized first insulation layer 330, the first wiring layer 30 is formed in the same manner. In this manner, at least two or more first wiring layers 30 are stacked. At this step, the formation is achieved so that the first via 440 of the first wiring layer 30 situated on the lower side is coupled to the first wiring 420 of the first wiring layer 30 situated on the upper side. This can result in the formation of a multilayer wiring structure.

Incidentally, as shown in FIG. 1, over the first wiring layer 30 situated on the lower side, the upper-layer first wiring layer 30 may be formed via an etching stopper layer 340 (second etching stopper layer) formed of an insulation material higher in density than the first insulation layer 330. This can suppress the deterioration of the first insulation layer 330 situated at the lower layer by etching in the metal pattern formation step or the first via pattern formation step for forming the first wiring layer 30 situated at the upper layer.

Then, in a region not shown, at the uppermost layer of the multilayer wiring structure, there is formed a global wiring layer for coupling a plurality of local wiring layers. Further, over the uppermost-layer global wiring layer, there may be formed bump electrodes (not shown). The semiconductor device 10 in accordance with the first embodiment is formed in the manner described up to this point.

Figure 9A:
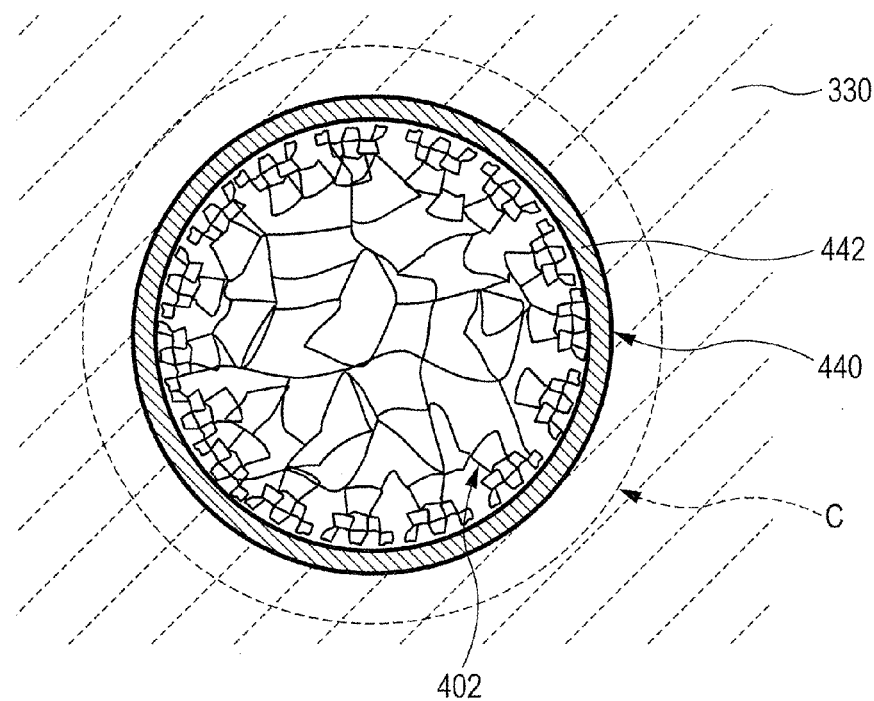
FIGS. 9A and 9B are each a view for illustrating the effect of the first embodiment.
Figure 9B:
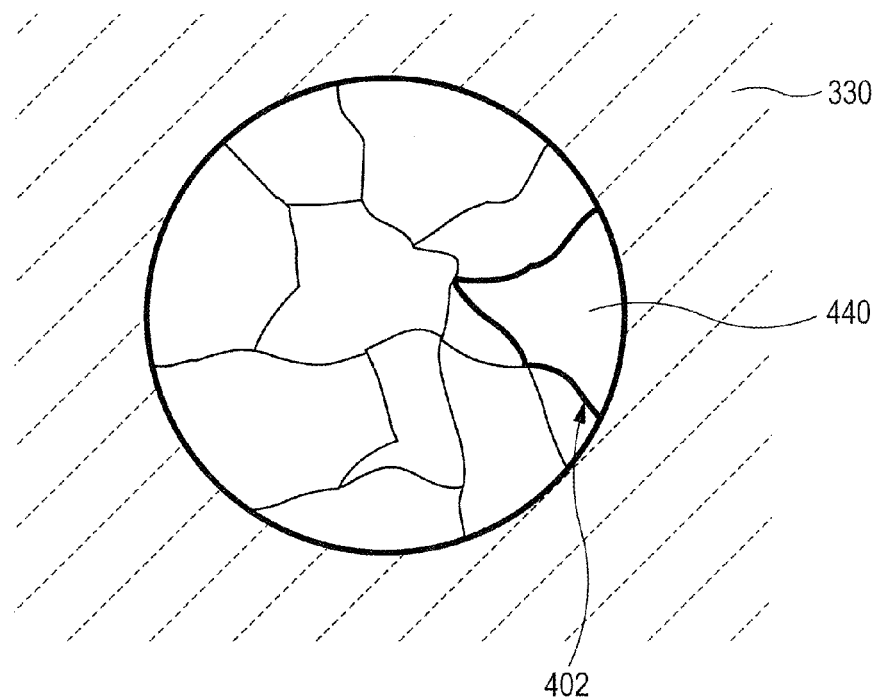

Then, referring to FIGS. 9A and 9B, the effects of the first embodiment will be described by comparison with comparative examples. FIGS. 9A to 9B are each a view for illustrating the effects of the first embodiment. FIGS. 9A and 9B each show a portion corresponding to the cross section along line B-B' of FIG. 3A. Incidentally, the first insulation layer 330 is not omitted, and further, the top surface of the first via 440 is shown.

FIG. 9A shows the case where the first via 440 is formed by a single damascene method, for example, in the following manner as a comparative example. First, over the first wiring layer 30 including only the first wiring 420 formed therein, the first insulation layer 330 is formed. Then, a via hole (not shown) for forming the first via 440 is formed in the first insulation layer 330 by RIE. Then, a barrier metal layer 442 of TiN or the like is deposited in the via hole and over the first insulation layer 330 by sputtering. Then, for example, by CVD, W is deposited using $WF_6$ as a raw material. As a result, W is embedded in the via hole. Then, the top of the first insulation layer 330 is planarized by CMP. As a result, the top surface of the first via 440 is exposed from the first insulation layer 330. The first via 440 of the comparative example is formed in the manner described up to this point.

In this comparative example, the first via 440 is formed by embedding a metal in the via hole by CVD. With CVD, as the initial stage, small crystal grains 402 are formed from the sidewall side of the via hole. Then, as crystal grains are deposited at the center of the via hole, the crystal grains are gradually formed with a larger size. For this reason, the size of the crystal grains 402 of the first via 440 in the comparative example depends upon the width of the via hole. When the width of the first via 440 is small, very small crystal grains are formed in the via hole. Therefore, in this case, the resistance of the first via 440 may be high.

Further, in the comparative example, the first via 440 is formed by embedding a metal in the via hole via the barrier metal layer. Whereas, the material for the barrier metal layer such as TiN is higher in resistance than W. When the width of the first via 440 is small, the proportion of the barrier metal layer occupying the inside of the via hole becomes large. On the other hand, the proportion of W occupying the inside of the via hole becomes small. Even for such a reason, the resistance of the first via 440 may become high. Incidentally, when W is embedded in the via hole by CVD without forming a barrier metal layer, fluorine of $WF_6$ which is the W raw material may damage the sidewall of the first insulation layer 330.

Whereas, in the comparative example, a via hole for forming the first via 440 is formed in the first insulation layer 330. In the etching step for forming the via hole, the via hole periphery (the C part of FIG. 9A) of the first insulation layer 330 may be damaged. For this reason, in the via hole periphery (the C part of FIG. 9A) of the first insulation layer 330, there is formed a modified layer obtained by changing the material of the first insulation layer 330. The modified layer has been chemically more changed in composition than, for example, the first insulation layer 330. Further, the modified layer includes, for example, unevenness physically formed thereon. Therefore, the region including such a modified layer formed therein increases in dielectric constant. Further, the region including the modified layer formed therein is bad in adhesion to a metal.

Incidentally, the problems in the comparative example may also remarkably occur in the case where the first via 440 is formed of, not only W, but also Cu with a plating method.

On the other hand, FIG. 9B shows the case of the first embodiment. In accordance with the first embodiment, the metal layer 400 is formed entirely over the semiconductor substrate 100, and then is patterned into the shapes of the first wiring 420 and the first via 440. As a result, the shapes of the first wiring 420 and the first via 440 can be refined while keeping the crystal grains of the metal layer 400 large. Further, by applying such a method, at least one side surface of the first wiring 420 forms the same surface as the side surface of the first via 440.

Further, in the first embodiment, the method does not include a step of forming a via hole for forming the first via 440 in the first insulation layer 330. As a result, at portions of the first insulation layer 330 in contact with the side surfaces of the first wiring 420 and the first via 440, there is not formed a modified layer obtained by changing the material of the first insulation layer 330. Therefore, it is possible to reduce the dielectric constant throughout the first insulation layer 330. Further, the modified layer is not formed, which can enhance the adhesion between the first insulation layer 330 and the first wiring 420 and the first via 440.

Further, as in FIG. 9B, at least apart of the side surface of the first via 440 cuts off the crystal grains 402 of the metal. Incidentally, in a region not shown, at least a part of the side surface of the first wiring 420 also cuts off the crystal grains 402 of the metal. In other words, at each side surface of the first wiring 420 and the first via 440, there are formed the cut surfaces of at least one or more metal crystal grains 402.

Whereas, the first wiring 420 and the first via 440 are formed by, for example, sputtering. In other words, the first wiring 420 and the first via 440 are not formed using a fluorine-containing raw material. For this reason, the content of fluorine in the first wiring 420 and the first via 440 is less than $1 \times 10^{19}$ atoms/cc. As a result, it is possible to form the first wiring 420 and the first via 440 with a metal including large crystal grains 402. Further, the content of impurities in the first wiring 420 and the first via 440 can be reduced, which can implement a lower resistance.

With such a structure, the first wiring 420 and the first via 440 can be formed with a metal including large crystal grains 402 regardless of the widths of the first wiring 420 and the first via 440. Namely, even when the first wiring 420 and the first via 440 are miniaturized, it is possible to obtain the first wiring 420 and the first via 440 low in resistance.

As described up to this point, in accordance with the first embodiment, it is possible to provide a semiconductor device 10 having a low-resistance fine-pitch wiring structure.

Second Embodiment

FIGS. 10A and 10B to 19A and 19B are each a cross-sectional view for illustrating a method for manufacturing a semiconductor device 10 in accordance with a second embodiment. The second embodiment is equal to the first embodiment except for the following points. A part of the first via 440 protrudes from the portion of the first wiring 420 not overlapping with the first via 440 in plan view. The side surface of the portion of the first wiring 420 overlapping with the first via 440 in plan view forms the same surface as the side surface of the first via 440. Below, the details will be described.

FIGS. 10A and 10B to 19A and 19B each show a part of the semiconductor device 10 in accordance with the second embodiment. FIGS. 10A to 19A are each a plan view of the first wiring layer 30 as viewed from the top surface thereof. Whereas, FIGS. 10B to 19B are cross-sectional views along respective lines D-D' of FIGS. 10A to 19A, respectively.

First, a description will be started from the configuration of the semiconductor device 10 in accordance with the second embodiment.

Figure 19A:
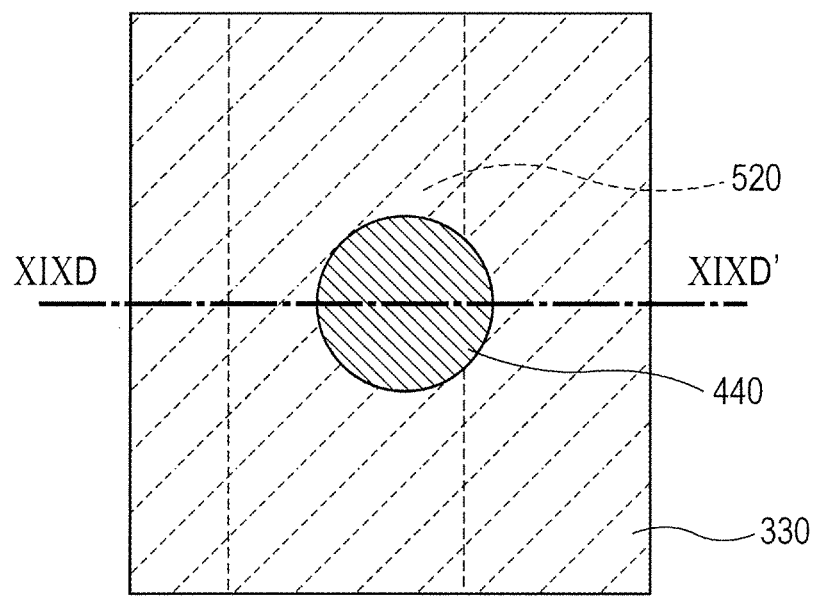
FIGS. 19A and 19B are each a view for illustrating a method for manufacturing the semiconductor device in accordance with the second embodiment.

Herein, as in FIG. 19A, the first via 440 is a circle or an ellipse in plan view. Whereas, a part of the first via 440 (in the drawing, the right-side side surface of the first via 440) protrudes from the portion of the first wiring 420 not overlapping with the first via 440 in plan view.

Figure 19B:
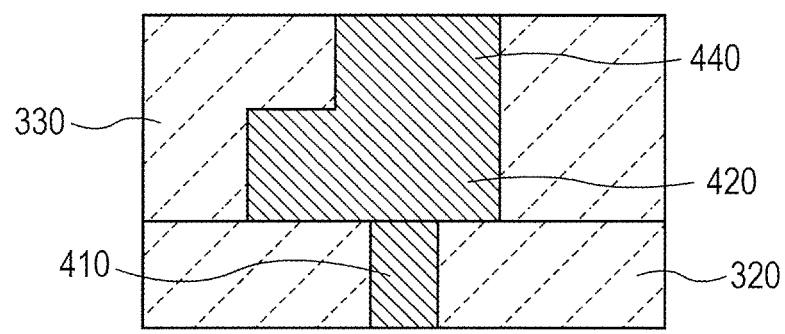

As in FIG. 19B, the protruding portion of the first via 440 is formed integrally to the bottom surface of the first wiring 420. Namely, the side surface of the portion of the first wiring 420 overlapping with the first via 440 in plan view forms the same surface as the side surface of the first via 440. Whereas, the entire bottom surface of the first via 440 is in contact with the top surface of the first wiring 420. In other words, the bottom surface of the protruding portion of the first via 440 is not in contact with the first insulation layer 330.

Then, a description will be given to a method for manufacturing the semiconductor device 10 in accordance with the second embodiment. The second embodiment is equal to the first embodiment, except that a multilayer hard mask layer is previously formed according to their respective shapes of the first wiring 420 and the first via 440. Incidentally, the second embodiment is equal to a third embodiment described later except for the point of first forming a first via mask.

First, in the same manner as in the first embodiment, in the semiconductor substrate 100, there is formed the semiconductor element 20. Then, in the lower-layer insulation layer 320, there is formed the contact plug 410.

Figure 10A:
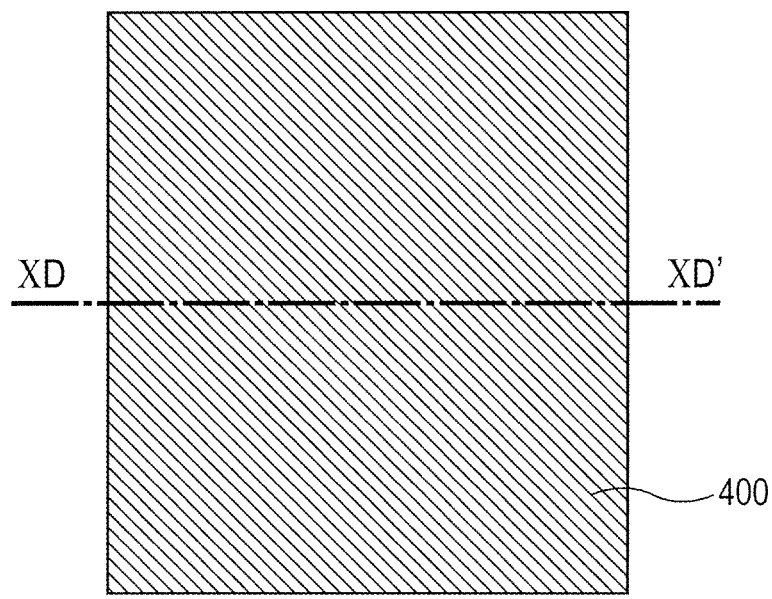
FIGS. 10A and 10B are each a view for illustrating a method for manufacturing a semiconductor device in accordance with a second embodiment.
Figure 10B:
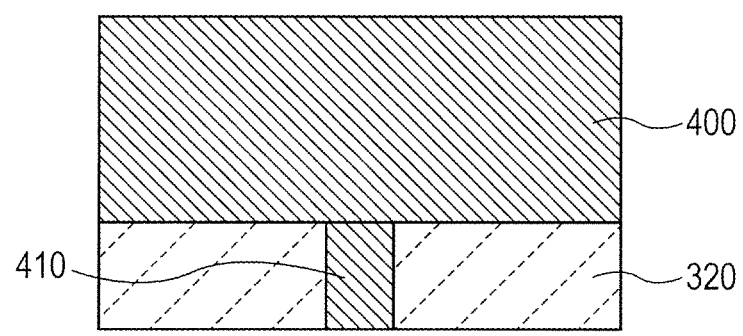

Then, as in FIGS. 10A and 10B, a metal layer 400 is formed entirely over the lower-layer insulation layer 320. The metal layer 400 is formed by, for example, sputtering.

Figure 11A:
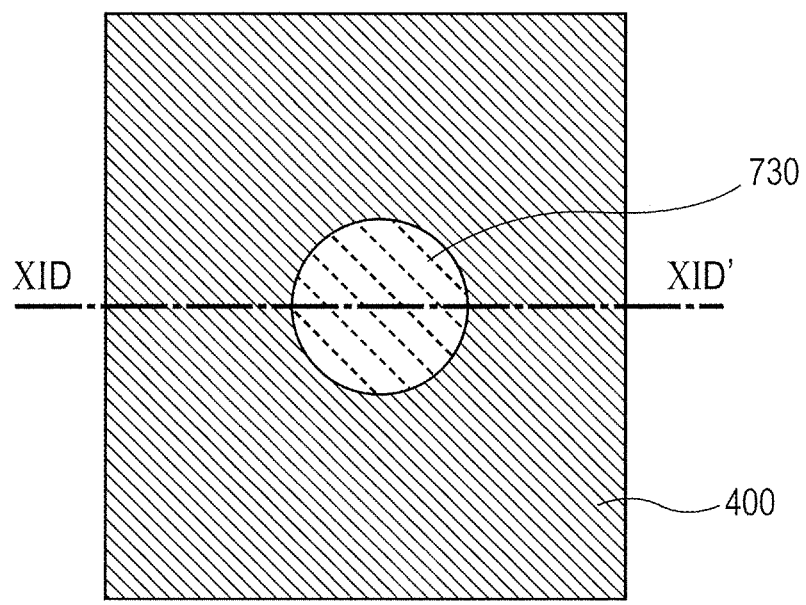
FIGS. 11A and 11B are each a view for illustrating a method for manufacturing the semiconductor device in accordance with the second embodiment.
Figure 11B:
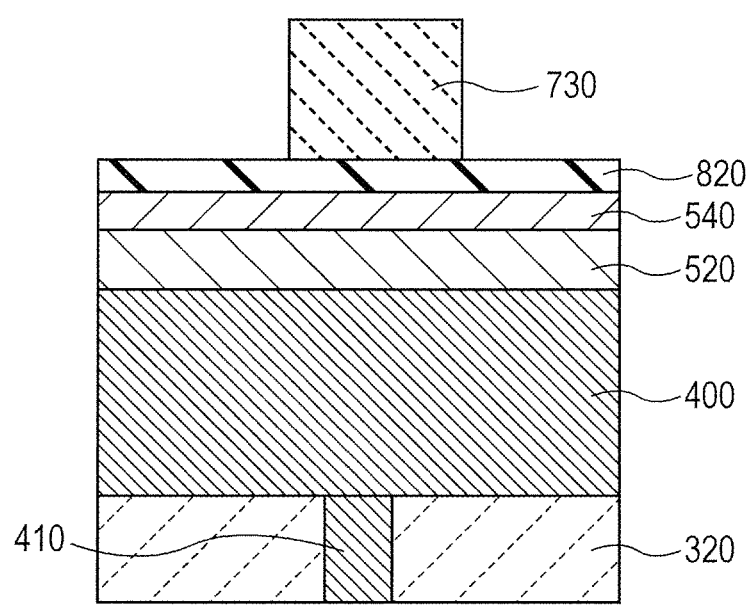

Then, as in FIGS. 11A and 11B, over the metal layer 400, a first mask layer 520 and a second mask layer 540 are sequentially stacked as hard mask layers. At this step, the second mask layer 540 is formed of a different material from that of the first mask layer 520. Further, respective materials are selected so that the etching selectivity between the first mask layer 520 and the second mask layer 540 is higher. Incidentally, the first mask layer 520 and the second mask layer 540 are also high in etching selectivity with respect to the metal layer 400. As the materials for the first mask layer 520 and the second mask layer 540, for example, the following materials may be mentioned. As the material containing Si, there is used, for example, $SiO_2$, SiN, SiC, SiCN, or amorphous Si. Whereas, as the metal-based material, there is used TiN, Ti, TaN, Ta, Ru, RuN, W, WN, WSi, Co, or the like. As the materials for the first mask layer 520 and the second mask layer 540, there are used respectively different two materials of the foregoing materials. Herein, for example, as the lower-layer first mask layer 520, $SiO_2$ is formed by plasma CVD. Then, as the upper-layer second mask layer 540, SiN is formed by plasma CVD.

Then, over the second mask layer 540, an antireflection layer 820 is formed. For the antireflection layer 820, there can be used the same materials as those in the first embodiment. Insertion of the antireflection layer 820 can enhance the resolution of patterning. Incidentally, when the second mask layer 540 is formed of a material with a low reflectivity, the antireflection layer 820 is not required to be formed.

Then, over the antireflection layer 820, there is formed a photoresist layer 730. Then, by exposure and development, the photoresist layer 730 is patterned into the shape of the first via 440 in plan view.

Figure 12A:
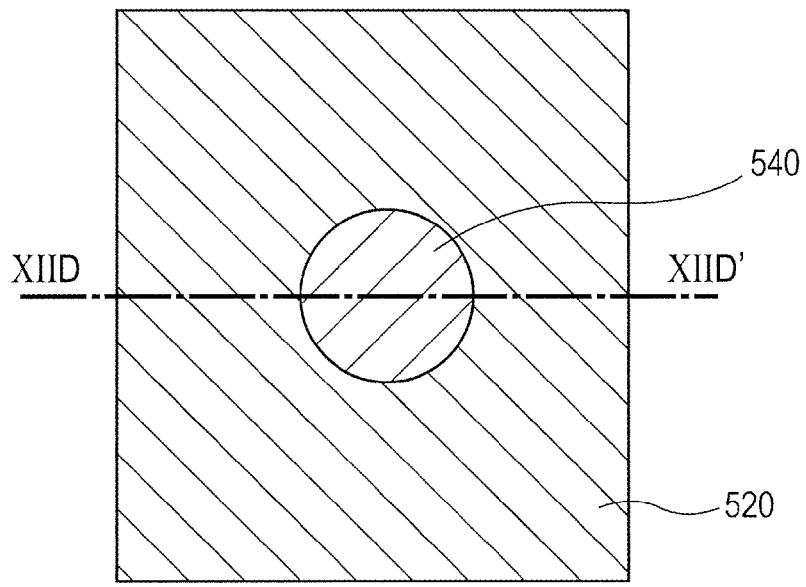
FIGS. 12A and 12B are each a view for illustrating a method for manufacturing the semiconductor device in accordance with the second embodiment.
Figure 12B:
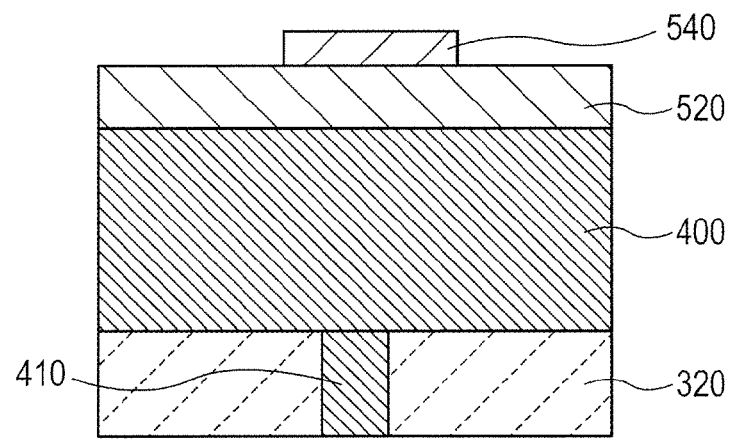

Then, as in FIGS. 12A and 12B, with the photoresist layer 730 as a mask, the antireflection layer 820 and the second mask layer 540 are etched by RIE. The etching conditions at this step are set as the conditions under which the second mask layer 540 is more likely to be etched than the first mask layer 520. As a result, only the second mask layer 540 is etched. On the other hand, the first mask layer 520 is not etched, but is left. In this manner, a first via mask having the shape of the first via 440 in plan view is formed in the second mask layer 540 (first via mask formation step). Then, the antireflection layer 820 and the photoresist layer 730 are removed by plasma ashing.

Figure 13A:
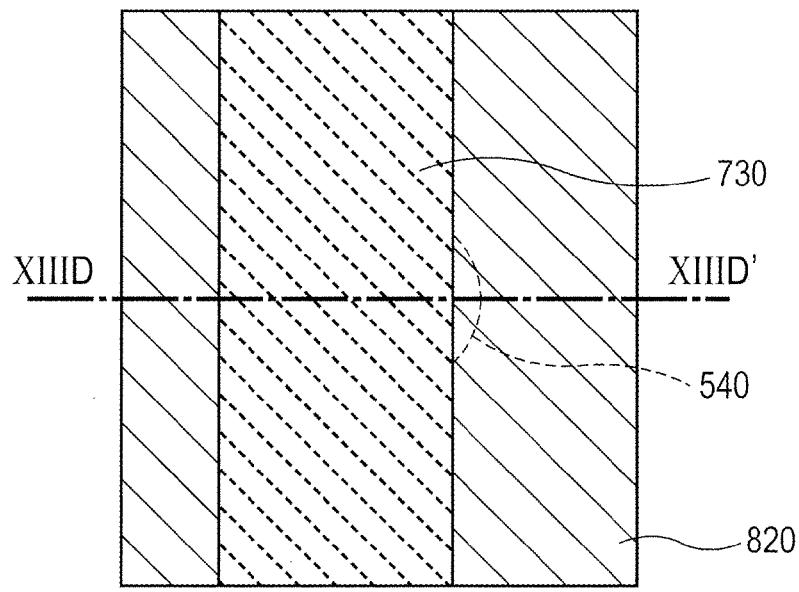
FIGS. 13A and 13B are each a view for illustrating a method for manufacturing the semiconductor device in accordance with the second embodiment.
Figure 13B:
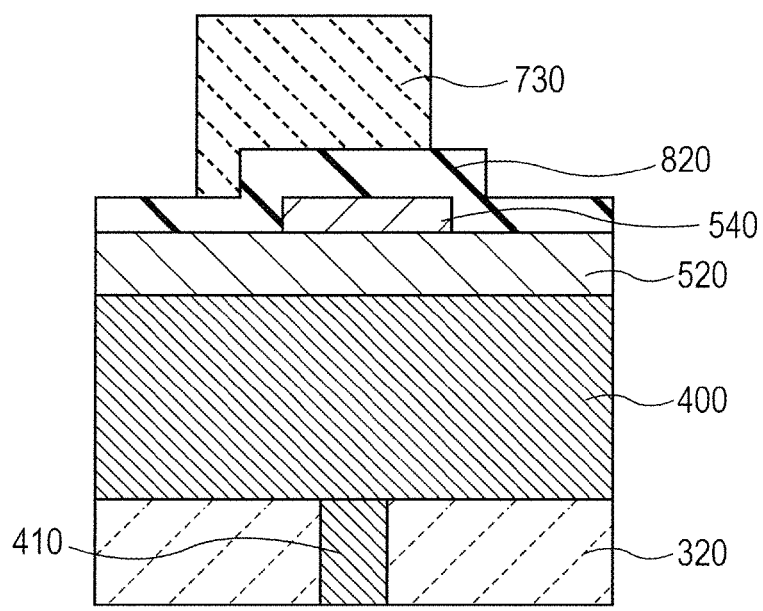

Then, as in FIGS. 13A and 13B, over the first mask layer 520 and the second mask layer 540, there is formed an antireflection layer 820. Further, over the antireflection layer 820, there is formed a photoresist layer 730. Then, by exposure and development, the photoresist layer 730 is patterned into the shape of the first wiring 420 in plan view.

At this step, FIG. 13A shows the case where alignment is shifted in patterning of the photoresist layer 730. As in FIG. 13A, the second mask layer 540 patterned into the shape of the first via 440 in plan view protrudes outwardly from the photoresist layer 730 patterned into the shape of the first wiring 420 in plan view.

Figure 14A:
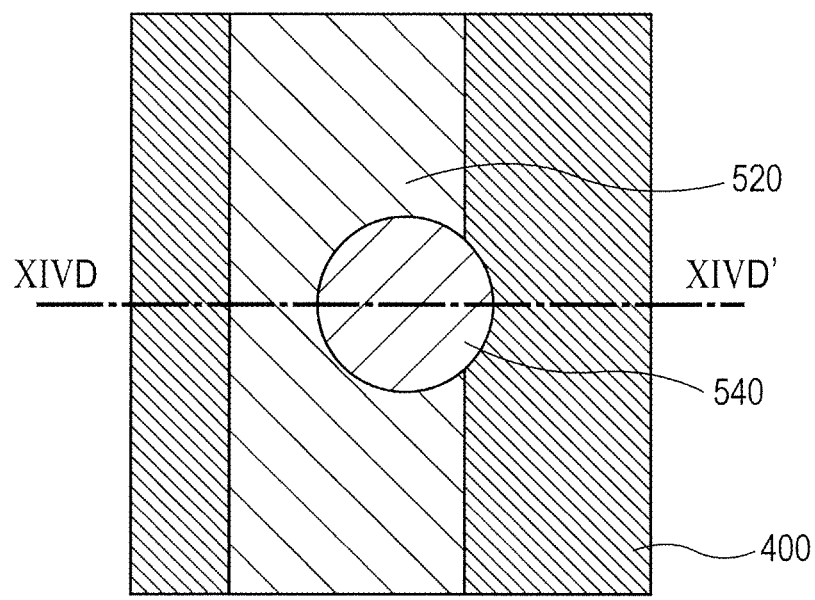
FIGS. 14A and 14B are each a view for illustrating a method for manufacturing the semiconductor device in accordance with the second embodiment.
Figure 14B:
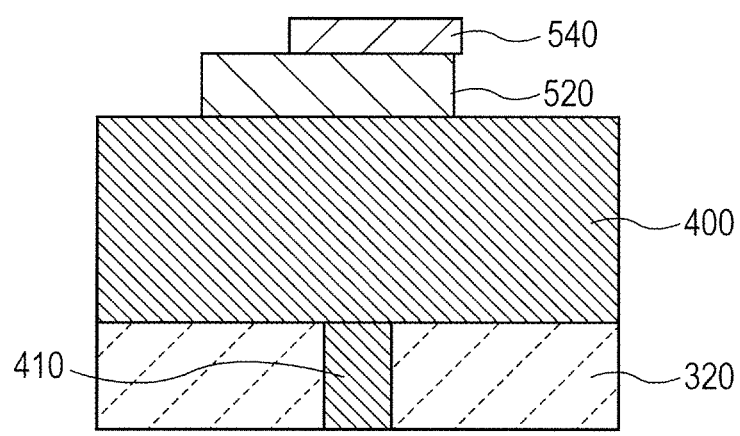

Then, as in FIGS. 14A and 14B, with the photoresist layer 730 as a mask, the antireflection layer 820 and the first mask layer 520 are etched by RIE. The etching conditions at this step are set as the conditions under which the first mask layer 520 is more likely to be etched than the second mask layer 540. As a result, a portion of the first mask layer 520 not overlapping with the photoresist layer 730 or the second mask layer 540 in plan view is etched. On the other hand, the second mask layer 540, and a portion of the first mask layer 520 overlapping with the photoresist layer 730 or the second mask layer 540 in plan view are not etched, but are left. In this manner, a first wiring mask having the shape of the first wiring 420 in plan view is formed in the first mask layer 520 (first wiring mask formation step). The wording "having the shape of the first wiring 420 in plan view" denotes including at least the shape of the first wiring 420 in plan view. The mask may include the shape of the protruding portion of the first via 440 from the first wiring 420 in plan view. Then, the antireflection layer 820 and the photoresist layer 730 are removed by plasma ashing.

In this manner, a first via mask is formed in the second mask layer 540, and a second wiring mask is formed in the first mask layer 520. At this step, a part of the first via mask formed in the second mask layer 540 may be formed in a form protruding from the portion of the second wiring mask not overlapping with the first via mask in plan view. Further, in this case, the side surface of the portion of the first wiring mask formed in the first mask layer 520 forms the same surface as the side surface of the first via mask.

Figure 15A:
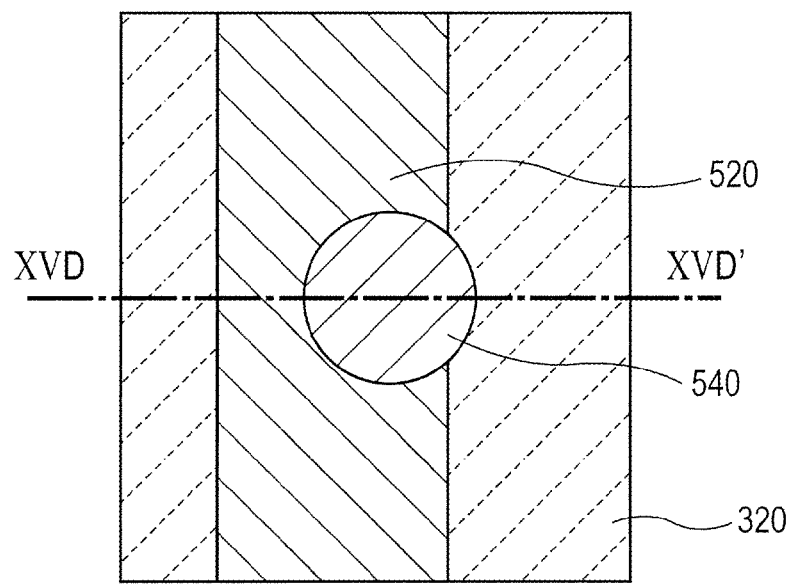
FIGS. 15A and 15B are each a view for illustrating a method for manufacturing the semiconductor device in accordance with the second embodiment.
Figure 15B:
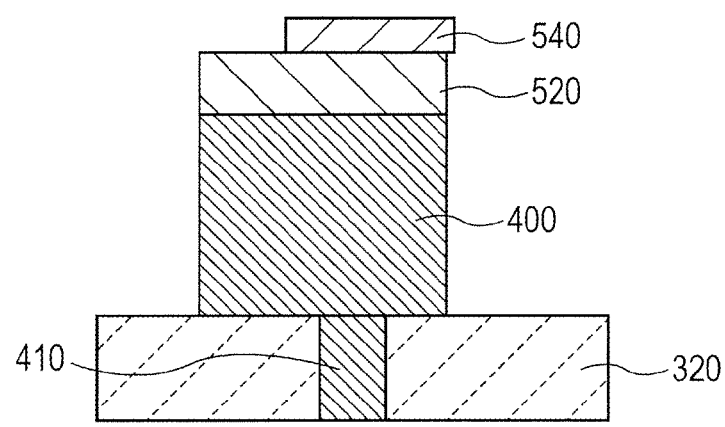

Then, as in FIGS. 15A and 15B, with the first wiring mask (the first mask layer 520) and the first via mask (the second mask layer 540) as a mask, the metal layer 400 is etched into the shape of the first wiring 420 in plan view by RIE. The etching conditions at this step are set as the conditions under which the metal layer 400 is more likely to be etched than the first mask layer 520 and the second mask layer 540. As a result, the first mask layer 520 and the second mask layer 540 are left, and only the metal layer 400 is etched. This results in the formation of a metal pattern having the shape of the first wiring 420 in plan view (metal pattern formation step).

Figure 16A:
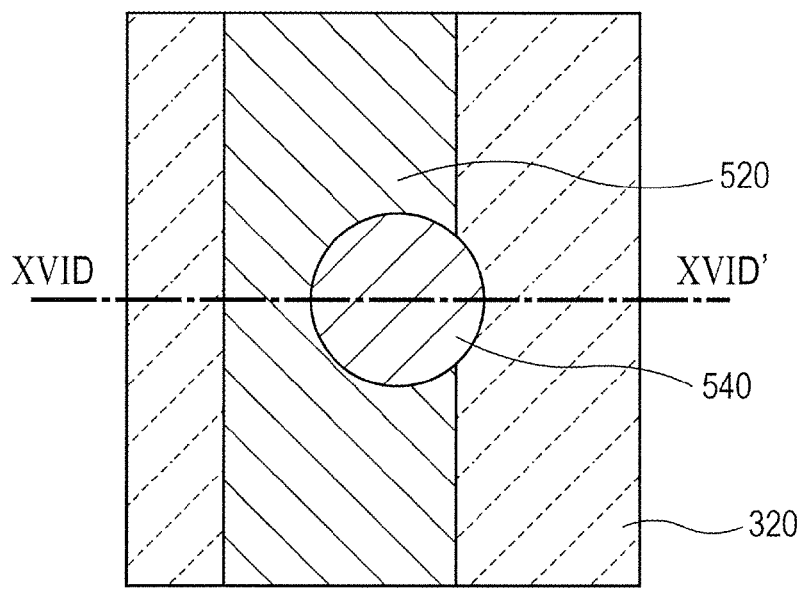
FIGS. 16A and 16B are each a view for illustrating a method for manufacturing the semiconductor device in accordance with the second embodiment.
Figure 16B:
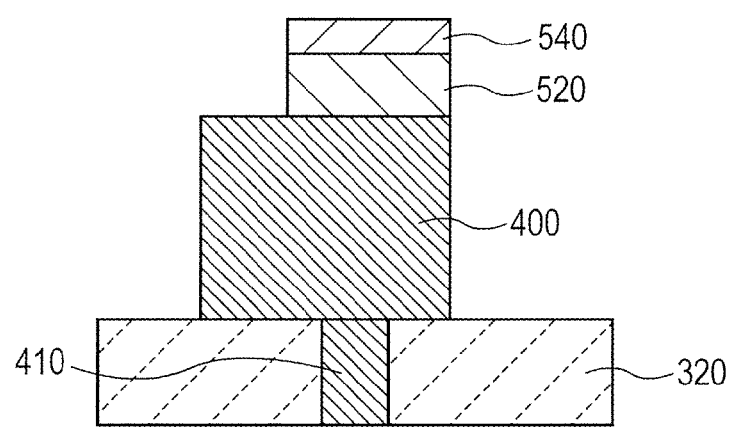

Then, as in FIGS. 16A and 16B, with the first via mask (the second mask layer 540) as a mask, the first mask layer 520 is etched by RIE. The etching conditions at this step are set as the conditions under which the first mask layer 520 is more likely to be etched than the metal layer 400 and the second mask layer 540. As a result, the metal layer 400 and the second mask layer 540 are left, and only the first mask layer 520 is etched into the same shape as that of the first via mask in plan view.

Figure 17A:
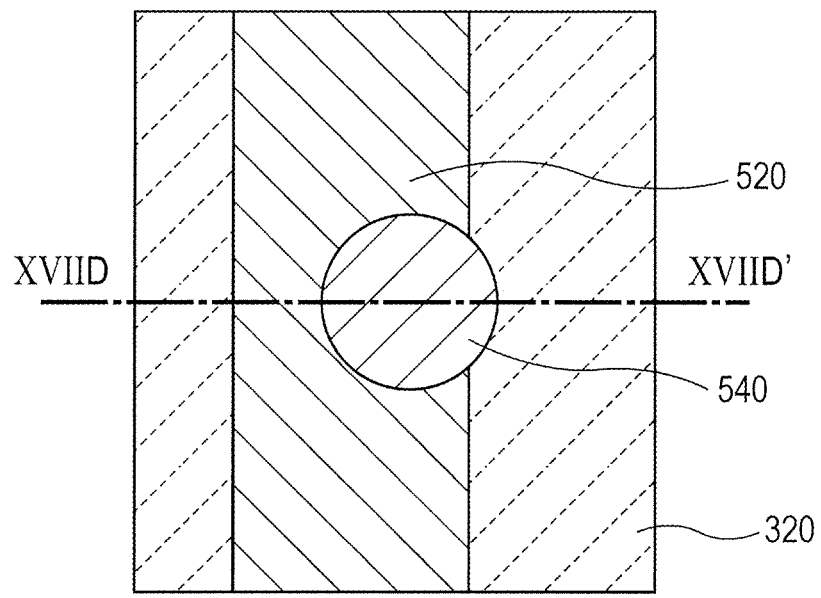
FIGS. 17A and 17B are each a view for illustrating a method for manufacturing the semiconductor device in accordance with the second embodiment.
Figure 17B:
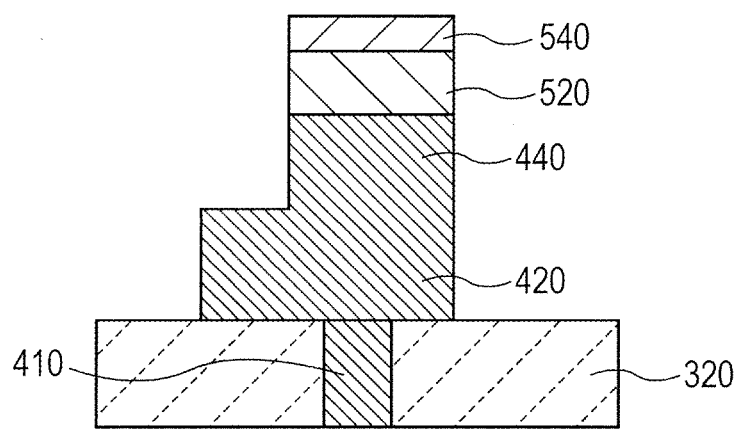

Then, as in FIGS. 17A and 17B, with the first via mask (the second mask layer 540), and the first mask layer 520 patterned into the same shape as that of the first via mask in plan view as a mask, the metal pattern is partially etched. This results in the formation of the first wiring 420 and the first via 440 (up to this point, first via pattern formation step).

Figure 18A:
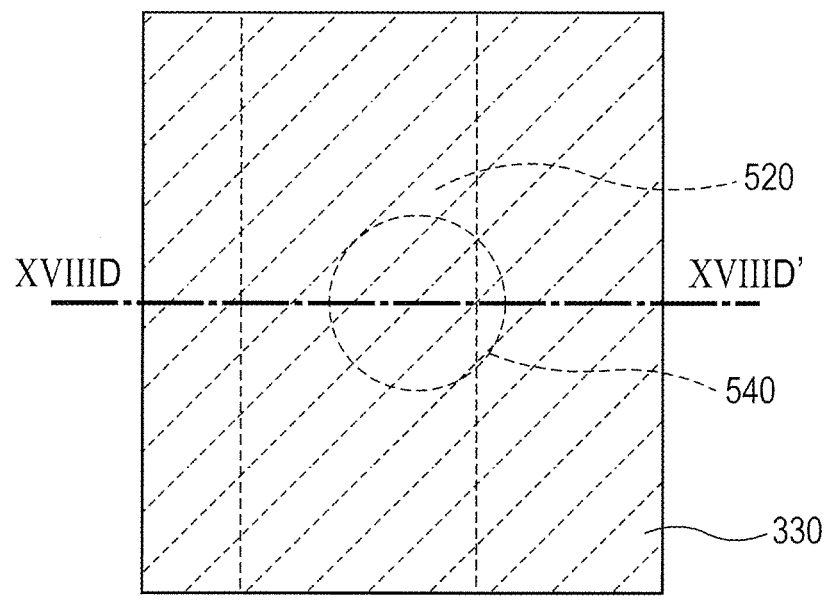
FIGS. 18A and 18B are each a view for illustrating a method for manufacturing the semiconductor device in accordance with the second embodiment.
Figure 18B:
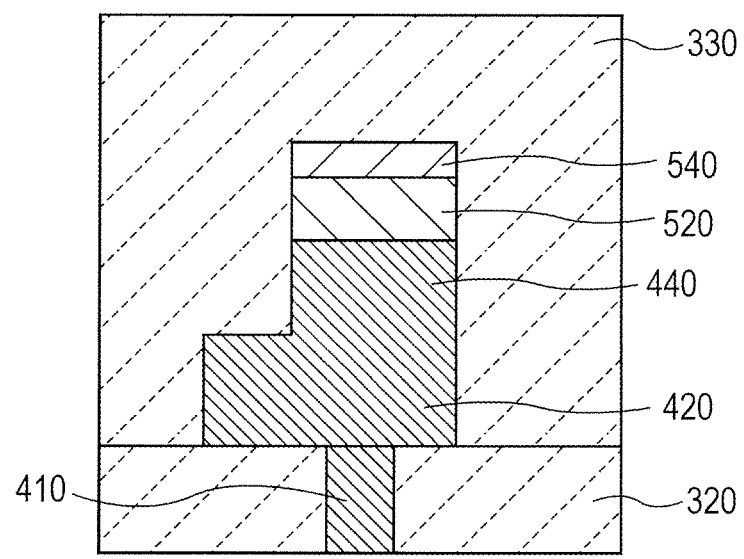

Then, as in FIGS. 18A and 18B, a first insulation layer 330 is formed in such a manner as to cover the patterned first wiring 420 and first via 440 with the first mask layer 520 and the second mask layer 540 left thereover (first insulation layer formation step). Herein, for example, as the first insulation layer 330, a porous MSQ film is formed by a coating method.

Then, as in FIGS. 19A and 19B, after the first insulation layer formation step, the top surface of the first insulation layer 330 is planarized by CMP (planarization step). At this step, the first wiring mask (the first mask layer 520) and the first via mask (the second mask layer 540) are removed, and the top surface of the first insulation layer 330 is planarized. As a result, the top surface of the first via 440 is exposed from the first insulation layer 330. By removing the first wiring mask and the first via mask simultaneously with the planarization step in this manner, it is possible to omit the step of removing the mask. Further, it is possible to avoid the formation of etching defects in the metal layer 400 in selective etching in the step of removing the mask. Further, it is possible to avoid the peeling of the metal layer 400 when the step of removing the mask is wet etching.

The subsequent steps are the same as those in the first embodiment.

Then, the effects of the second embodiment will be described.

Herein, a consideration will be given to the case where when a first via 440 is formed over a first wiring 420 by a damascene method, the position of the first via 440 is shifted outwardly from the first wiring 420 in plan view as a comparative example. In this case, the area of the bottom surface of the first via 440 in contact with the top surface of the first wiring 420 is reduced. For this reason, the subsequent CMP step and the like may cut off the first via 440 from the first wiring 420. Further, the contact area is small, which may raise the contact resistance between the first wiring 420 and the first via 440.

On the other hand, in accordance with the second embodiment, after forming the upper-layer first via mask as a hard mask layer, the lower-layer first wiring mask is formed. Then, using the masks, the first wiring 420 and the first via 440 are formed. The semiconductor device 10 formed in this manner has the following configuration. A part of the first via 440 protrudes outwardly from the portion of the first wiring 420 not overlapping with the first via 440 in plan view. Further, the side surface of the portion of the first wiring 420 overlapping with the first via 440 forms the same surface as the side surface of the first via 440. Namely, the entire bottom surface of the first via 440 is in contact with the top surface of the first wiring 420. This can suppress the cutting off of the first via 440 from the first wiring 420 in the CMP step or the like. Namely, the first wiring 420 and the first via 440 can be coupled with stability. Further, it is possible to make the contact resistance between the first wiring 420 and the first via 440 lower than that in the comparative example.

Third Embodiment

FIGS. 20A and 20B to 29A and 29B are each a cross-sectional view for illustrating a method for manufacturing a semiconductor device 10 in accordance with a third embodiment. The third embodiment is equal to the first embodiment or the second embodiment except for the following points. As in FIGS. 29A and 29B, a part of the side surface of the first via 440 is cut along a straight line of the portion of the first wiring 420 not overlapping with the first via 440 in plan view. Whereas, the side surface of the portion of the first wiring 420 overlapping with the first via 440 in plan view forms the same surface as the side surface of the first via 440 cut along the straight line. Below, the details will be described.

FIGS. 20A and 20B to 29A and 29B each show a part of the semiconductor device 10 in accordance with the third embodiment. FIGS. 20A to 29A are each a plan view of the first wiring layer 30 as seen from the top surface thereof. Whereas, FIGS. 20B to 28B are cross-sectional views along respective lines D-D' of FIGS. 20A to 29A, respectively.

First, a description will be started from the configuration of the semiconductor device 10 in accordance with the third embodiment.

Figure 29A:
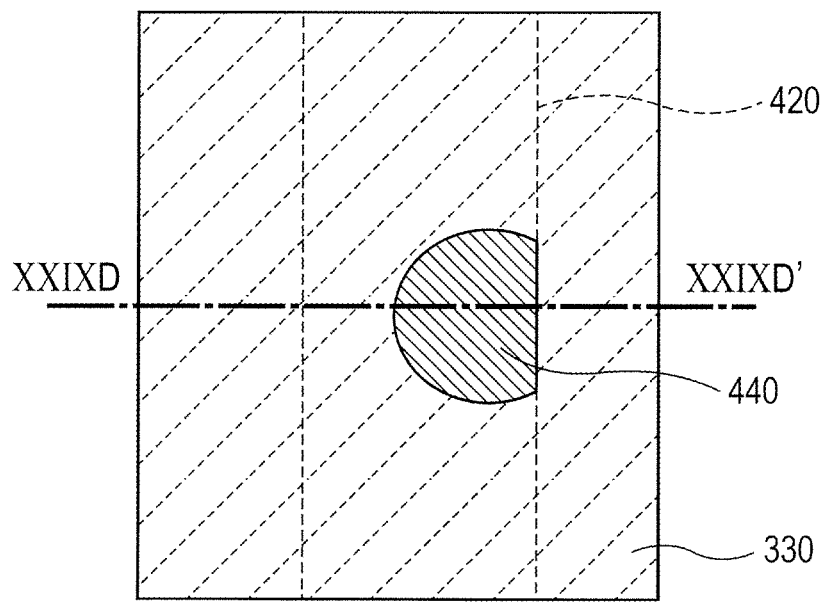
FIGS. 29A and 29B are each a view for illustrating a method for manufacturing the semiconductor device in accordance with the third embodiment.

Herein, as in FIG. 29A, the first via 440 is, for example, a part of a circle or an ellipse in plan view. Whereas, a part of the side surface of the first via 440 is cut along a straight line (dotted line in the drawing) of the portion of the first wiring 420 not overlapping with the first via 440 in plan view.

Figure 29B:
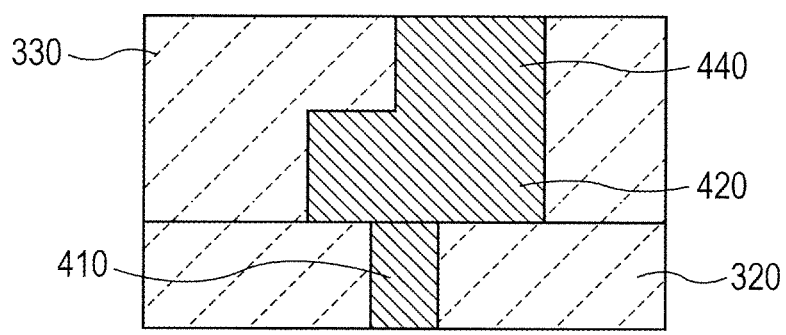

As in FIG. 29B, the side surface of the portion of the first wiring 420 overlapping with the first via 440 in plan view forms the same surface as the side surface of the first via 440 cut along the straight line. Further, as with the first embodiment, the entire bottom surface of the first via 440 is in contact with the top surface of the first wiring 420.

Then, a description will be given to a method for manufacturing the semiconductor device 10 in accordance with the third embodiment. The third embodiment is equal to the second embodiment, except that the first wiring mask is previously formed.

First, as shown in FIG. 2, in the same manner as in the first embodiment, the semiconductor element 20 is formed in the semiconductor substrate 100. Then, the contact plug 410 is formed in the lower-layer insulation layer 320.

Figure 20A:
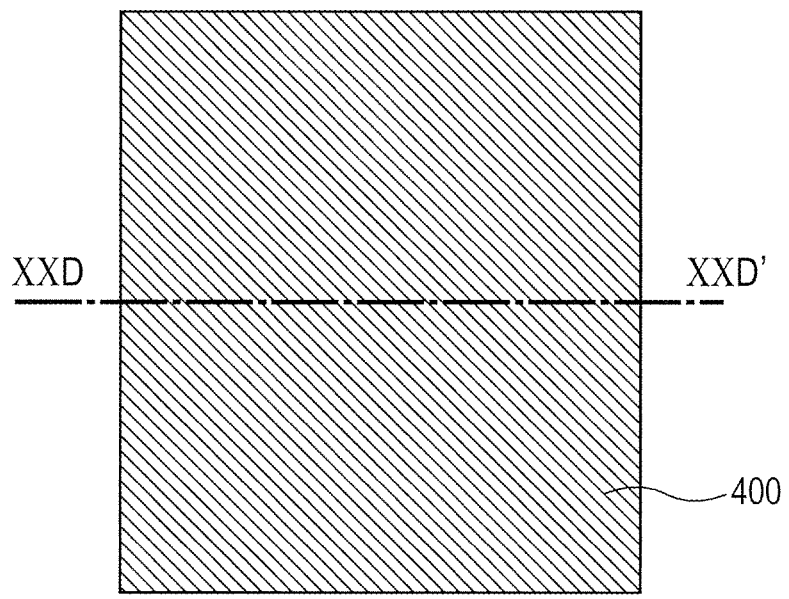
FIGS. 20A and 20B are each a view for illustrating a method for manufacturing a semiconductor device in accordance with a third embodiment.
Figure 20B:
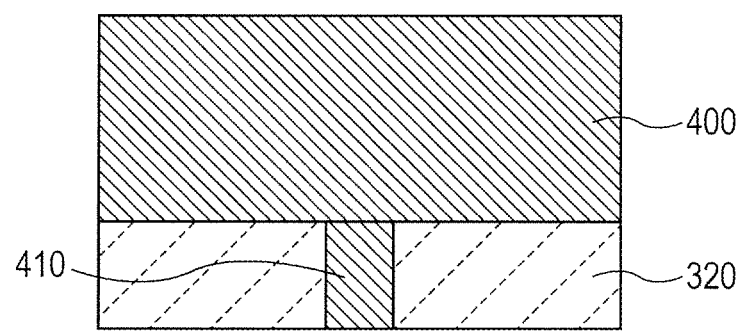

Then, as in FIGS. 20A and 20B, entirely over the lower-layer insulation layer 320, a metal layer 400 is formed. The metal layer 400 is formed by, for example, sputtering.

Figure 21A:
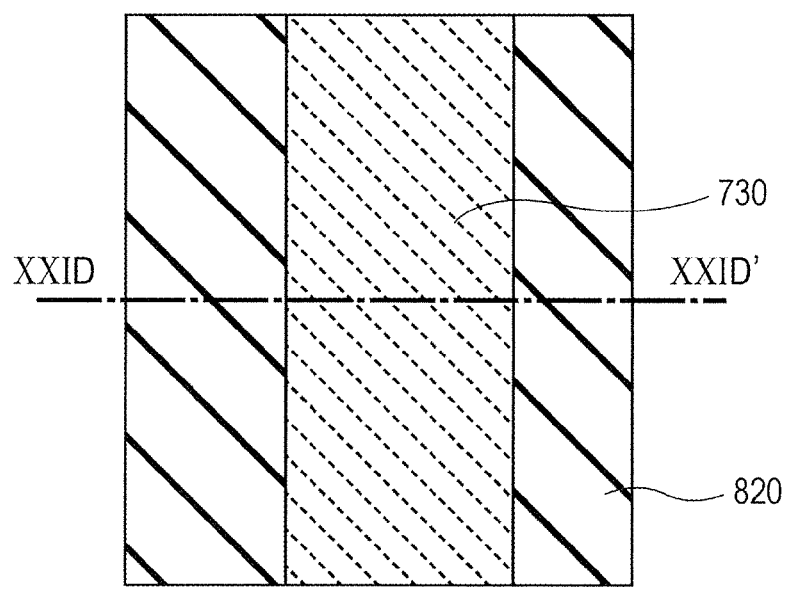
FIGS. 21A and 21B are each a view for illustrating a method for manufacturing the semiconductor device in accordance with the third embodiment.
Figure 21B:
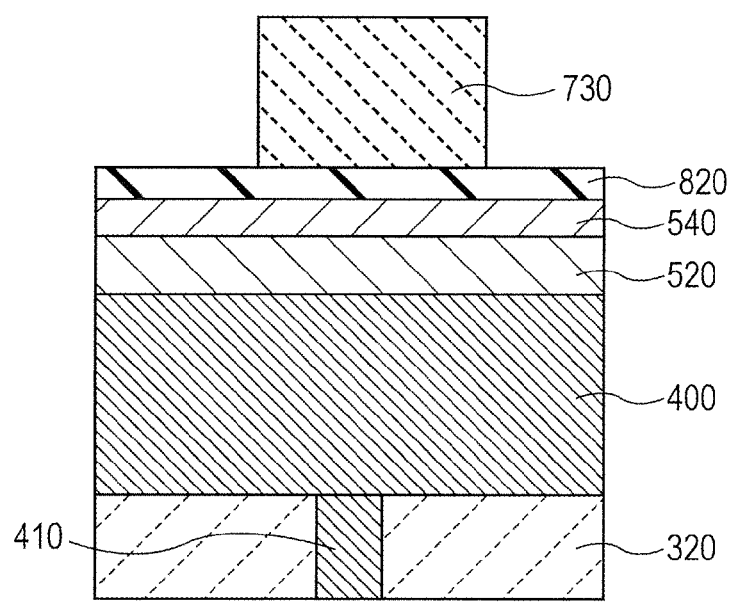

Then, as in FIGS. 21A and 21B, over the metal layer 400, as hard mask layers, the first mask layer 520 and the second mask layer 540 are sequentially stacked. As with the second embodiment, the second mask layer 540 is formed of a different material from that of the first mask layer 520. Herein, for example, as the lower-layer first mask layer 520, $SiO_2$ is formed by plasma CVD. Then, as the upper-layer second mask layer 540, amorphous Si is formed by plasma CVD.

Then, over the second mask layer 540, an antireflection layer 820 is formed by, for example, a coating method. Then, over the antireflection layer 820, there is formed a photoresist layer 730. Then, by exposure and development, the photoresist layer 730 is patterned into the shape of the first wiring 420 in plan view.

Figure 22A:
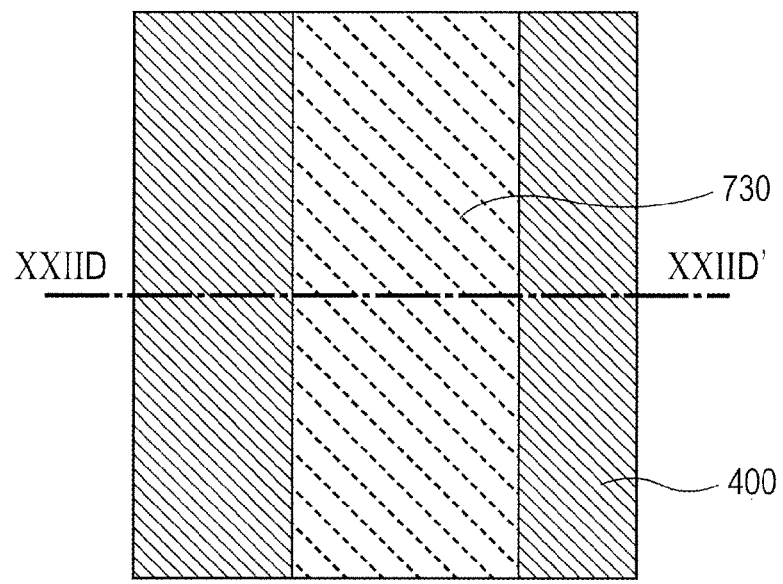
FIGS. 22A and 22B are each a view for illustrating a method for manufacturing the semiconductor device in accordance with the third embodiment.
Figure 22B:
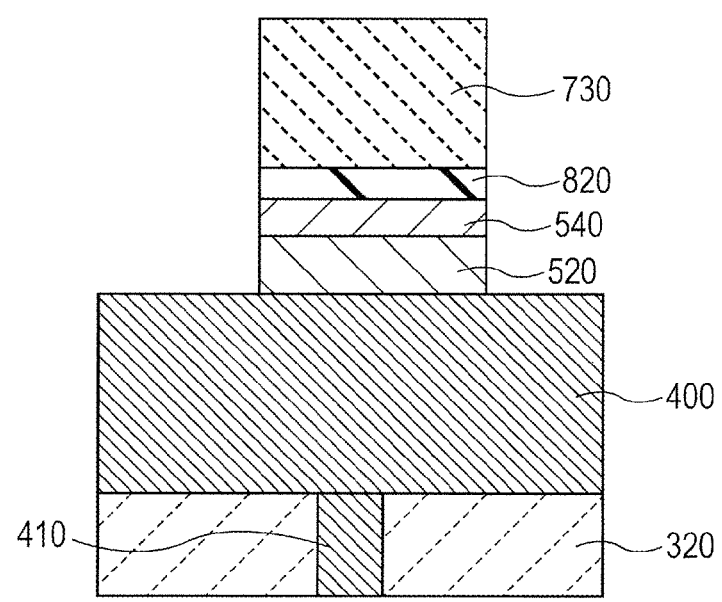

Then, as in FIGS. 22A and 22B, with the photoresist layer 730 as a mask, the antireflection layer 820, the second mask layer 540, and the first mask layer 520 are etched in this order by RIE. At this step, the etching conditions have no particular restriction. Any etching conditions are acceptable so long as the first mask layer 520 is etched into a desired shape. For example, respective layers may be etched under different etching conditions. Alternatively, these three layers may be etched at one time. In this manner, the first mask layer 520 and the second mask layer 540 are patterned, thereby to form a first wiring mask having the shape of the first wiring 420 in plan view.

Figure 23A:
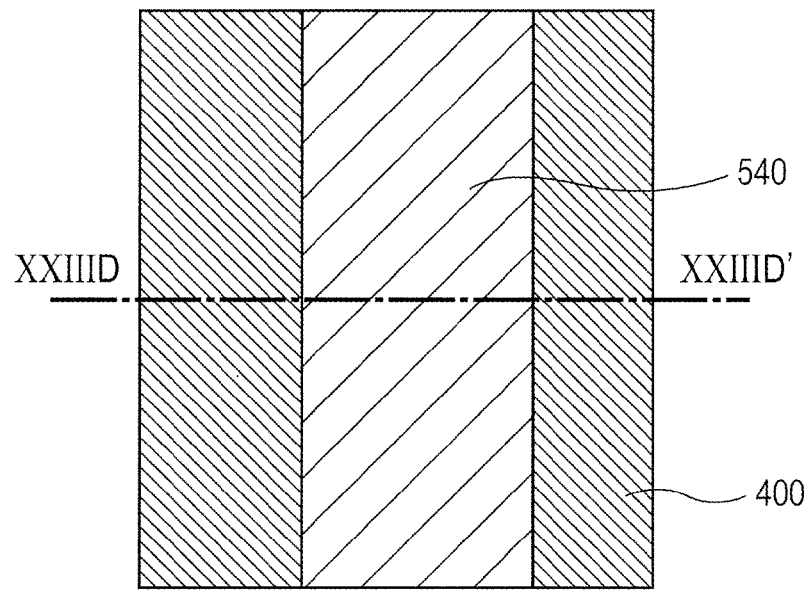
FIGS. 23A and 23B are each a view for illustrating a method for manufacturing the semiconductor device in accordance with the third embodiment.
Figure 23B:
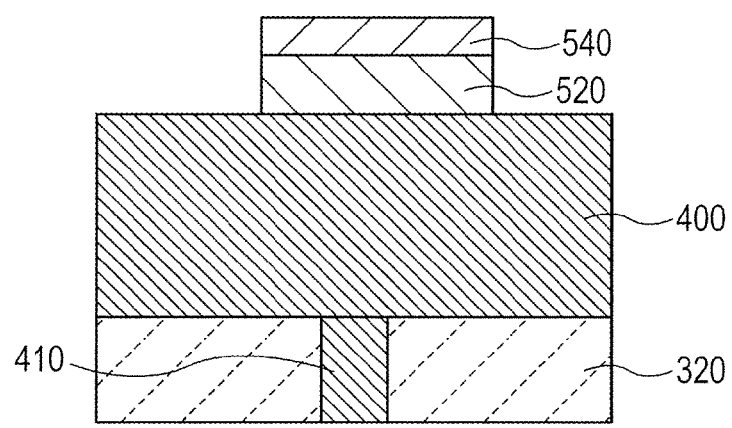

Then, as in FIGS. 23A and 23B, the antireflection layer 820 and the photoresist layer 730 are removed by plasma ashing.

Figure 24A:
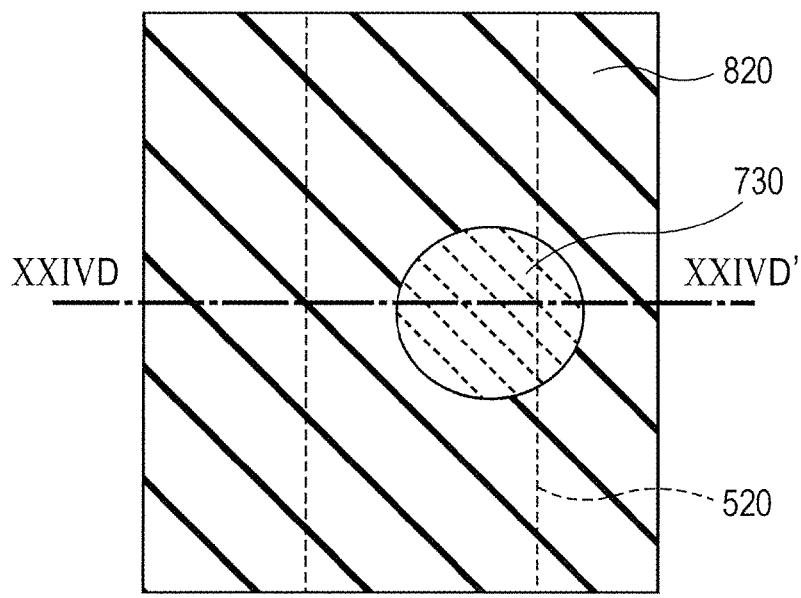
FIGS. 24A and 24B are each a view for illustrating a method for manufacturing the semiconductor device in accordance with the third embodiment.
Figure 24B:
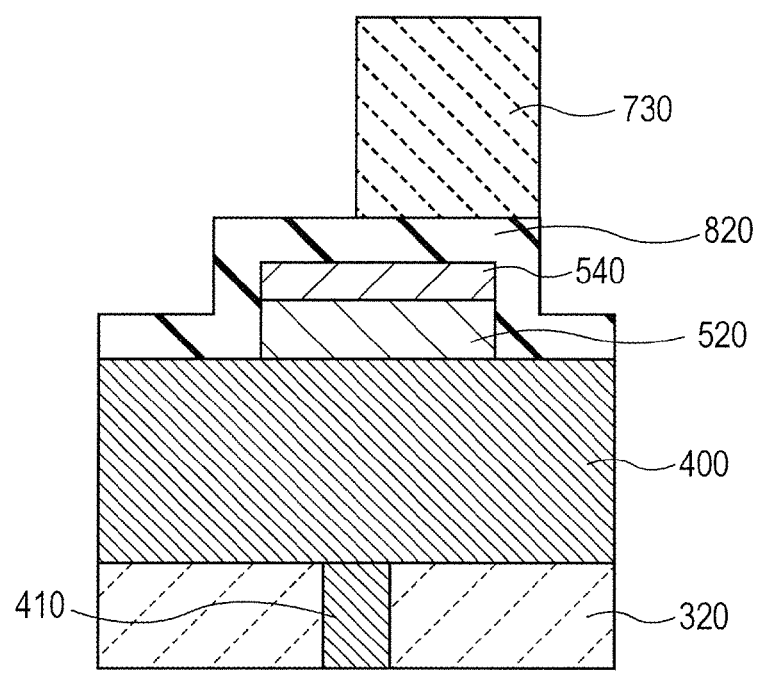

Then, as in FIGS. 24A and 24B, over the first mask layer 520 and the second mask layer 540, there is formed an antireflection layer 820. Further, over the antireflection layer 820, there is formed a photoresist layer 730. Then, by exposure and development, the photoresist layer 730 is patterned into the shape of the first via 440 in plan view.

At this step, FIG. 24A shows the case where alignment is shifted in patterning of the photoresist layer 730. As in FIG. 24A, the photoresist layer 730 patterned into the shape of the first via 440 in plan view is shifted outwardly from the first mask layer 520 patterned into the shape of the first wiring 420 in plan view.

Figure 25A:
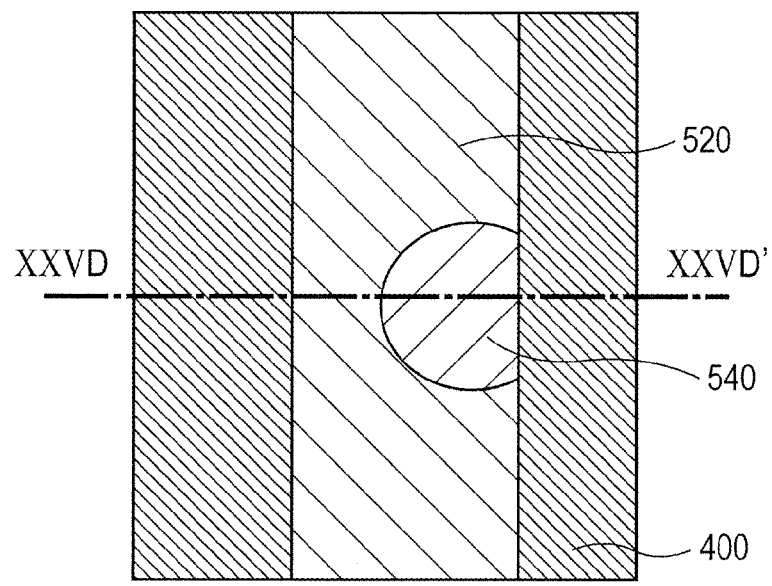
FIGS. 25A and 25B are each a view for illustrating a method for manufacturing the semiconductor device in accordance with the third embodiment.
Figure 25B:
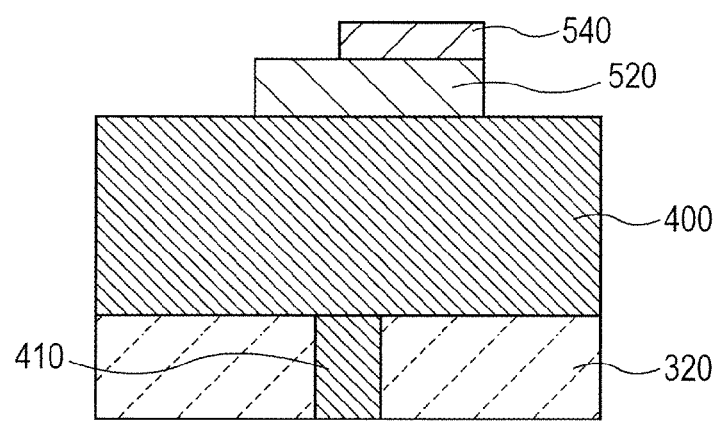

Then, as in FIGS. 25A and 25B, with the photoresist layer 730 as a mask, the antireflection layer 820 and the first mask layer 520 are etched by RIE. The etching conditions at this step are set as the conditions under which the second mask layer 540 is more likely to be etched than the first mask layer 520. As a result, the portion of the second mask layer 540 not overlapping with the photoresist layer 730 in plan view is etched. On the other hand, the previously patterned first mask layer 520 is left. Then, the antireflection layer 820 and the photoresist layer 730 are removed by plasma asking.

In this manner, a first via mask is formed in the second mask layer 540, and a second wiring mask is formed in the first mask layer 520. At this step, a part of the side surface of the first via mask is cut along a straight line of the portion of the first wiring 420 not overlapping with the first via 440 in plan view. Whereas, the side surface of the portion of the first wiring mask overlapping with the first via mask forms the same surface as the side surface of the first via 440 cut along the straight line.

Figure 26A:
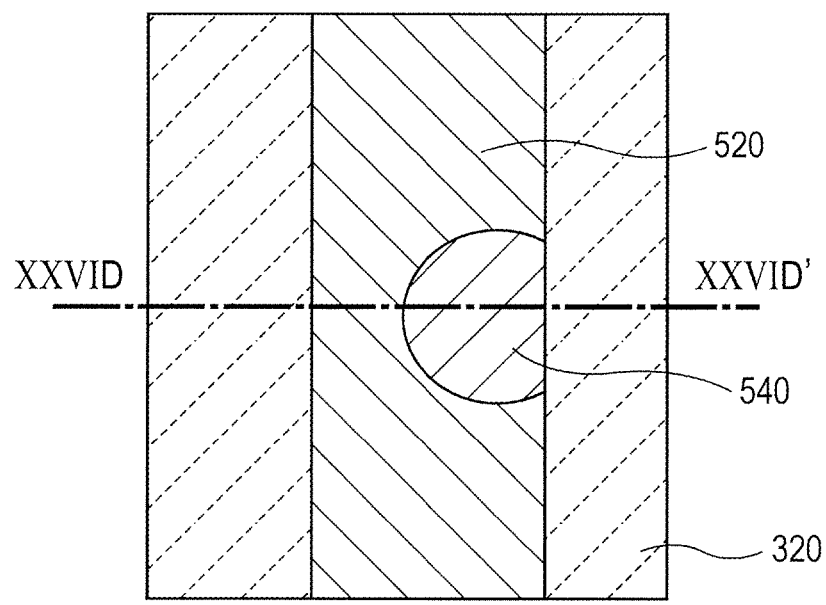
FIGS. 26A and 26B are each a view for illustrating a method for manufacturing the semiconductor device in accordance with the third embodiment.
Figure 26B:
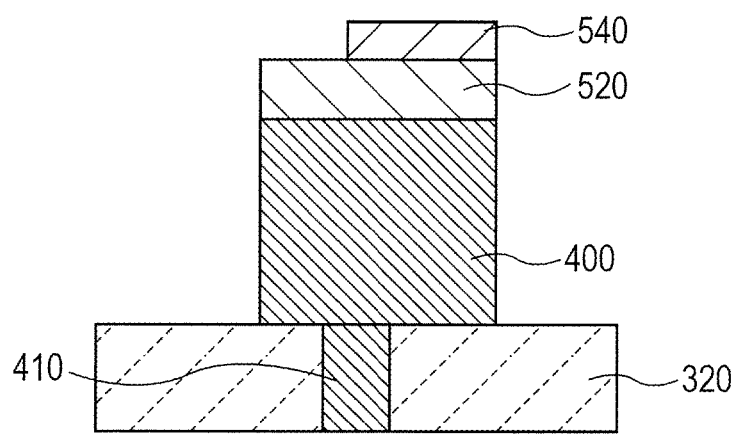

Then, as in FIGS. 26A and 26B, with the first wiring mask (the first mask layer 520) and the first via mask (the second mask layer 540) as a mask, the metal layer is etched into the shape of the first wiring 420 in plan view by RIE. The etching conditions at this step are set as the conditions under which the metal layer 400 is more likely to be etched than the first mask layer 520 and the second mask layer 540. As a result, the first mask layer 520 and the second mask layer 540 are left, and only the metal layer 400 is etched. This results in the formation of a metal pattern having the shape of the first wiring 520 in plan view (metal pattern formation step).

Figure 27A:
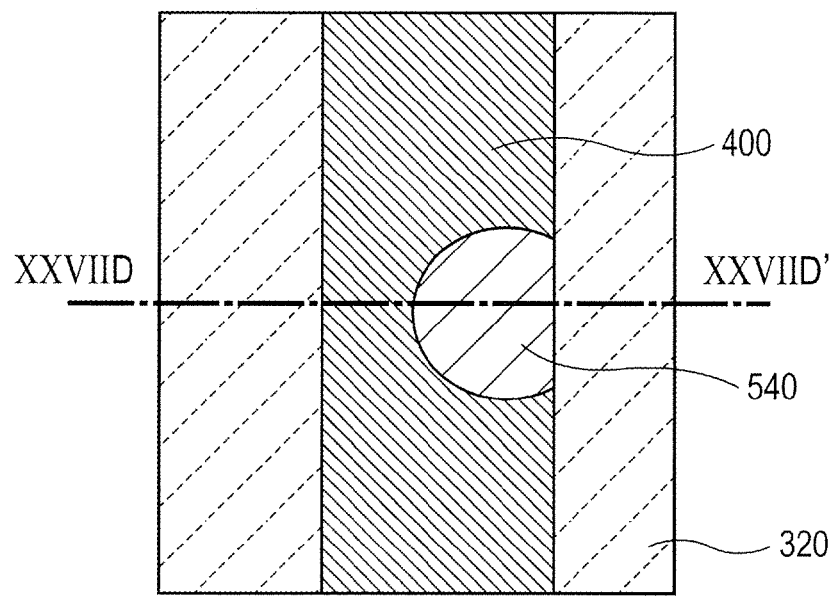
FIGS. 27A and 27B are each a view for illustrating a method for manufacturing the semiconductor device in accordance with the third embodiment.
Figure 27B:
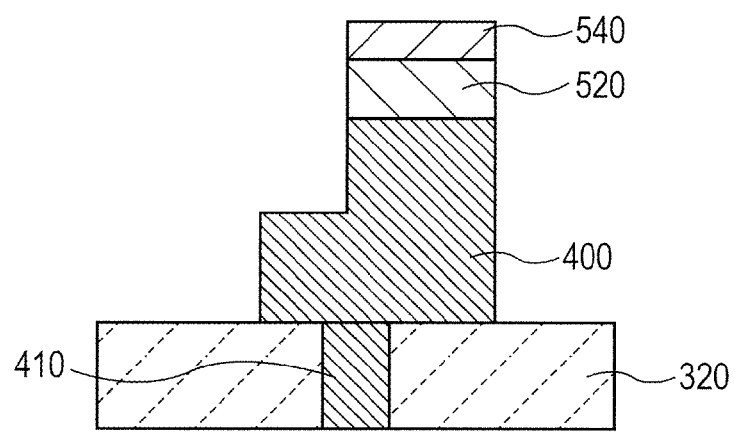

Then, as in FIGS. 27A and 27B, with the first via mask (the second mask layer 540) as a mask, the first mask layer 520 is etched by RIE.

Figure 28A:
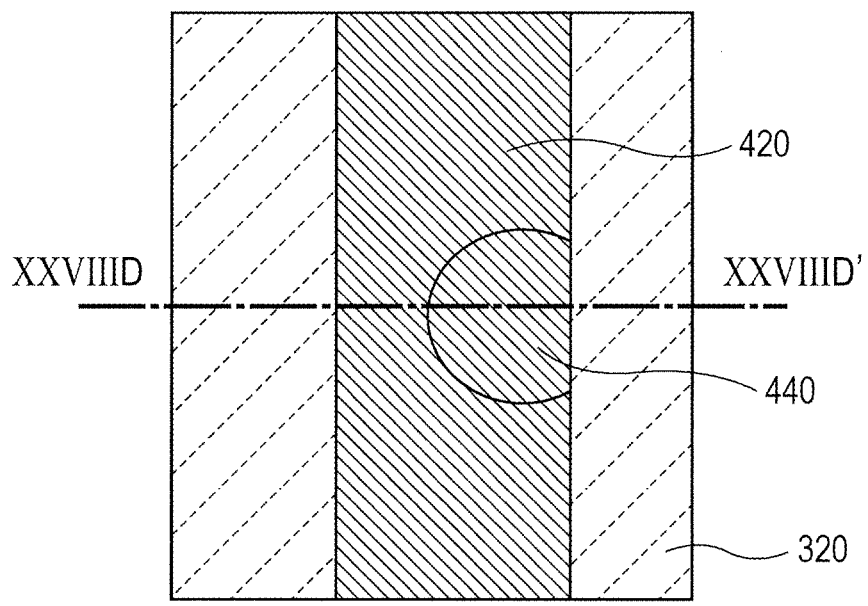
FIGS. 28A and 28B are each a view for illustrating a method for manufacturing the semiconductor device in accordance with the third embodiment.
Figure 28B:
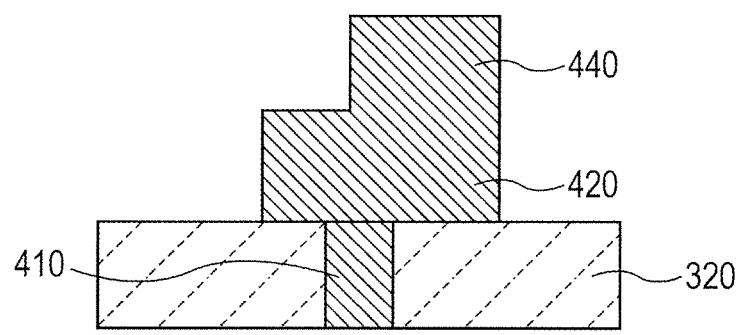

Then, as in FIGS. 28A and 28B, with the first via mask (the second mask layer 540), and the first mask layer 520 patterned into the same shape as that of the first via mask in plan view as a mask, the metal pattern is partially etched. Then, the first wiring mask (the first mask layer 520) and the first via mask (the second mask layer 540) are removed by plasma etching. In this manner, the first wiring 420 and the first via 440 are formed (up to this point, first via pattern formation step).

Then, as in FIGS. 29A and 29B, a first insulation layer 330 is formed in such a manner as to cover the patterned first wiring 420 and first via 440 (first insulation layer formation step). In the same manner as in the second embodiment, for example, as the first insulation layer 330, a porous MSQ film is formed by a coating method.

After the first insulation layer formation step, the top surface of the first insulation layer 330 is planarized by CMP (planarization step). As a result, the top surface of the first via 440 is exposed from the first insulation layer 330. In the second embodiment, the first wiring mask and the first via mask were removed, and the top surface of the first insulation layer 330 was planarized. However, as in this case, after previously removing the first wiring mask and the first via mask, the first insulation layer formation step and the planarization step may be performed.

The subsequent steps are the same as those in the first embodiment.

Then, the effects of the third embodiment will be described.

Herein, a consideration will be given again to the case where when a first via 440 is formed over a first wiring 420 by a damascene method, the position of the first via 440 is shifted outwardly from the first wiring 420 in plan view as a comparative example. When the distance between the adjacent two first wirings 420 is narrow, dielectric breakdown of the first insulation layer 330 may occur between the first via 440 shifted as described above, and the adjacent first wirings 420. Further, TDDB: Time Dependent Dielectric Breakdown may also become more likely to occur.

On the other hand, in accordance with the third embodiment, after forming a lower-layer first wiring mask as a hard mask layer, an upper-layer first via mask is formed. At this step, the upper-layer first via mask does not protrude outwardly from the lower-layer first wiring mask in plan view. Then, using the masks, there are formed the first wiring 420 and the first via 440. The semiconductor device 10 formed in this manner has the following configuration. A part of the side surface of the first via 440 is cut along a straight line of the portion of the first wiring 420 not overlapping with the first via 440 in plan view. Further, the side surface of the portion of the first wiring 420 overlapping with the first via 440 forms the same surface as the side surface of the first via 440 cut along the straight line, Namely, the first via 440 has no portion protruding toward the adjacent first wiring 420 in plan view. As a result, it is possible to obtain a fine-pitch wiring structure having a good inter-wiring breakdown voltage. Further, it is also possible to suppress the TDDB.

Then, a modified example of the third embodiment will be described by reference to FIGS. 30A and 30B and 31A and 31B. FIGS. 30A and 30B and 31A and 31B are each a view showing a modified example of the semiconductor device in accordance with the third embodiment 10. Each shows the state of the semiconductor device 10 subjected to the steps up to the first via pattern formation step. In this modified example, the photomask for use in the first via mask formation step has a first pattern for obtaining the first wiring 420, and a second pattern for obtaining the first via 440. Further, the width of the second pattern in the direction orthogonal to the direction of extension of the first wiring 420 is larger than that of the first pattern. Below, the details will be described.

Figure 30A:
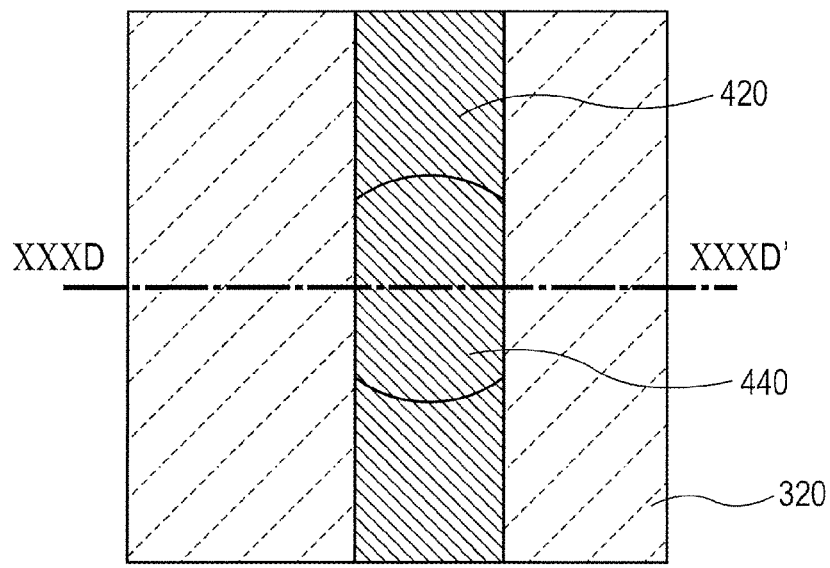
FIGS. 30A and 30B are each a view showing a modified example of the semiconductor device in accordance with the third embodiment.
Figure 30B:
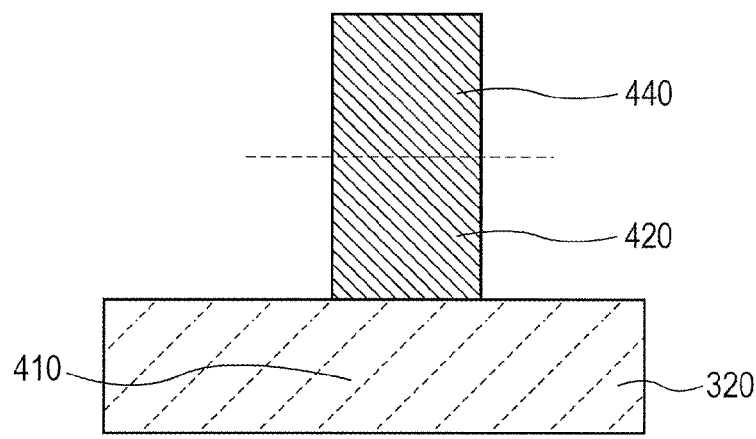

FIGS. 30A and 30B each show the case where the diameter of the first via mask is designed larger than the width of the first wiring 420 as a first modified example of the third embodiment. In the step of FIGS. 24A and 24B, there is used a photomask in which the width of the second pattern for obtaining the first via mask in the direction orthogonal to the extension of the first wiring 420 is wider than that of the first pattern. As a result, the diameter of the photoresist layer 730 for forming the first via mask is formed larger than the width of the first wiring 420. However, at this step, the second mask layer 540 is formed with the width of the first wiring 420 along with the first mask layer 520. For this reason, the first via mask is not formed protruding outwardly beyond the width of the first wiring mask.

As in FIG. 30A, a part of the side surface of the first via 440, and the side surface on the side thereof opposed to the part are cut along the straight line of the portion of the first wiring 420 not overlapping with the first via 440 in plan view.

Whereas, as in FIG. 30B, the two mutually opposing side surfaces of the portion of the first wiring 420 overlapping with the first via 440 form the same surfaces as the side surfaces of the first via 440 cut along the straight lines, respectively.

Figure 31A:
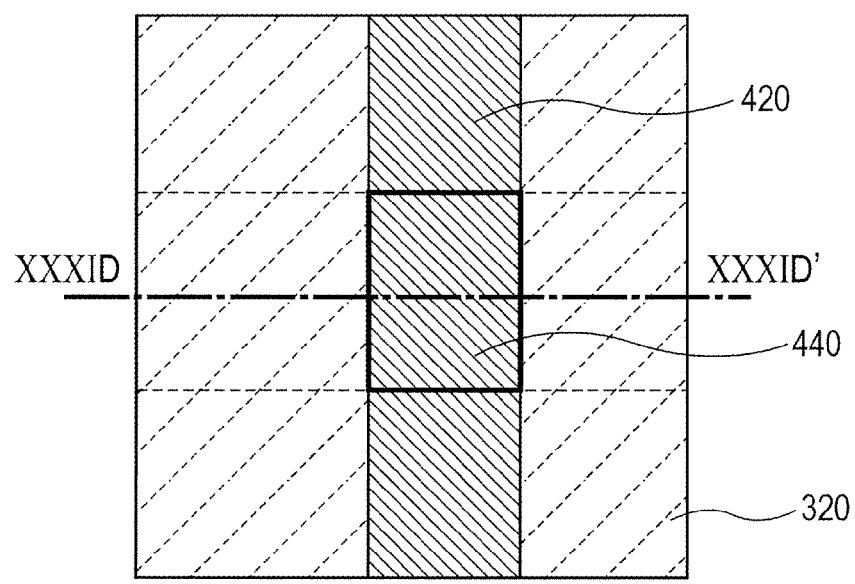
FIGS. 31A and 31B are each a view showing a modified example of the semiconductor device in accordance with the third embodiment.
Figure 31B:
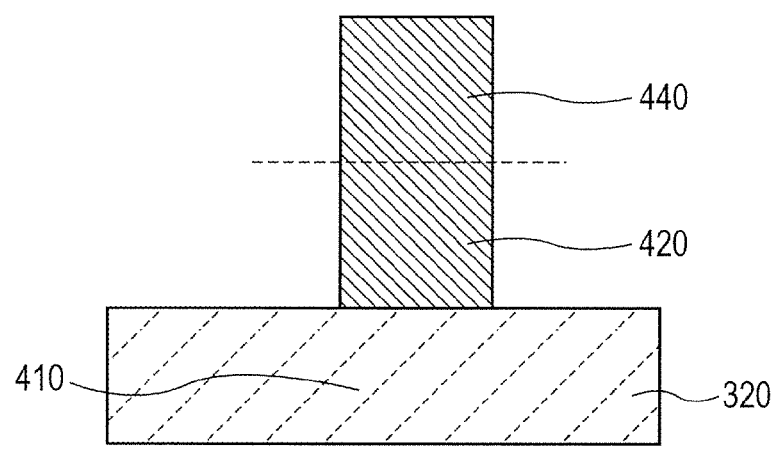

Further, FIGS. 31A and 31B each show the case where the first via mask has a striped shape in the direction orthogonal to the first wiring 420 as a second modified example of the third embodiment. In the step of FIGS. 24A and 24B, there is used a photomask in which the second pattern for obtaining the first via mask has a striped shape long in the direction orthogonal to the direction of extension of the first wiring 420. As a result, in the photoresist layer 730 for forming the first via mask, there is surely formed a portion overlapping with the first wiring 420 in plan view. Further, the width of the first via mask in the direction orthogonal to the direction of extension of the first wiring 420 can be formed equal to that of the first wiring 420.

Another feature of the second modified example of the third embodiment is the same as that of the first modified example, except that the shape of the first via 440 in plan view is a rectangular shape.

As described above, in accordance with the two modified examples of the third embodiment, there is used a photomask in which the width of the pattern for obtaining the first via mask in the direction orthogonal to the direction of extension of the first wiring 420 is larger than the width of the first wiring mask. As a result, even when misalignment occurs, it is possible to prevent a poor connection between the first wiring 420 and the first via 440. On the other hand, even when the first via mask is designed large, the shape of the first via 440 in plan view is formed so as to have the width of the first wiring 420 in a self-alignment manner. Therefore, as with the third embodiment, the inter-wiring breakdown voltage is good.

In the second embodiment and the third embodiment up to this point, a description was given to the method for etching the metal layer 400 to the lower-layer insulation layer 320 with the first wiring mask (the first mask layer 520) and the first via mask (the second mask layer 540) as a mask by RIE, for example, as in FIGS. 15A and 15B. On the other hand, as another method, the following method can also be considered. First, in a step of forming a metal pattern of the metal pattern formation steps, the metal layer 400 is partially etched, thereby to form a metal pattern at the top part of the metal layer 400, and the bottom part of the metal layer 400 is left. Then, in the first via pattern formation step, the first via 440 is formed, and the bottom part of the metal layer 400 is etched, thereby to form the first wiring 420. In this manner, in the first via pattern formation step, the lower-layer insulation layer 320 is exposed for the first time. This can reduce the time during which the lower-layer insulation layer 320, or the first insulation layer 330 situated on the lower side is exposed by etching of the metal layer 400. Namely, it is possible to suppress unexpected etching or deterioration of the lower-layer insulation layer 320, or the first insulation layer 330 situated on the lower side.

Fourth Embodiment

FIGS. 32 to 40 are each a cross-sectional view for illustrating a method for manufacturing a semiconductor device 10 in accordance with fourth embodiment. FIGS. 32 to 40 each show a part of the semiconductor device 10 in accordance with the fourth embodiment. The fourth embodiment is equal to the first embodiment, except that the first wiring 420 or the first via 440 includes a protective metal layer 460 or an etching stopper layer 480 (first etching stopper layer). Below, the details will be described.

First, a description will be started from the configuration of the semiconductor device 10 in accordance with the fourth embodiment.

Figure 40:
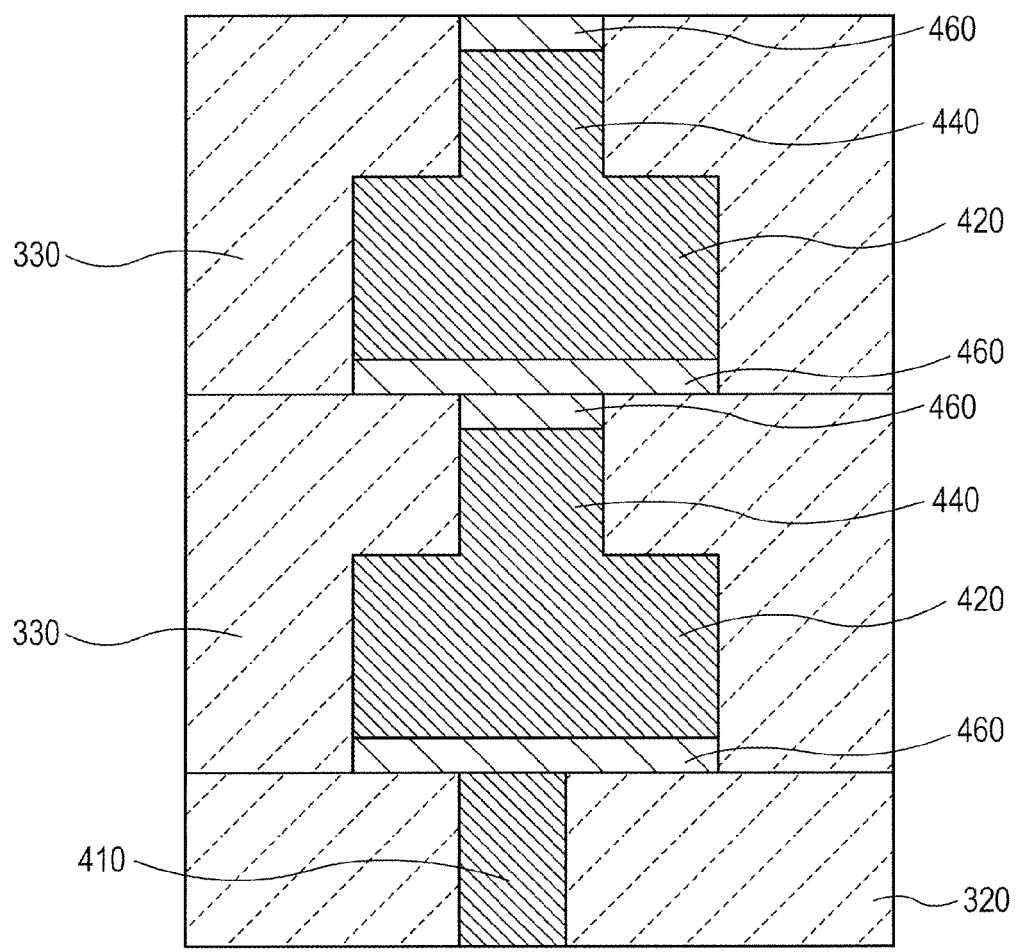
FIG. 40 is a cross-sectional view for illustrating a method for manufacturing the semiconductor device in accordance with the fourth embodiment.

Herein, as in FIG. 40, at the bottom part of the first wiring 420, there is disposed the protective metal layer 460 for protecting the first wiring 420. The first wiring 420 is coupled to the contact plug 410 formed in the lower-layer insulation layer 320 via the protective metal layer 460. Further, at the top part of the first via 440, there is disposed the protective metal layer 460 for protecting the first via 440. However, at the side surfaces of the first wiring 420 and the first via 440, there is not formed the protective metal layer 460. For this reason, in the first wiring 420 and the first via 440, crystal grains in the plane direction are large as with the first embodiment.

For the protective metal layer 460, there is used a material better in adhesion to the first insulation layer 330 than the metal for use in the first wiring 420 and the first via 440. As a result, it is possible to couple the first wiring 420 and the lower-layer-side via (not shown) and the like with stability. Further, the protective metal layer 460 is preferably a material having a higher process resistance than that of the metal for use in the first wiring 420 and the first via 440. Specifically, the material of the protective metal layer 460 is TiN, TaN, WN, RuN, Ti, Ru, or the like. As a result, it is possible to suppress the deterioration of the first via 440 and the like situated below the protective metal layer 460 in the step of planarizing the first wiring layer 30.

Further, as in FIG. 40, a plurality of first wiring layers 30 are stacked. The first via 440 of the first wiring layer 30 situated on the lower side is coupled to the first wiring 420 situated on the upper side via the protective metal layer 460 formed at the top part of the first via 440, and the protective metal layer 460 formed at the lower part of the first wiring 420 of the first wiring layer 30 situated on the upper side.

Then, a description will be given to a method for manufacturing the semiconductor device 10 in accordance with the fourth embodiment. The fourth embodiment is equal to the first embodiment, except that a protective metal layer 460 or an etching stopper layer 480 is formed at the position of the boundary of any of the first wiring 420 or the first via 440.

First, in the same manner as in the first embodiment, the semiconductor element 20 is formed at the semiconductor substrate 100. Then, the contact plug 410 is formed in the lower-layer insulation layer 320.

Figure 32:
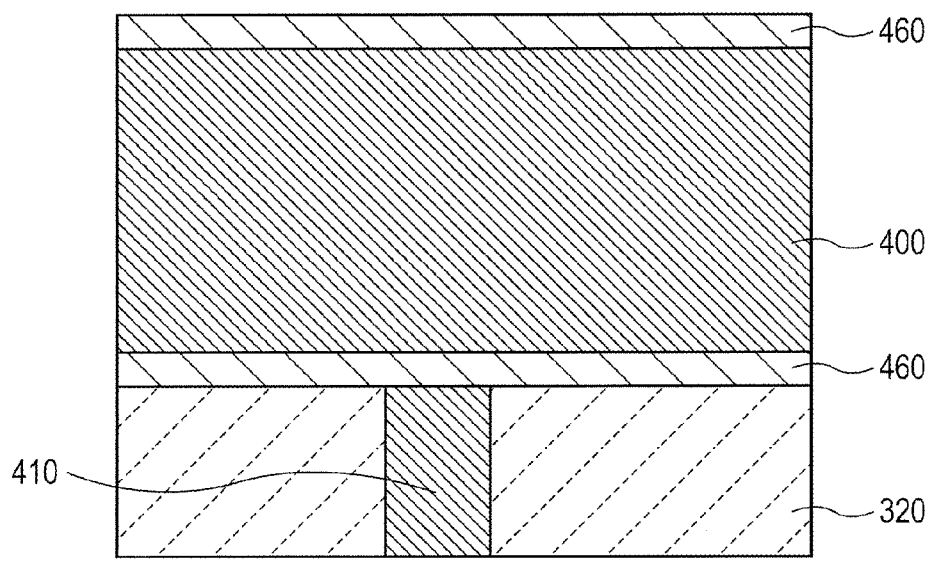
FIG. 32 is a cross-sectional view for illustrating a method for manufacturing a semiconductor device in accordance with a fourth embodiment.

Then, as in FIG. 32, entirely over the lower-layer insulation layer 320, a protective metal layer 460 is formed by sputtering. As the protective metal layer 460, for example, TiN is deposited by sputtering. Then, over the protective metal layer 460, a metal layer 400 is formed by sputtering. As the metal layer 400, for example, W is deposited by sputtering. Then, over the metal layer 400, there is formed the protective metal layer 460. As the protective metal layer 460, there can be used the same material as that of the lower-layer-side protective metal layer 460.

Figure 33:
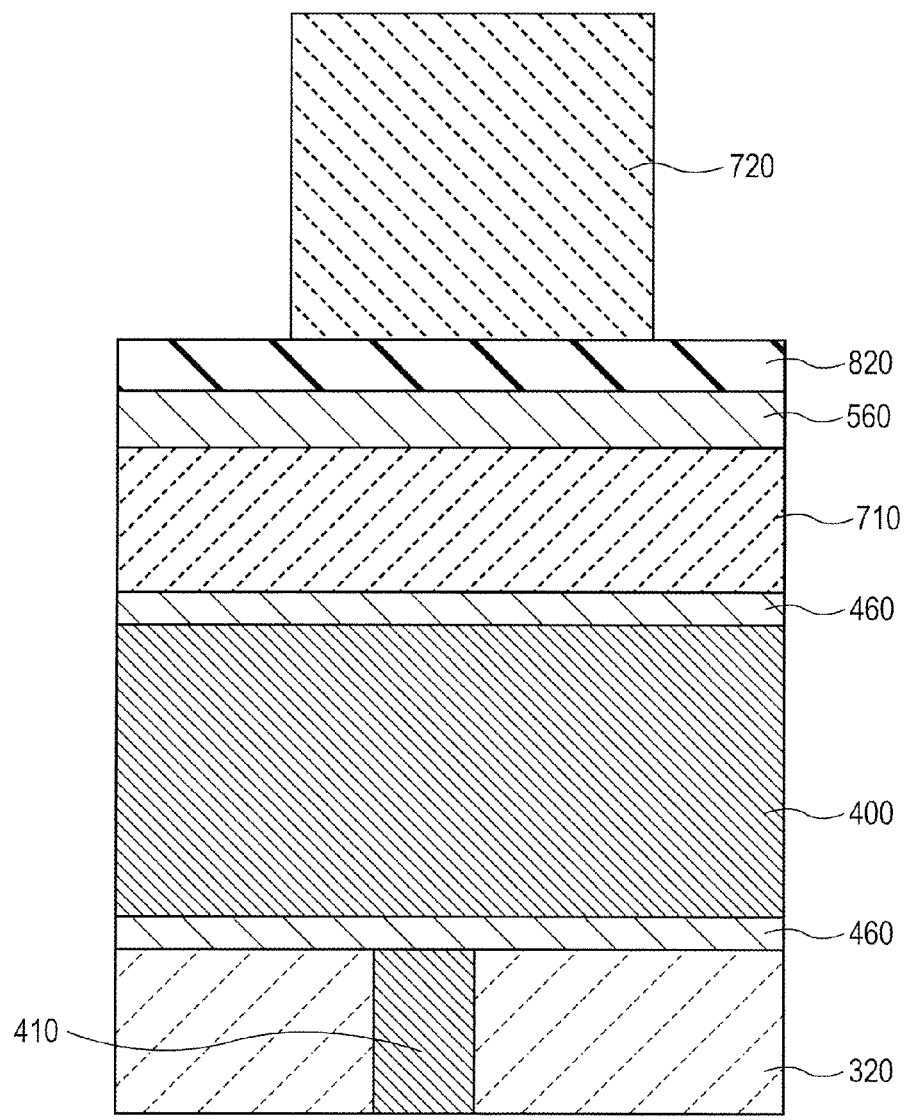
FIG. 33 is a cross-sectional view for illustrating a method for manufacturing the semiconductor device in accordance with the fourth embodiment.

Then, as in FIG. 33, over the protective metal layer 460, there is formed a first photoresist layer 710. Then, a hard mask layer 560 is formed by plasma CVD. As the hard mask layer 560, for example, SiO$_2$ formed at low temperatures is deposited by plasma CVD. Then, over the hard mask layer 560, there is formed an antireflection layer 820. Then, over the antireflection layer 820, there is formed a second photoresist layer 720. Then, by exposure and development, the second photoresist layer 720 is patterned into the shape of the first wiring 420 in plan view.

Figure 34:
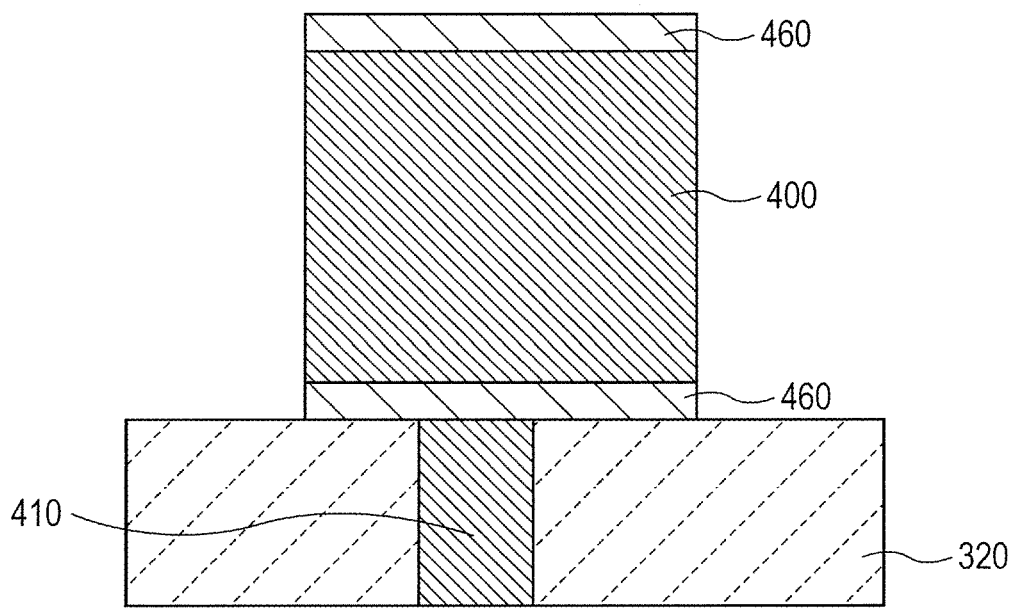
FIG. 34 is a cross-sectional view for illustrating a method for manufacturing the semiconductor device in accordance with the fourth embodiment.

Then, as in FIG. 34, with the second photoresist layer 720 as a mask, by RIE, together with the antireflection layer 820, the hard mask layer 560, and the first photoresist layer 710, there are etched the protective metal layer 460 and the metal layer 400. This results in the formation of a metal pattern having the shape of the first wiring 420.

Figure 35:
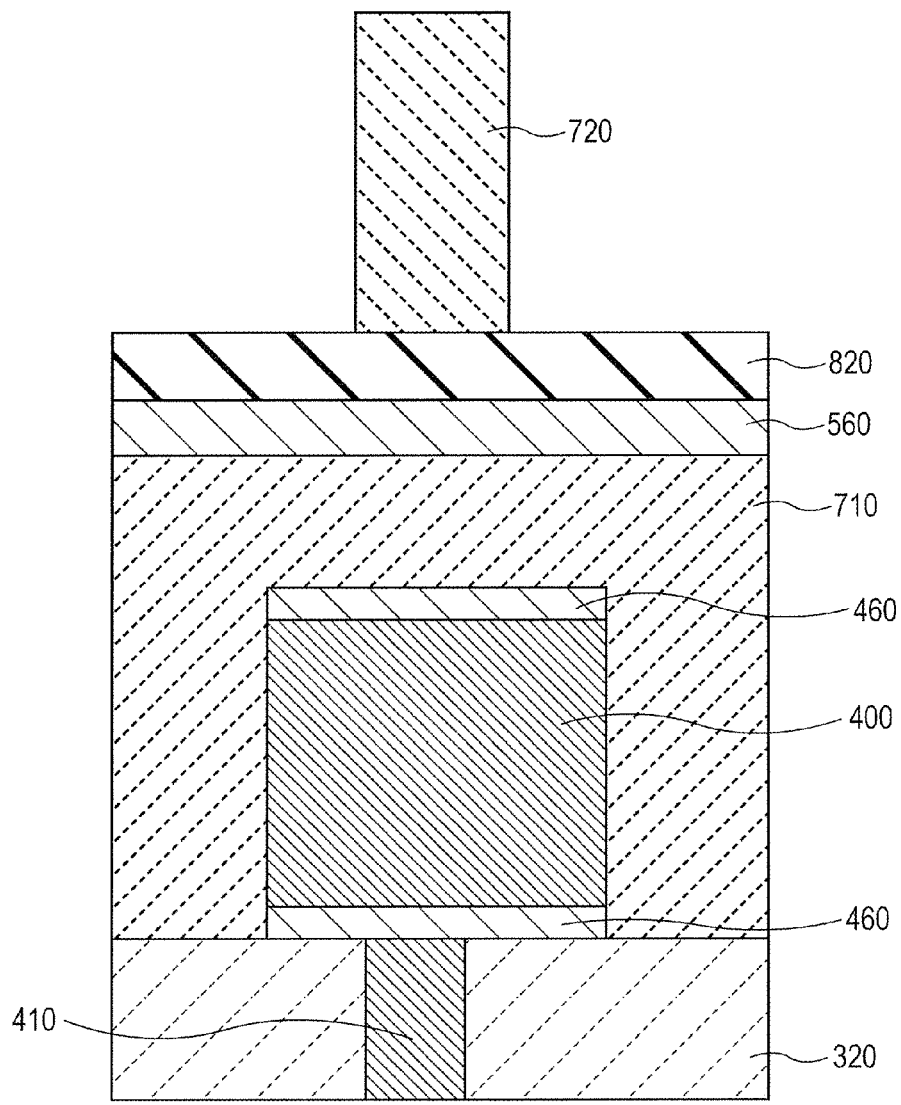
FIG. 35 is a cross-sectional view for illustrating a method for manufacturing the semiconductor device in accordance with the fourth embodiment.

Then, as in FIG. 35, over the metal pattern having the shape of the first wiring 420 in plan view, there are formed the first photoresist layer 710, the hard mask layer 560, the antireflection layer 820, and the second photoresist layer 720. Then, by exposure and development, the second photoresist layer 720 is patterned into the shape of the first via 440 in plan view.

Figure 36:
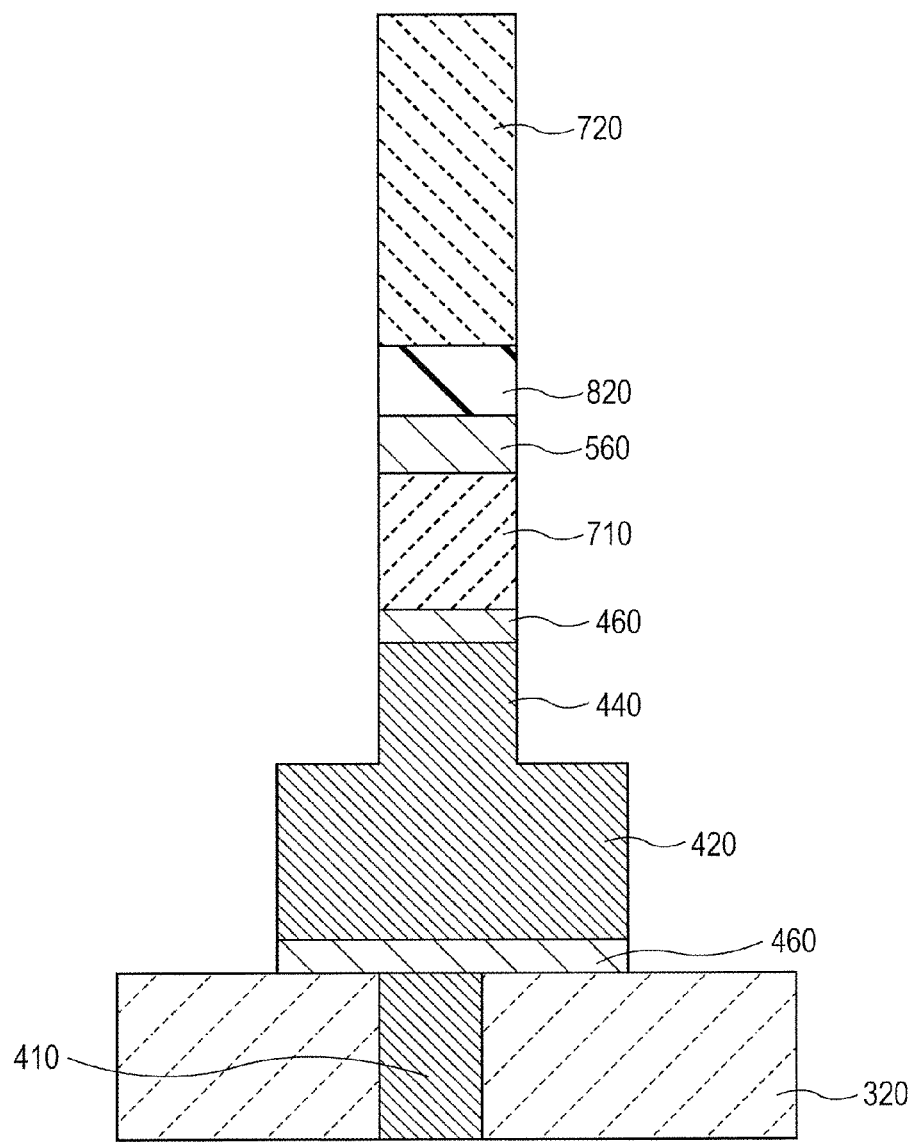
FIG. 36 is a cross-sectional view for illustrating a method for manufacturing the semiconductor device in accordance with the fourth embodiment.

Then, as in FIG. 36, with the second photoresist layer 720 as a mask, the metal pattern is partially etched together with the antireflection layer 820, the hard mask layer 560, and the first photoresist layer 710 by RIE. At this step, the part from the upper-layer-side protective metal layer 460 to the middle of the metal layer 400 is etched. This results in the formation of the first wiring 420 and the first via 440.

Figure 37:
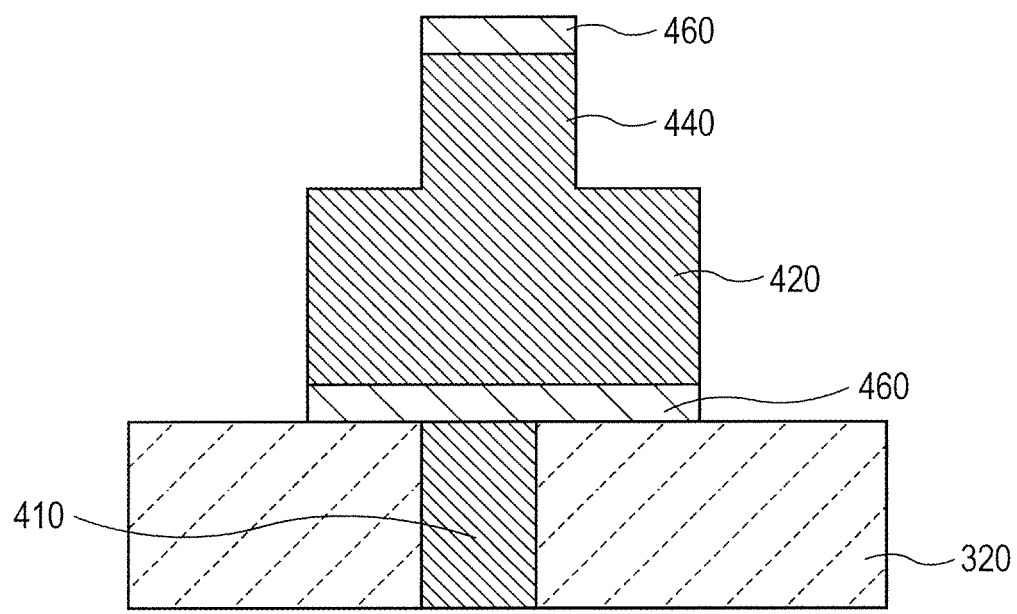
FIG. 37 is a cross-sectional view for illustrating a method for manufacturing the semiconductor device in accordance with the fourth embodiment.

Then, as in FIG. 37, the first photoresist layer 710, the hard mask layer 560, the antireflection layer 820, and the second photoresist layer 720 are removed by plasma ashing. At this step, the top surface of the metal layer 400 is protected by the protective metal layer 460. This prevents the top surface of the metal layer 400 from being oxidized by plasma ashing.

Figure 38:
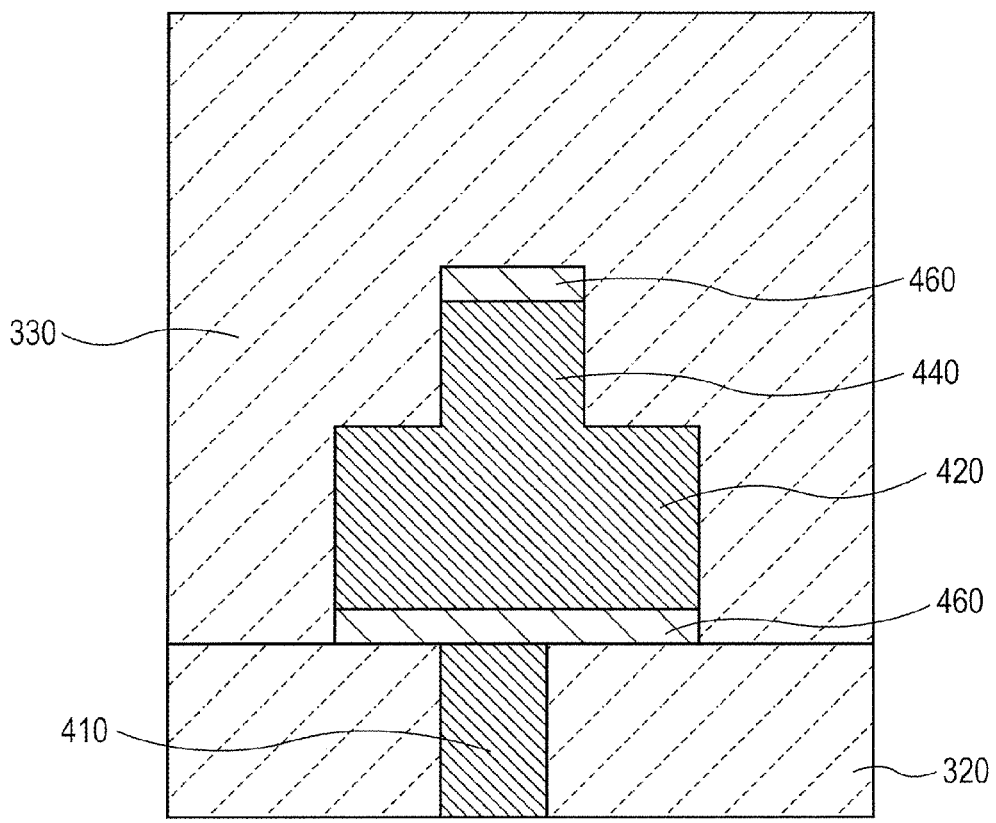
FIG. 38 is a cross-sectional view for illustrating a method for manufacturing the semiconductor device in accordance with the fourth embodiment.

Then, as in FIG. 38, a first insulation layer 330 is formed in such a manner as to cover the patterned lower-layer protective metal layer 460, first wiring 420, first via 440, and upper-layer protective metal layer 460. As the first insulation layer 330, for example, a porous MSQ is deposited by a coating method.

Figure 39:
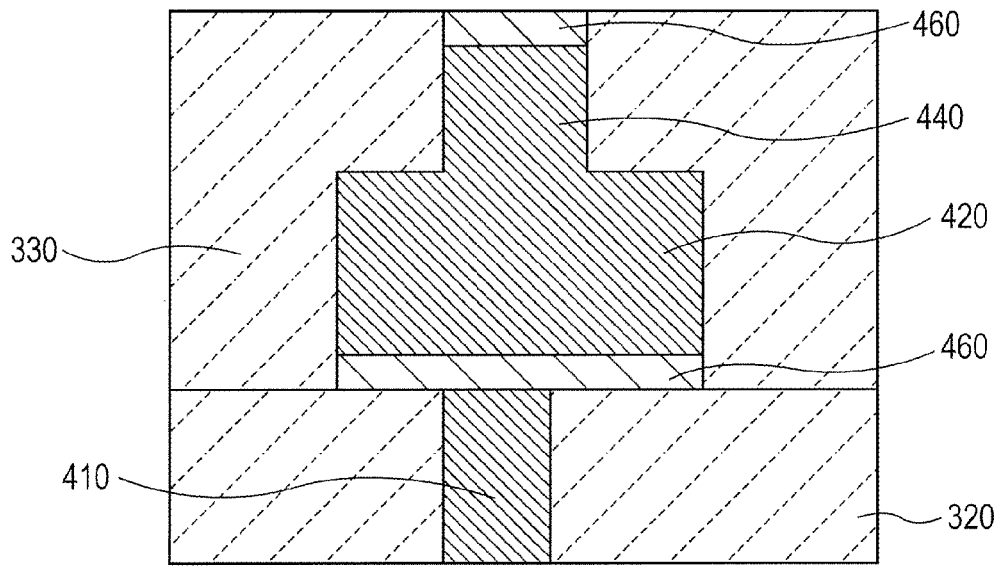
FIG. 39 is a cross-sectional view for illustrating a method for manufacturing the semiconductor device in accordance with the fourth embodiment.

Then, as in FIG. 39, the top surface of the first insulation layer 330 is planarized by CMP. As a result, the top surface of the first via 440, namely, the top surface of the protective metal layer 460 is exposed from the first insulation layer 330. Alternatively, the following is also acceptable: CMP is carried out partway, and etching back is performed by dry etching.

Then, as in FIG. 40, by the same procedure as described above, over the first wiring layer 30 situated on the lower side, there is formed a first wiring layer 30 having the same protective metal layer 460. At this step, the first via 440 of the first wiring layer 30 situated on the lower side is formed so as to be coupled to the first wiring 420 of the first wiring layer 30 situated on the upper side. Further, the lower-side first via 440 is coupled to the first wiring 420 situated on the upper side via the protective metal layer 460 formed at the top part of the first via 440, and the protective metal layer 460 formed at the lower part of the upper-side first wiring 420.

The steps up to this point are the same as those in the first embodiment.

Then, the effects of the fourth embodiment will be described. In accordance with the fourth embodiment, the first wiring 420 or the first via 440 includes the protective metal layer 460 or the etching stopper layer 480. In the semiconductor device 10 shown in FIG. 40, the protective metal layers 460 are disposed at the bottom part of the first wiring 420, and the top part of the first via 440, respectively. This can improve the adhesion to the first wiring layer 30 situated on the lower side or on the upper side. Further, at the top part of the first via 440, there is formed the protective metal layer 460. As a result, it is possible to suppress the deterioration of the first via 440 and the like situated below the protective metal layer 460 in the step of planarizing the top surface of the first insulation layer 330 by CMP. Whereas, at the top part of the first via 440, there is formed the protective metal layer 460. As a result, it is possible to suppress the oxidation of the first via 440 and the like situated below the protective metal layer 460 in the step of subjecting the second photoresist layer 720 and the like to plasma asking.

Then, a modified example of the fourth embodiment will be described by reference to FIGS. 41A to 41D to 43. FIGS. 41A to 41D to 43 are each a view showing a modified example of the semiconductor device 10 in accordance with the fourth embodiment. Respective modified examples are different in position at which the protective metal layer 460 or the etching stopper layer 480 is formed in the first wiring 420 or the first via 440. Below, the details will be described.

Figure 41A:
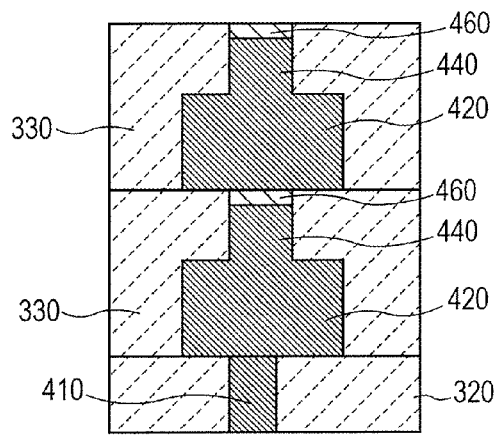
FIGS. 41A to 41D are each a cross-sectional view of a modified example of the semiconductor device in accordance with the fourth embodiment.

In the case of FIG. 41A, only at the top part of the first via 440, there is formed the protective metal layer 460. As a result, it is possible to obtain the same effects as those of the fourth embodiment. In this manner, any one of the top part of the first via 440 situated on the lower side, or the bottom part of the first wiring 420 situated on the upper side has the protective metal layer 460. This can improve the adhesion therebetween.

Figure 41B:
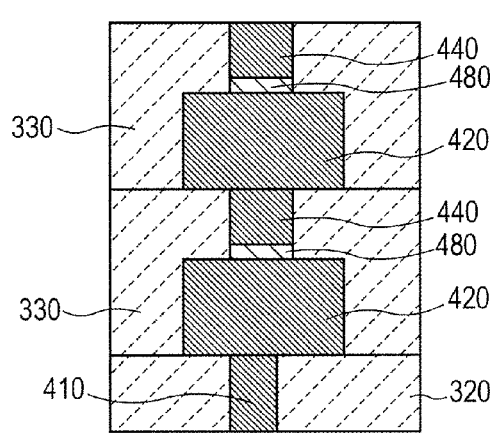

In the case of FIG. 41B, the bottom part of the first via 440 includes an etching stopper layer 480 made of a conductive material (first etching stopper layer). This case is, in a broad sense, equal to the configuration in which the etching stopper layer 480 is disposed at the portion of the top part of the first wiring 420 overlapping with at least the first via 440 in plan view. The etching stopper layer 480 is formed of a different material from the material for forming the first wiring 420 or the first via 440. The etching stopper layer 480 is formed of a material slower in etching rate than the metal layer in the step of etching the metal layer 400. Specifically, the same materials as those for the protective metal layer 460 can be used.

In order to obtain the shape as in FIG. 41B, the formation is achieved in the following manner. First, the etching stopper layer 480 is formed at the portion of the top part of the first wiring 420 overlapping with at least the first via 440 in plan view of the metal layer 400. Then, there is formed a metal pattern having a pattern along the first wiring 420. Then, in the first via pattern formation step, the metal pattern is etched to the etching stopper layer 480. Then, the etching stopper layer 480 is etched. This results in the formation of the first via 440 having the etching stopper layer 480 at the bottom part of the first via 440 (the top part of the first wiring 420). The subsequent steps are the same as those of the fourth embodiment.

In accordance with the modified example of FIG. 41B, in the first via pattern formation step, the position of the etching stopper layer 480 determines the position of the bottom part of the first via 440. As compared with the case where control is achieved by the etching time, the first via 440 can be formed with stability.

Figure 41C:
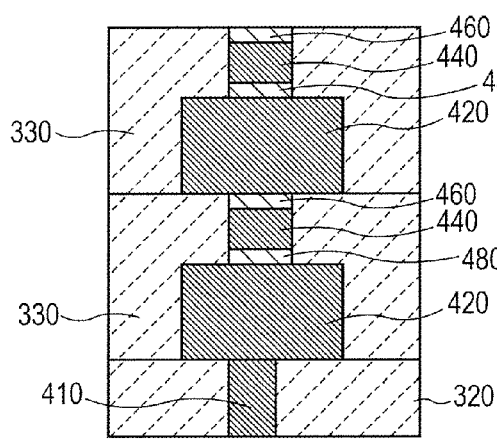

In the case of FIG. 41C, the etching stopper layer 480 is formed at the bottom part of the first via 440, and the protective metal layer 460 is disposed at the top part of the first via 440. Also in this case, it is possible to obtain the same effects as those of the fourth embodiment and FIG. 41B.

Figure 41D:
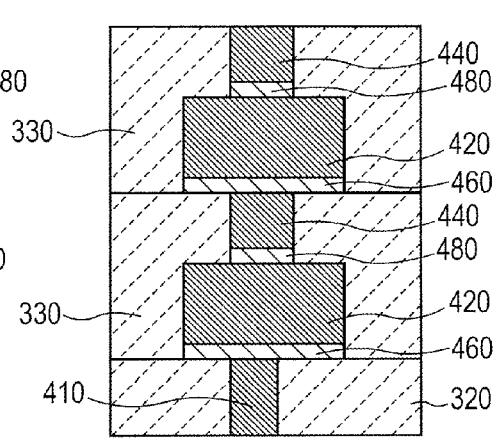

In the case of FIG. 41D, the protective metal layer 460 is disposed at the bottom part of the first wiring 420, and the etching stopper layer 480 is disposed at the bottom part of the first via 440. Also in this case, it is possible to obtain the same effects as those of the fourth embodiment and FIG. 41B.

Figure 42A:
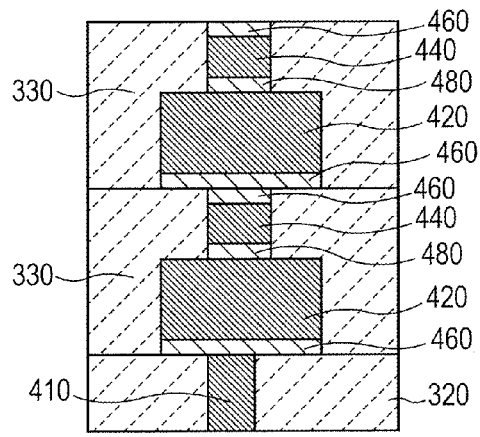
FIGS. 42A to 42D are each a cross-sectional view of a modified example of the semiconductor device in accordance with the fourth embodiment.

In the case of FIG. 42A, the configuration is equal to the configuration of FIG. 41C, except that the protective metal layer 460 is disposed at the bottom part of the first wiring 420. Also in this case, it is possible to obtain the same effects as those of the fourth embodiment and FIG. 41B.

Figure 42B:
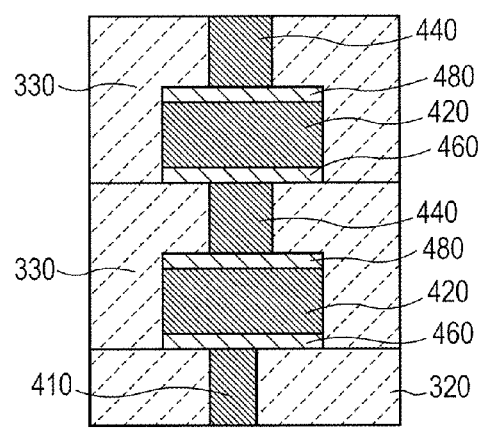

In the case of FIG. 42B, the protective metal layer 460 is disposed at the bottom part of the first wiring 420. In addition, the etching stopper layer 480 is disposed in a region of the top part of the first wiring 420 overlapping with the first wiring 420 in plan view. The case of FIG. 42B is different from the case of FIG. 41B in that the etching stopper layer 480 is formed in a region overlapping with the first wiring 420 in plan view. Also in this case, it is possible to obtain the same effects as those of the fourth embodiment and FIG. 41B.

Figure 42C:
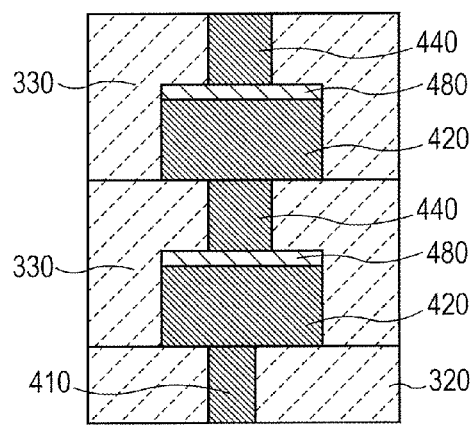

In the case of FIG. 42C, the etching stopper layer 480 is disposed in the region of the top part of the first wiring 420 overlapping with the first wiring 420 in plan view. Also in this case, it is possible to obtain the same effects as those of the fourth embodiment and FIG. 41B.

Figure 42D:
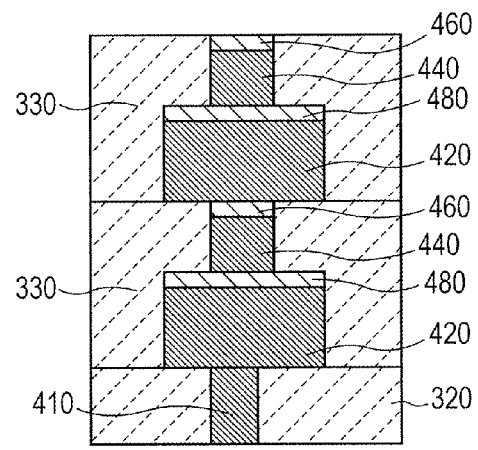

In the case of FIG. 42D, the etching stopper layer 480 is disposed in the region of the top part of the first wiring 420 overlapping with the first wiring 420 in plan view. In addition, the protective metal layer 460 is disposed at the top part of the first via 440. Also in this case, it is possible to obtain the same effects as those of the fourth embodiment and FIG. 41B.

Figure 43:
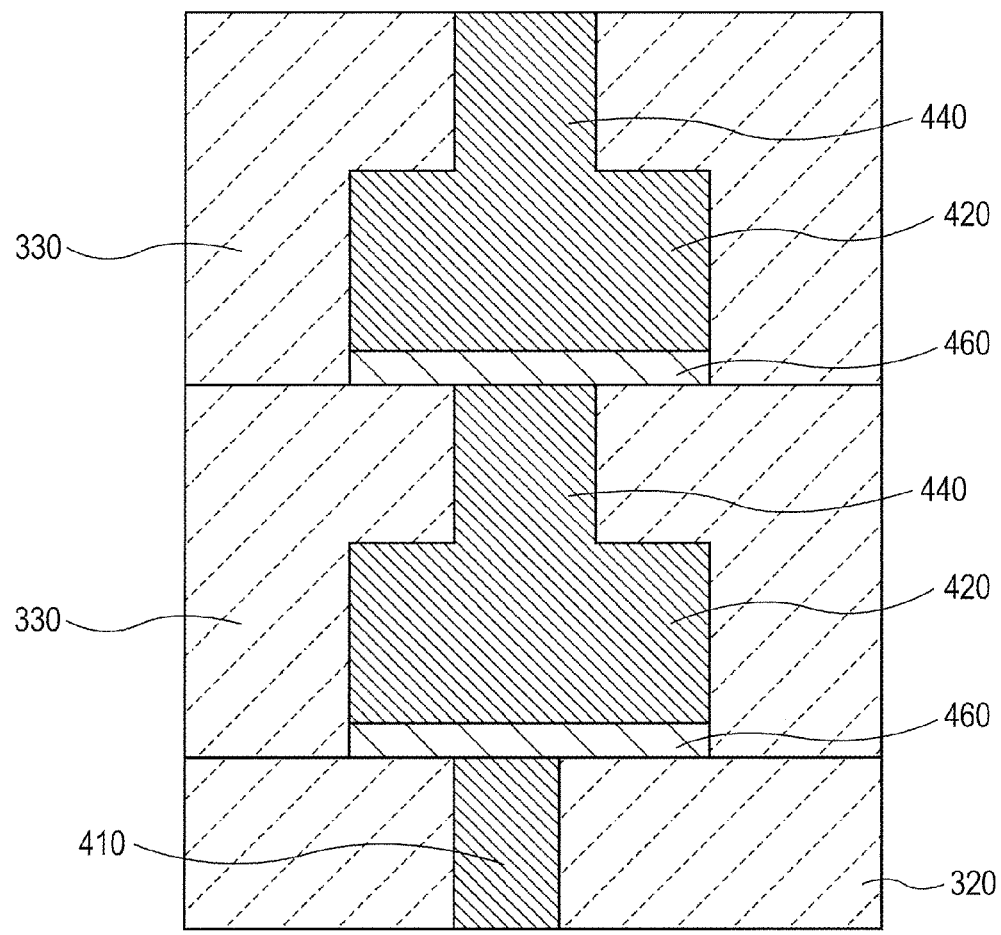
FIG. 43 is a cross-sectional view of a modified example of the semiconductor device in accordance with the fourth embodiment.

In the case of FIG. 43, the protective metal layer 460 is disposed only at the bottom part of the first wiring 420. Also in this case, it is possible to obtain the same effects as those of the fourth embodiment. The first wiring 420 can be coupled with the via (such as the contact plug 410) situated on the lower side via the protective metal layer 460.

Up to this point, in the fourth embodiment, a description was given to the case where the first wiring 420 and the first via 440 are formed of the same metal. However, when the etching stopper layer 480 is disposed, the first wiring 420 and the first via 440 may be formed of different metals. However, at least the first via 440 is preferably formed of a material having an etching selectivity with respect to the etching stopper layer 480.

Up to this point, in the fourth embodiment, a description was given to the case where the protective metal layer 460 or the etching stopper layer 480 is formed of the same metal. However, when a plurality of protective metal layers 460 or etching stopper layers 480 are formed, respective layers may be formed of different metals.

Fifth Embodiment

Figure 44:
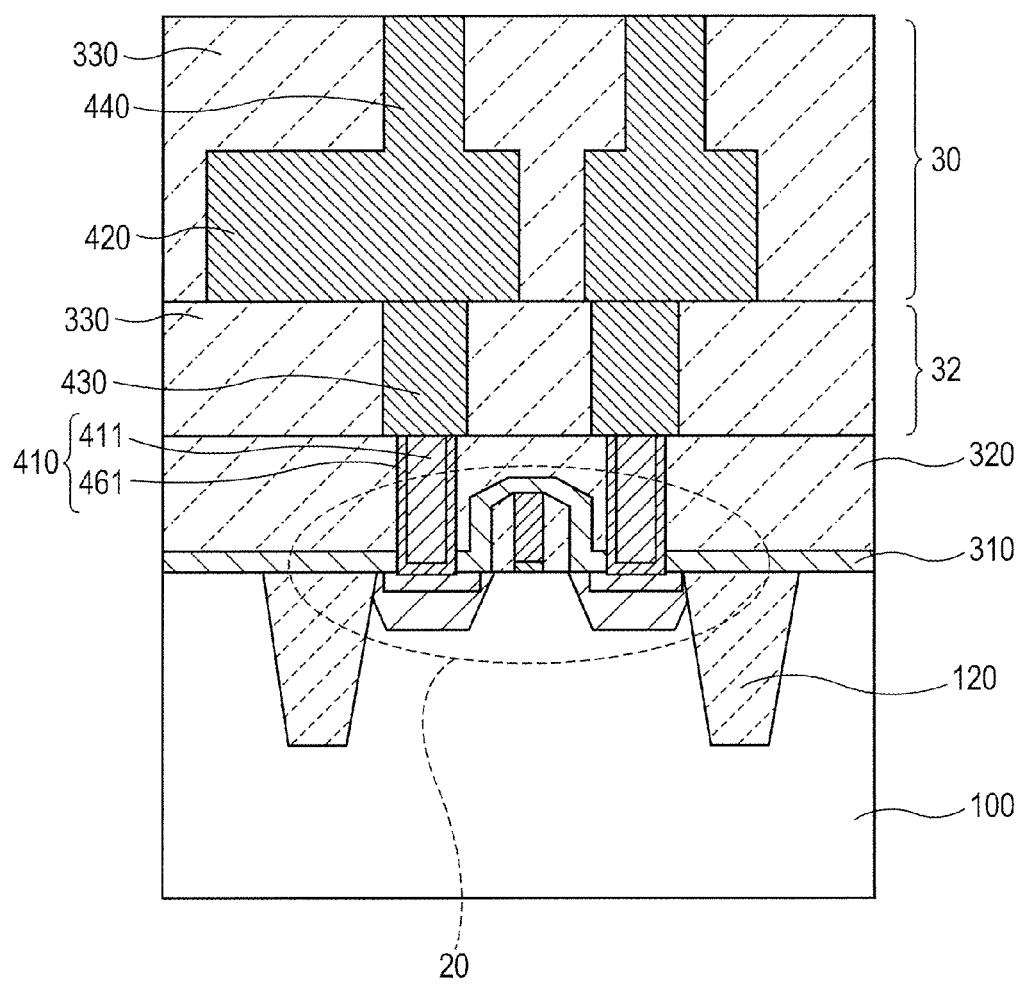
FIG. 44 is a cross-sectional view showing a configuration of a semiconductor device in accordance with a fifth embodiment.

FIG. 44 is a cross-sectional view showing the configuration of a semiconductor device 10 in accordance with a fifth embodiment. The fifth embodiment is equal to the first embodiment, except for the following points. A contact plug 410 is coupled to the top of the semiconductor substrate 100. A lower-layer via formation layer 32 is situated over the contact plug 410, and below the first insulation layer 330 including the first wiring 420 disposed therein. Further, the lower-layer via formation layer 32 includes a lower-layer via 430 coupled to the top of the contact plug 410, and a first insulation layer 330 in contact with the side surface of the lower-layer via 430. Further, at least a part of the side surface of the lower-layer via 430 cuts off the metal crystal grains. Below, the details will be described.

As in FIG. 44, at the semiconductor substrate 100, there is disposed the semiconductor element 20. Over the semiconductor substrate 100, there is disposed the lower-layer insulation layer 320. In each opening disposed in the lower-layer insulation layer 320 and the liner insulation layer 310, there is disposed a contact plug 410. The contact plug 410 is coupled to the source region 210 or the drain region 220, or the like at the opening. The contact plug 410 includes a barrier metal layer 461 disposed at the bottom part and the side surface of the contact plug 410, and a metal 411 such as W. Incidentally, the barrier metal layer 461 is formed of the same material as that of the protective metal layer 460 or the etching stopper layer 480. Whereas, the metal 411 such as W is formed by CVD.

Over the semiconductor substrate 100, there is disposed the lower-layer via formation layer 32. The lower-layer via formation layer 32 includes the lower-layer via 430 and the first insulation layer 330. The lower-layer via formation layer 32 is formed in the same manner as the first wiring layer 30, except for not including the first wiring 420. Further, the lower-layer via 430 is coupled to the contact plug 410 at the top of the contact plug 410. Whereas, the first insulation layer 330 of the lower-layer via formation layer 32 is in contact with the side surface of the lower-layer via 430. Incidentally, the first insulation layer 330 of the lower-layer via formation layer 32 may be formed of a different material from that of the first insulation layer 330 of the first wiring layer 30.

At least a part of the side surface of the lower-layer via 430 cuts off the metal crystal grains. Preferably, the entire circumference of the side surface of the lower-layer via 430 cuts off the metal crystal grains. In other words, in the side surface of the lower-layer via 430, there are formed the cut surfaces of at least one or more metal crystal grains. Preferably, at the whole side surface of the side surface of the lower-layer via 430, there are formed the cut surfaces of at least one or more metal crystal grains. With such a structure, even when the lower-layer via 430 is miniaturized, the resistance of the lower-layer via 430 can be reduced.

Herein, when the width of the contact plug 410 is small, the occupying proportion of the barrier metal layer 461 high in resistance is high. For this reason, the smaller the width of the contact plug 410 is, the higher the resistance of the contact plug 410 is. As described above, by disposing the low-resistance lower-layer via 430 over the contact plug 410, it is possible to reduce the resistance as the whole of the contact plug 410 and the lower-layer via 430.

Further, for achieving a lower resistance, preferably, the contact plug 410 is as short as possible, and the lower-layer via 430 is longer than the contact plug 410. The contact plug 410 preferably has a length equal to or longer than the minimum length necessary for establishing a coupling to the semiconductor element 20, and is as short as possible. The wording "the minimum length necessary for establishing a coupling to the semiconductor element 20" herein used denotes the minimum length necessary for the contact plug 410 disposed over the gate electrode 240 to be coupled to the upper-layer lower-layer via 430. Further, the thickness of the lower-layer insulation layer 320 is preferably small so long as the contact plug 410 has the minimum length necessary for establishing a coupling to the semiconductor element 20.

Whereas, in the lower-layer via 430, there is formed a portion overlapping with the contact plug 410 in plan view. The cross section of the lower-layer via 430 may be wider than the cross section of the contact plug 410 in plan view. The cross section of the lower-layer via 430 is larger than the cross section of the contact plug 410 by the alignment margin for exposure and development, or larger in plan view. As a result, the lower-layer via 430 can be coupled to the contact plug 410 with reliability.

The lower-layer via formation layer 32 is situated below the first insulation layer 330 including the first wiring 420 disposed therein. Namely, over the lower-layer via formation layer 32, the first wiring layer 30 is formed in the same manner as in the first embodiment. In the first wiring layer 30, there are disposed the first wiring 420 and the first via 440. The bottom surface of the first wiring 420 is in contact with the top surface of the lower-layer via 430. The top surface of the first wiring 420 is in contact with the bottom surface of the first via 440. The first insulation layer 330 is in contact with at least the top surface of the first wiring 420 and the side surface of the first via 440. Whereas, at least a part of each side surface of the first wiring 420 and the first via 440 cuts off the metal crystal grains.

Alternatively, over and/or under the lower-layer via 430, there may be formed a protective metal layer (not shown). The material for the protective metal layer is, for example, TiN, TaN, WN, RuN, Ti, or Ru. Inclusion of the protective metal layer can implement the improvement of the adhesion or the stabilization of the contact resistance between the lower-layer via 430 and the contact plug 410, or between the lower-layer via 430 and the first wiring 420.

Then, a description will be given to a method for manufacturing the semiconductor device 10 in accordance with the fifth embodiment.

First, in the same manner as in the first embodiment, at the semiconductor substrate 100, there is formed the semiconductor element 20. Then, over the liner insulation layer 310, the lower-layer insulation layer 320 is formed by CVD. Then, the tops of the gate electrode 240, the source region 210, the drain region 220, and the like of the lower-layer insulation layer 320 and the liner insulation layer 310 are etched, thereby to form contact holes (not shown). Then, over the contact holes and the lower-layer insulation layer 320, a barrier metal layer 461 is formed. Then, by CVD, a metal 411 such as W is embedded in the contact holes. Then, by CMP, the top surface of the lower-layer insulation layer 320 is planarized. As a result, the contact plugs 410 are formed in the lower-layer insulation layer 320.

Then, over the planarized lower-layer insulation layer 320, the metal layer 400 is formed by sputtering. This can form the metal layer 400 with large crystal grains. Then, over the metal layer 400, there is formed a multilayer mask such as a photoresist layer (not shown). Then, by exposure and development, the multilayer mask is patterned into the shape of the lower-layer via 430 in plan view. Then, with the multilayer mask as a mask, the metal layer 400 is patterned. In this manner, the lower-layer via 430 is formed. As a result, it is possible to miniaturize the shape of the lower-layer via 430 while keeping the crystal grains of the metal layer 400 large. Then, the multilayer mask is removed by plasma ashing.

Then, the first insulation layer 330 is formed in such a manner as to cover the lower-layer via 430. Then, the top surface of the first insulation layer 330 is planarized by CMP. As a result, the top surface of the lower-layer via 430 is exposed from the first insulation layer 330.

Then, the first wiring layer 30 is formed in the same manner as in the first embodiment. In the manner described up to this point, the semiconductor device 10 of the fifth embodiment is obtained.

In accordance with the fifth embodiment, the top of the contact plug 410 is in contact with the lower-layer via 430. Further, at least a part of the side surface of the lower-layer via 430 cuts off the metal crystal grains. In other words, at the side surface of the lower-layer via 430, there are formed the cut surfaces of at least one or more metal crystal grains. Herein, when the width of the contact plug 410 is small, the occupying proportion of the high-resistance barrier metal layer 461 is high. For this reason, the smaller the width of the contact plug 410 is, the higher the resistance of the contact plug 410 is. Further, at this step, when the metal 411 of the contact plug 410 is formed by CVD, the crystal grains of the metal 411 become small. Therefore, as described above, by forming the low-resistance lower-layer via 430 over the high-resistance contact plug 410, it is possible to reduce the resistance as the whole of the contact plug 410 and the lower-layer via 430.

Up to this point, in the fifth embodiment, a description was given to the case where the first wiring layer 30 is disposed over the lower-layer via formation layer 32. However, a wiring layer may be formed by a damascene method over the lower-layer via formation layer 32.

Sixth Embodiment

Figure 45:
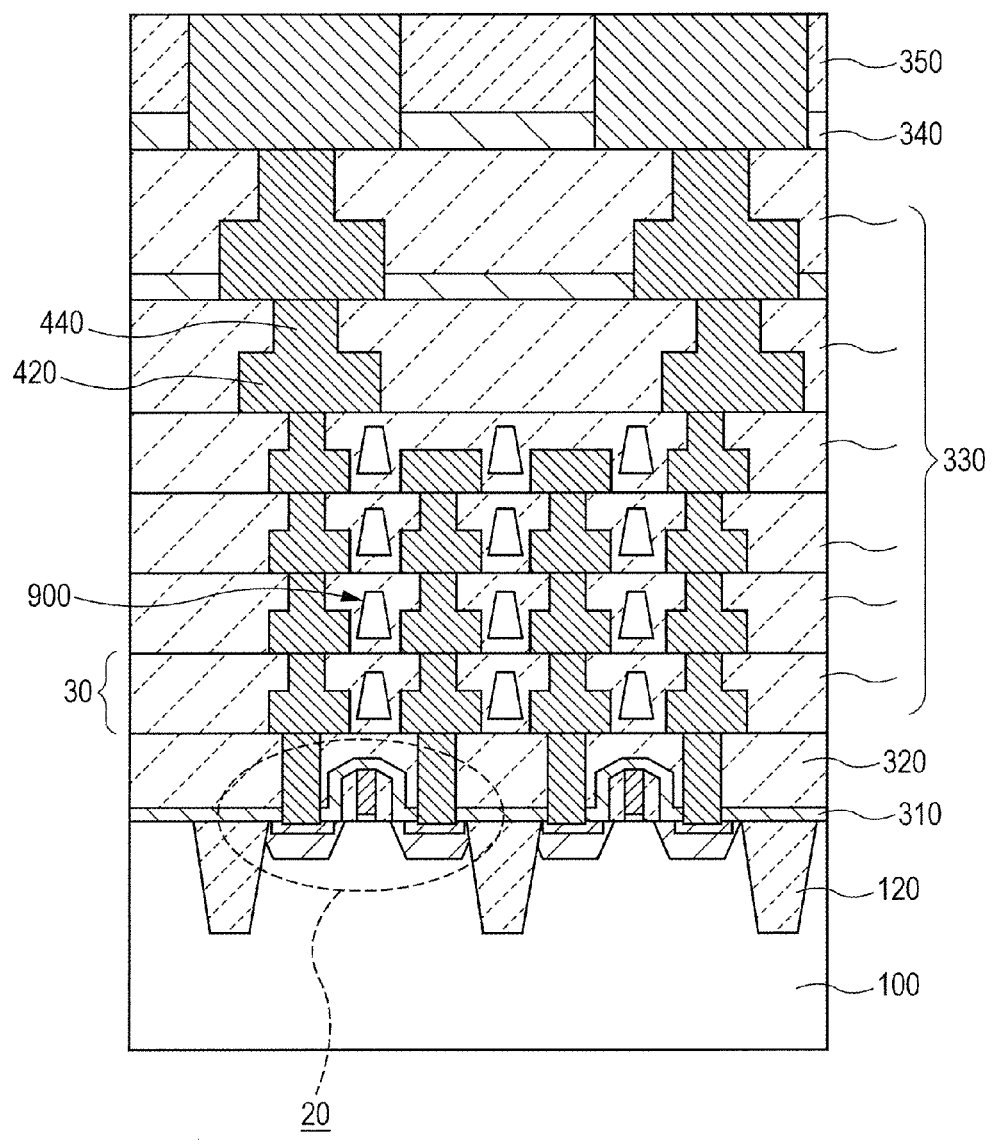
FIG. 45 is a cross-sectional view showing a configuration of a semiconductor device in accordance with a sixth embodiment.

FIG. 45 is a cross-sectional view showing the configuration of a semiconductor device 10 in accordance with a sixth embodiment. The sixth embodiment is equal to the first embodiment except for the following points. The first wirings 420 are disposed in a plural number at the same layer. The first insulation layer 330 has air gaps 900 each between a plurality of the first wirings 420. Below, the details will be described.

As in FIG. 44, as with the first embodiment, in the semiconductor substrate 100, there is disposed the semiconductor element 20. Further, over the semiconductor substrate 100, there is disposed the lower-layer insulation layer 320. Over the lower-layer insulation layer 320, there are disposed a plurality of the first wiring layers 30.

In the same layer of respective first wiring layers 30, there are disposed a plurality of the first wirings 420. Further, in the same layer, there may be disposed a plurality of first vias 440.

The first insulation layer 330 has air gaps each between a plurality of the first wirings 420. The term "air gap 900" herein used denotes the gap formed in the first insulation layer 330. The air gap 900 is larger than the fine pore formed in the first insulation layer 330 when the first insulation layer 330 is porous. As a result, it is possible to further reduce the dielectric constant of the first insulation layer 330. Further, the air gap 900 is formed at a site at which the distance between the first wirings 420 is narrow.

In the first embodiment, a description was given to the case where the dielectric constant of the first insulation layer 330 is, for example, 3.2 or less. However, in the sixth embodiment, the dielectric constant of the first insulation layer 330 having the air gaps 900 may exceed the foregoing range. Specifically, the first insulation layer 330 may be a SiCOH film having a dielectric constant of 2.7 or more, or a SiOF film having a dielectric constant of 3.7 or more. As a result, by the air gaps 900, the dielectric constant can be reduced, and the physical strength of the first insulation layer 330 can be improved. Namely, the mounting resistance can be improved.

Then, a description will be given to a method for manufacturing the semiconductor device 10 of the sixth embodiment. Only the step of forming the first wiring layer 30 of the manufacturing method will be described.

For example, over the lower-layer insulation layer 330, the metal layer 400 is formed by sputtering. In the same manner as in the first embodiment, the metal layer 400 is patterned, thereby to form the first wirings 420 and the first vias 440.

Then, in the first insulation layer formation step, the first insulation layer 330 is formed in such a manner as to cover the first wirings 420 and the first vias 440. Herein, for example, by CVD, the first insulation layer 330 is formed. Specifically, for example, by CVD, a porous SiCOH film is formed. At this step, in a portion at which the distance between the first wirings 420 is small, the first insulation layer 330 is not sufficiently embedded. This can result in the formation of the air gaps 900.

By applying the same step to a plurality of the first wiring layers 30, it is also possible to form the air gaps 90 in respective first wiring layers 30.

In accordance with the sixth embodiment, the first insulation layer 330 has the air gaps 900 each between a plurality of the first wirings 420. As a result, the dielectric constant of the first insulation layer 330 can be further reduced than in the first embodiment. On the other hand, even when a material having a high dielectric constant is used for the first insulation layer 330, the presence of the air gaps 900 can reduce the dielectric constant of the first insulation layer 330. As a result, by the air gaps 900, the dielectric constant can be reduced, and the physical strength of the first insulation layer 330 can be improved.

Further, when the via holes and the like are formed after the formation of the air gaps 900 in the first insulation layer 330 as a comparative example, the via hole may erroneously reach the air gap 900. When such a failure occurs, a short circuit between the first wirings 420 may be caused. On the other hand, in accordance with the sixth embodiment, after the formation of the first wirings 420, the air gaps 900 are formed in the first insulation layer 330. As a result, in principle, there does not occur a failure such that the via hole erroneously reaches the air gap 900. Therefore, the air gaps 900 can be formed with stability without causing a short circuit between the first wirings 420.

Seventh Embodiment

Figure 46:
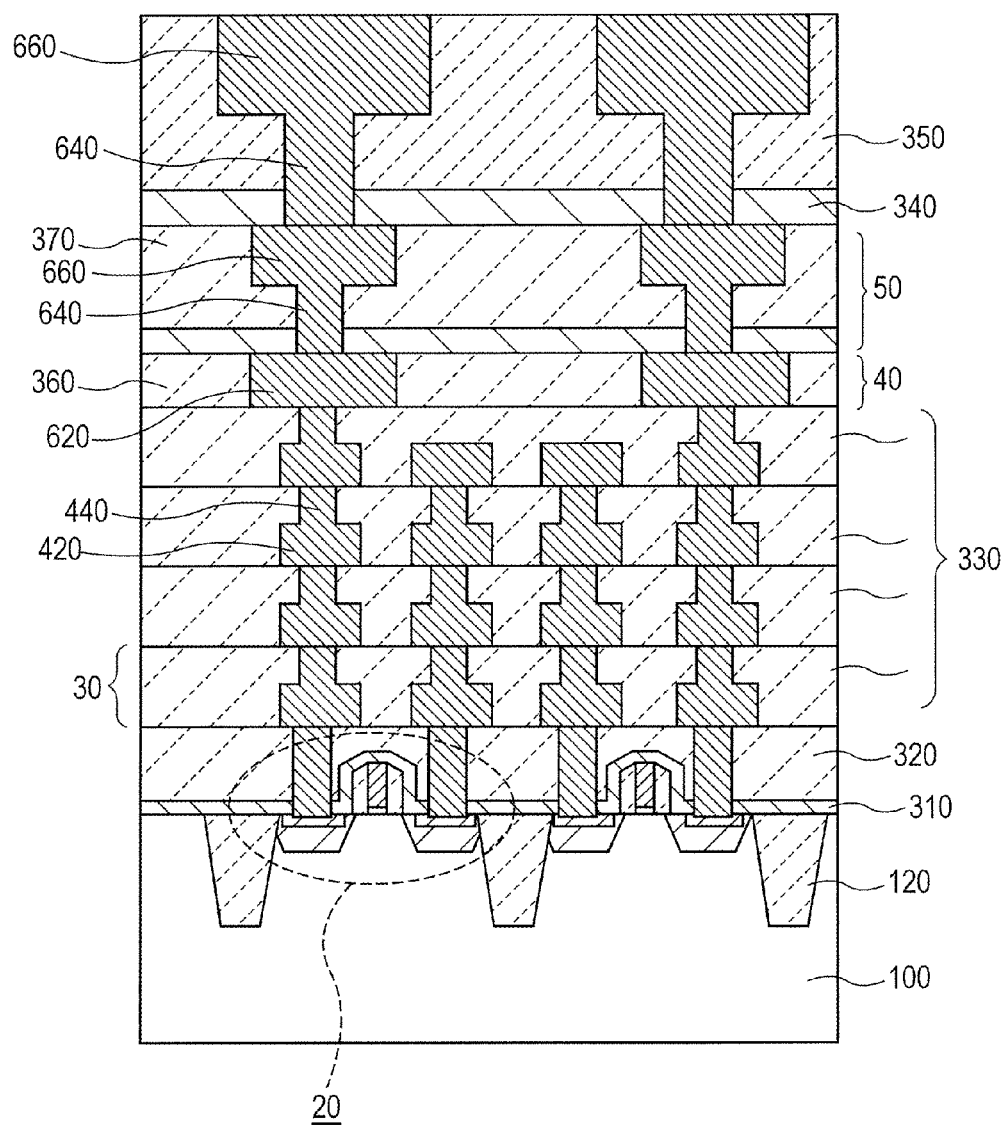
FIG. 46 is a cross-sectional view showing a configuration of a semiconductor device in accordance with a seventh embodiment.

FIG. 46 is a cross-sectional view showing the configuration of a semiconductor device 10 in accordance with a seventh embodiment. The seventh embodiment is equal to the first embodiment, except that wiring layers (a second wiring layer 40 and a third wiring layer 50) are formed over the first wiring layer 30 by a damascene method.

As in FIG. 46, as with the first embodiment, a plurality of the first wiring layers 30 are disposed from the side of the semiconductor substrate 100. The semiconductor device 10 has at least one or more logic circuits. A plurality of the first wiring layers 30 are the local wiring layers for forming a logic circuit thereover.

Over the first wiring layer 30 situated at the uppermost layer, there is disposed a second wiring layer 40. The second wiring layer 40 includes a second wiring 620 and a second insulation layer 360. The bottom surface of the second wiring 620 is coupled to the uppermost-layer first via 440. Alternatively, a barrier metal layer (not shown) may be disposed at the bottom part and the side surface of the second wiring 620. Whereas, the metal embedded in the second wiring 620 may be a different metal from that of the first wiring 420 and the first via 440. Specifically, the metal in the second wiring 620 is, for example, Cu.

Whereas, the second insulation layer 360 is in contact with the side surface of the second wiring 620. The second insulation layer 360 may be formed of, for example, the same material as that of the first insulation layer 330. Further, an etching stopper layer 340 may be disposed between the first wiring layer 30 and the second wiring layer 40. Thus, by disposing the second wiring layer 40 in which the conductive material includes only the second wiring 620, it is possible to form a wiring layer at the overlying layer of the second wiring layer 40 by a dual damascene method.

Further, over the second wiring layer 40, there are disposed at least one or more third wiring layers 50. The third wiring layer 50 includes a third via 640, a third wiring 660, and a third insulation layer 370. The bottom surface of the third via 640 over the second wiring 40 is coupled to the second wiring 620. Whereas, the third wiring 660 is in contact with the top surface of the third via 640. Further, a barrier metal layer (not shown) may be disposed at the bottom surface and the side surface of the third via 640, and at the bottom part and the side surface of the third wiring 660. Further, the metal embedded in the third via 640 and the third wiring 660 may be a different metal from that of the first wiring 420 and the first via 440. Specifically, the metal in the third via 640 and the third wiring 660 is, for example, Cu.

Whereas, the third insulation layer 370 is in contact with the third via 640 and the third wiring 660. The third insulation layer 370 is formed of, for example, the same material as that of the first insulation layer 330. Further, an etching stopper layer 340 may be disposed between the second wiring layer 40 and the third wiring layer 50. Further, the etching stopper layer 340 may be disposed in such a manner as to be in contact with the third wiring 660 of the third insulation layer 370.

The third wiring layers 50 may be formed in a plural number. At this step, the top surface of the third wiring 660 of the third wiring layer 50 situated on the lower side is in contact with the bottom surface of the third via 640 situated on the upper side.

Further, the third wiring layer 50 situated at the uppermost layer is a global wiring layer for coupling, for example, a plurality of local wiring layers. The third insulation layer 370 (the upper-layer insulation layer 350) of the third wiring layer 50 situated at the uppermost layer may be formed a different material from that of the third insulation layer 370 of the third wiring layer 50 situated on the lower side. Specifically, the upper-layer insulation layer 350 is, for example, SiOF or SiO$_2$. Incidentally, over the uppermost-layer global wiring layer, there may be disposed a bump electrode (not shown).

Then, a description will be given to a method for manufacturing the semiconductor device 10 in accordance with the seventh embodiment.

First, a plurality of first wiring layers 30 are formed in the same manner as in the first embodiment. As a result, a plurality of the first wiring layers 30 form local wiring layers having at least one or more logic circuits.

Then, over the first wiring layer 30 situated at the uppermost layer, there is formed the second insulation layer 360. Then, in the second insulation layer 360, a second wiring trench (not shown) to be coupled with the uppermost-layer first via 440 is formed by RIE. Then, a barrier metal layer (not shown) is formed in the second wiring trench, and over the second insulation layer 360 by sputtering. Then, a seed metal layer (not shown) is formed over the barrier metal layer by sputtering. Then, with the seed metal layer as the seed, a metal is embedded in the second wiring trench by plating. Then, the top of the second insulation layer 360 is planarized by CMP. This results in the formation of the second wiring 620. Thus, the second wiring layer 40 is formed by, a so-called single damascene method.

Then, over the second wiring 620 and the second insulation layer 360, there is formed a third insulation layer 370. Then, in the third insulation layer 370, there are formed a third via hole (not shown) to be in contact with the top surface of the second wiring 620, and a third wiring trench (not shown) to be in contact with the top of the third via hole. Then, a barrier metal layer (not shown) is formed in the third via hole, in the third wiring trench, and over the third insulation layer 370 by sputtering. Then, over the barrier metal layer, a seed metal layer (not shown) is formed by sputtering. Then, with the seed metal layer as the seed, a metal is embedded in the third via hole and the third wiring trench by plating. Then, the top of the third insulation layer 370 is planarized by CMP. This results in the formation of the third via 640 and the third wiring 660. In this manner, the third wiring layer 50 is formed by a so-called dual damascene method.

Then, a plurality of third wiring layers 50 are formed by the same procedure. At the uppermost layer, the third wiring layer 50 is formed as the global wiring layer. In this manner, there is formed a semiconductor device 10 having a multilayer wiring structure. Incidentally, the etching stopper layers 340 may be formed between the first wiring layer 30, the second wiring layer 40, and the third wiring layer 50.

In accordance with the seventh embodiment, over the first wiring layer 30, the second wiring layer 40 and the third wiring layer 50 are formed by a damascene method. Thus, the wiring layers by the damascene method can be merged therein. Further, in the multilayer wiring structure, the wiring or the via on the upper layer side is formed with a larger width than that of the wiring or the via on the lower layer side. For this reason, there can be considered the case where the formation of the upper-layer wiring or via of Cu may result in a lower resistance. Therefore, as in the seventh embodiment, it is possible to appropriately select the structure of the wiring layer resulting in a lower resistance according to the width of the wiring or the via.

Up to this point, a description was given to the case where the second wiring layer 40 is formed by a single damascene method in the seventh embodiment. However, the following procedure is also acceptable: in the same manner as in the first embodiment, previously, the second wiring 620 is patterned and formed; then, the second insulation layer 360 is formed, thereby to form the second wiring layer 40.

Up to this point, the embodiments of the present invention were described by reference to the accompanying drawings. However, these are illustrative of the present invention, and various configurations other than those described above can also be adopted.

What is claimed is:

1. A method for manufacturing a semiconductor device, comprising:
    a metal pattern formation process of forming a metal pattern having a pattern along a first wiring over a semiconductor substrate;
    a first via pattern formation process of partially etching the metal pattern, and thereby forming the first wiring, and a first via in contact with the first wiring at the bottom surface thereof; and
    a first insulation layer formation process of forming a first insulation layer in contact with at least the top surface of the first wiring and the side surface of the first via over the semiconductor substrate,
    wherein the metal pattern formation process includes:
    forming a metal layer over the semiconductor substrate;
    sequentially forming a first mask layer, and a second mask layer formed of a different material from that of the first mask layer over the metal layer;
    a first wiring mask formation process of patterning the first mask layer and the second mask layer, and forming a first wiring mask having the shape of the first wiring in plan view;
    a first via mask formation process of, after the first wiring mask formation process, patterning the second mask layer, and forming a first via mask having at least a part of the shape of the first via in plan view; and
    etching the metal layer with the first wiring mask as a mask, and thereby forming the metal pattern, and
    wherein the first via pattern formation process includes:
    etching the first wiring mask with the first via mask as a mask in plan view; and
    with the first via mask, and the first mask layer patterned into the same shape as that of the first via mask in plan view as a mask, partially etching the metal pattern, and thereby forming the first via.

2. The method for manufacturing a semiconductor device according to claim 1,
    wherein the photomask for use in the first via mask formation process has a first pattern for obtaining the first wiring, and a second pattern for obtaining the first via, and
    wherein the width of the second pattern in a direction orthogonal to the direction of extension of the first wiring is larger than that of the first pattern.

3. A method for manufacturing a semiconductor device, comprising:
    a metal pattern formation process of forming a metal pattern having a pattern along a first wiring over a semiconductor substrate;
    a first via pattern formation process of partially etching the metal pattern, and thereby forming the first wiring, and a first via in contact with the first wiring at the bottom surface thereof; and
    a first insulation layer formation process of forming a first insulation layer in contact with at least the top surface of the first wiring and the side surface of the first via over the semiconductor substrate,
    wherein the metal pattern formation process includes:
    forming a metal layer over the semiconductor substrate;
    sequentially forming a first mask layer, and a second mask layer made of a different material from that of the first mask layer over the metal layer;
    a first via mask formation process of patterning the second mask layer, and forming a first via mask having the shape of the first via in plan view;
    a first wiring mask formation process of, after the first via mask formation process, patterning the first mask layer, and forming a first wiring mask having the shape of the first wiring in plan view; and
    etching the metal layer with the first wiring mask as a mask, and thereby forming the metal pattern, and
    wherein the first via pattern formation process includes:
    etching the first wiring mask with the first via mask as a mask in plan view; and
    with the first via mask, and the first mask layer patterned into the same shape as that of the first via mask in plan view as a mask, partially etching the metal pattern, and thereby forming the first via.

4. The method for manufacturing a semiconductor device according to claim 3,
wherein in the forming the metal pattern of the metal pattern formation process, the metal layer is partially etched, and the metal pattern is formed at the top part of the metal layer, and the bottom part of the metal layer is left, and
wherein in the first via pattern formation process, the first via is formed, and the bottom part of the metal layer is etched, thereby to form the first wiring.

5. The method for manufacturing a semiconductor device according to claim 3, further comprising:
a planarization process of, after the first insulation layer formation process, planarizing the top surface of the first insulation layer, and exposing the top surface of the first via,
wherein in the planarization process, the first wiring mask and the first via mask are removed, and the first insulation layer is planarized.

6. The method for manufacturing a semiconductor device according to claim 3,
wherein in the metal pattern formation process, a protective metal layer for protecting the first wiring is formed at a position to be the bottom part of the first wiring.

7. The method for manufacturing a semiconductor device according to claim 3,
wherein in the metal pattern formation process, a first etching stopper layer made of a conductive material is formed at a portion of the top part of the first wiring overlapping with at least the first via in plan view.

8. The method for manufacturing a semiconductor device according to claim 3,
wherein in the metal pattern formation process, a protective metal layer for protecting the first via is formed at a position to be the top part of the first via.

9. The method for manufacturing a semiconductor device according to claim 3,
wherein in the metal pattern formation process, a plurality of the metal patterns are formed at the same layer, and
wherein in the first insulation layer formation process, air gaps are formed each between the first wirings formed in a plural number.

10. A method for manufacturing a semiconductor device, comprising:
a metal pattern formation process of forming a metal pattern having a pattern along a first wiring over a semiconductor substrate;
a first via pattern formation process of partially etching the metal pattern, and thereby forming the first wiring, and a first via in contact with the first wiring at the bottom surface thereof;
a first insulation layer formation process of forming a first insulation layer in contact with at least the top surface of the first wiring and the side surface of the first via over the semiconductor substrate;
forming local wiring layers forming at least one or more logic circuits with the first wiring layers, and forming a second insulation layer over the first wiring layer situated at the uppermost layer;
forming a second wiring trench to be coupled with the first via at the uppermost layer in the second insulation layer; and
embedding a metal in the second wiring trench, and thereby forming a second wiring,
wherein the metal pattern formation process, the first via pattern formation process, and the first insulation layer formation process are sequentially performed, thereby to form one first wiring layer including the first wiring, the first via, and the first insulation layer,
wherein at least two or more of the first wiring layers are stacked, and
wherein the first via of the first wiring layer situated on the lower side is formed so as to be coupled to the first wiring of the first wiring layer situated on the upper side.

11. The method for manufacturing a semiconductor device according to claim 10, further comprising:
forming a third insulation layer over the second wiring and the second insulation layer;
forming a third via hole to be coupled with the second wiring, and a third wiring trench to be coupled with the top of the third via hole in the third insulation layer; and
embedding a metal in the third via hole and the third wiring trench, and thereby forming a third via and a third wiring.

12. The method for manufacturing a semiconductor device according to claim 3,
wherein in the first insulation layer formation process, the first insulation layer is formed by a CVD (Chemical Vapor Deposition) method.

13. The method for manufacturing a semiconductor device according to claim 3,
wherein in the first insulation layer formation process, the first insulation layer is formed by a coating method.

14. The method for manufacturing a semiconductor device according to claim 10,
wherein the semiconductor device comprises over the first wiring layer situated on the lower side, the first wiring layer at the upper layer is formed via a second etching stopper layer made of an insulation material having a higher density than that of the first insulation layer.

* * * * *